United States Patent
Zubarev et al.

(10) Patent No.: US 11,333,975 B2
(45) Date of Patent: May 17, 2022

(54) POLYMER, PHOTOSENSITIVE RESIN COMPOSITION, PATTERNING METHOD, METHOD OF FORMING CURED FILM, INTERLAYER INSULATING FILM, SURFACE PROTECTIVE FILM, AND ELECTRONIC COMPONENT

(71) Applicants: International Business Machines Corporation, Armonk, NY (US); Shin-Etsu Chemical Co., Ltd., Tokyo (JP)

(72) Inventors: Dmitry Zubarev, San Jose, CA (US); Hiroyuki Urano, Joetsu (JP); Katsuya Takemura, Joetsu (JP); Masashi Iio, Joetsu (JP); Kazuya Honda, Yokohama (JP); Yoshio Kawai, Kawasaki (JP)

(73) Assignees: International Business Machines Corporation, Armonk, NY (US); Shin-Etsu Chemical Co., Ltd., Tokyo (JP)

( * ) Notice: Subject to any disclaimer, the term of this patent is extended or adjusted under 35 U.S.C. 154(b) by 15 days.

(21) Appl. No.: 16/848,589

(22) Filed: Apr. 14, 2020

(65) Prior Publication Data
US 2021/0317268 A1    Oct. 14, 2021

(51) Int. Cl.
| | | |
|---|---|---|
| G03F 7/023 | (2006.01) | |
| C08G 73/10 | (2006.01) | |
| C08G 73/14 | (2006.01) | |
| C08G 73/22 | (2006.01) | |
| G03F 7/022 | (2006.01) | |
| G03F 7/038 | (2006.01) | |
| G03F 7/039 | (2006.01) | |
| G03F 7/16 | (2006.01) | |
| G03F 7/20 | (2006.01) | |
| G03F 7/32 | (2006.01) | |
| G03F 7/40 | (2006.01) | |

(52) U.S. Cl.
CPC ....... *G03F 7/0226* (2013.01); *C08G 73/1067* (2013.01); *C08G 73/22* (2013.01); *G03F 7/022* (2013.01); *G03F 7/0233* (2013.01); *G03F 7/039* (2013.01); *G03F 7/0387* (2013.01); *G03F 7/162* (2013.01); *G03F 7/20* (2013.01); *G03F 7/322* (2013.01); *G03F 7/40* (2013.01)

(58) Field of Classification Search
CPC ........ G03F 7/039; G03F 7/038; G03F 7/0226; G03F 7/0233; G03F 7/38; G03F 7/40; C08G 69/26; C08G 73/1039; C08G 73/1067; C08G 73/1042; C08G 73/1064; C08G 73/1071
See application file for complete search history.

(56) References Cited

U.S. PATENT DOCUMENTS

| | | | |
|---|---|---|---|
| 3,947,451 A | 3/1976 | Jonsson et al. | |
| 4,897,461 A * | 1/1990 | Uekita | C08G 73/10 525/436 |
| 10,450,417 B2 * | 10/2019 | Kawabata | C08G 73/12 |
| 2009/0123867 A1 * | 5/2009 | Yuba | C08K 5/544 430/270.1 |

(Continued)

FOREIGN PATENT DOCUMENTS

| | | |
|---|---|---|
| EP | 3604390 A1 | 2/2020 |
| JP | 49115541 U | 10/1974 |

(Continued)

OTHER PUBLICATIONS

List of IBM Patents or Patent Applications Treated as Related.
(Continued)

*Primary Examiner* — John S Chu
(74) *Attorney, Agent, or Firm* — Karen Canaan; CanaanLaw, P.C.

(57) ABSTRACT

Provided is a polymer that can be used as a base resin for a positive photosensitive resin composition and a negative photosensitive resin composition, wherein the positive photosensitive resin composition and the negative photosensitive resin composition are soluble in an aqueous alkaline solution, can form a fine pattern, can achieve high resolution, and have good mechanical properties even when they are cured at low temperature. Also provided are a positive photosensitive resin composition and a negative photosensitive resin composition using the polymer. The polymer is represented by general formulas (1) and/or (2):

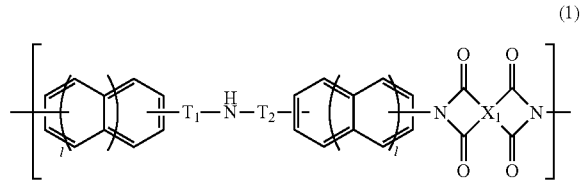

(1)

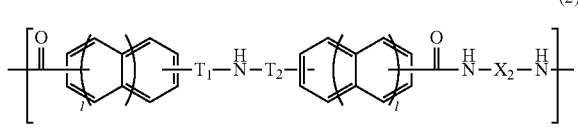

(2)

wherein $T_1$ and $T_2$ may be the same as, or different from, each other and represent any of —CO— and —$SO_2$—; $X_1$ is a tetravalent organic group; and l is 0 or 1; and $X_2$ is a divalent organic group.

20 Claims, No Drawings

(56) References Cited

U.S. PATENT DOCUMENTS

| | | | |
|---|---|---|---|
| 2009/0181224 A1 | 7/2009 | Minegishi | |
| 2010/0258336 A1* | 10/2010 | Minegishi | C08G 73/22 174/250 |
| 2019/0169211 A1 | 6/2019 | Urano et al. | |
| 2019/0256655 A1 | 8/2019 | Masuda et al. | |
| 2019/0292138 A1* | 9/2019 | Yun | C08G 73/14 |
| 2020/0041903 A1 | 2/2020 | Takemura et al. | |

FOREIGN PATENT DOCUMENTS

| | | |
|---|---|---|
| JP | 5545746 A | 3/1980 |
| JP | 5233344 A | 9/1993 |
| JP | 3232022 B2 | 10/1998 |
| JP | 2006313237 A | 11/2006 |
| JP | 2007199653 A | 8/2007 |
| JP | 2018158966 A | 10/2018 |
| JP | 2019014828 A | 1/2019 |
| TW | 201331263 A | 8/2013 |
| TW | 201719278 A | 6/2017 |
| TW | 201829372 A | 8/2018 |
| WO | 2011059089 A1 | 5/2011 |
| WO | 2020066976 A1 | 4/2020 |

OTHER PUBLICATIONS

Extended European Search Report dated Jul. 20, 2021, for related EP Application No. 21156605.4.

Extended European Search Report dated Aug. 17, 2021, for counterpart EP Application No. 21156645.0.

Strijckmans et al., Synthesis of a potential MI muscarinic agent [76Br] bromocaramiphen, Journal of Labelled Compounds and Radiopharmaceuticals 38(5):471-481 (1996).

* cited by examiner

POLYMER, PHOTOSENSITIVE RESIN COMPOSITION, PATTERNING METHOD, METHOD OF FORMING CURED FILM, INTERLAYER INSULATING FILM, SURFACE PROTECTIVE FILM, AND ELECTRONIC COMPONENT

JOINT RESEARCH AGREEMENT

The subject matter of this disclosure describes activities undertaken within the scope of a joint research agreement that was in place before the effective date of the instant application. The parties to the joint research agreement are International Business Machines Corporation (Armonk, N.Y., USA) and Shin-Etsu Chemical Co., Ltd. (Chiyoda-ku, Tokyo, Japan).

BACKGROUND OF THE INVENTION

Field of the Invention

The present invention relates to a polymer having a polyimide, polyamide or polyamide-imide structure, a positive photosensitive resin composition, a negative photosensitive resin composition, a patterning method, a method of forming a cured film, an interlayer insulating film, a surface protective film, and an electronic component.

Description of the Related Art

As various electronic devices such as personal computers, digital cameras and mobile phones progress toward miniaturization and high performance, demands for further miniaturization, thinning and densification are being rapidly increased also in semiconductor elements. Following this, interlayer insulating films and surface protective films for semiconductor elements are demanded to have more excellent electrical properties, heat resistance, mechanical properties and the like at the same time.

In the high density packaging technology such as three-dimensional lamination, for a photosensitive insulating material that can form a pattern on a substrate, a polyimide film has been utilized as a protective film or an insulating layer, and its insulating property, mechanical strength, adhesiveness to a substrate and the like have attracted attention continuously, and even now, development thereof has been carried on highly actively.

Conventionally, as a photosensitive polyimide-based material, materials utilizing a polyamic acid, which is a precursor of polyimide, for example, materials in which photosensitive groups are introduced into carboxyl groups of a polyamic acid by ester bonds have been proposed (Japanese Patent Laid-Open No. 49-115541 and Japanese Patent Laid-Open No. 55-45746). However, in these proposals, after the formation of a patterned film, imidization at a high temperature exceeding 300° C. is indispensable in order to obtain the target polyimide film, and therefore, there are problems that an underlying substrate is constrained because it needs to withstand this high temperature, or that the wiring copper is oxidized.

As improvement for the above, photosensitive polyimides using a solvent-soluble imidized resin has been proposed for the purpose of lowering the post-curing temperature (Japanese Patent Laid-Open No. 3232022 and Japanese Patent Laid-Open No. 2006-313237). In Japanese Patent No. 3232022, a negative photosensitive composition containing an already closed polyimide has been proposed; however, there is description with regard to patternability and adhesiveness, but there is no description with regard to mechanical strength.

In Japanese Patent Laid-Open No. 2006-313237, a positive photosensitive resin composition using an alkaline soluble, ring-closing polyimide, a photoacid generator and a thermal crosslinking agent having a methylol group has been proposed; however, there is room for improvement in the value of breaking elongation when the composition is cured at low temperature, and there is no description with regard to breaking strength.

In addition, in Japanese Patent Laid-Open No. 2018-158966, a positive photosensitive resin composition using an alkaline soluble polyamide-imide and a photoacid generator has been proposed and this is a material excellent in solvent solubility and resolution performance; however, there is room for improvement in mechanical properties.

As stated above, in association with densification and integration of chips, fining of patterns in the rewiring technology for insulating protective films is expected to progress more and more in the future, and therefore, a photosensitive resin composition has been strongly desired, wherein the composition can realize high resolution without impairing excellent characteristics such as patterns obtained through heating, and mechanical properties and adhesiveness of the protective films.

The present invention has been made in view of the above-described circumstances, and an object thereof is to provide a polymer selected from polyamide, polyamide-imide, polyimide, polyimide precursor, polybenzoxazole and polybenzoxazole precursor, that can be used as a base resin for a positive photosensitive resin composition and a negative photosensitive resin composition, wherein the positive photosensitive resin composition and the negative photosensitive resin composition are soluble in an aqueous alkaline solution, can form a fine pattern, can achieve high resolution, and have good mechanical properties even when they are cured at low temperature.

In addition, another object of the present invention is to provide a positive photosensitive resin composition and a negative photosensitive resin composition using the above-described polymer, wherein, upon patterning, the positive photosensitive resin composition and the negative photosensitive resin composition are soluble in an aqueous alkaline solution, can achieve high resolution, can form a fine pattern, and have good mechanical properties even when they are cured at low temperature.

SUMMARY OF THE INVENTION

In order to solve the problems described above, the present invention provides a polymer comprising a structure(s) represented by the following general formulas (1) and/or (2):

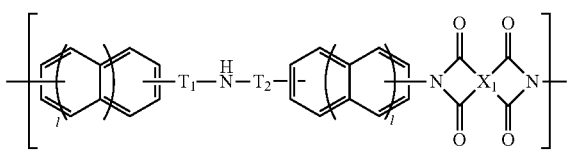

wherein $T_1$ and $T_2$ may be the same as or different from each other and represent any of —CO— and —SO$_2$—; $X_1$ is a tetravalent organic group; and l is 0 or 1; and

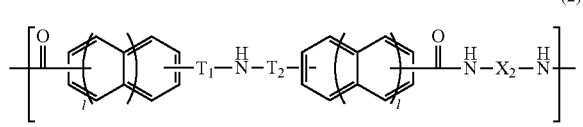
(2)

wherein $T_1$, $T_2$ and l are defined as above; and $X_2$ is a divalent organic group.

In such a polymer, solubility in an aqueous alkaline solution is not impaired, and therefore, such a polymer can be used as a base resin for a photosensitive resin composition, wherein the photosensitive resin composition can form a fine pattern, can achieve high resolution, and has good mechanical properties even when it is cured at low temperature to form a cured film.

In addition, it is preferable that the polymer further comprises, in addition to the structural unit(s) represented by general formulas (1) and/or (2), any one or more structural units represented by the following general formulas (3) to (5) and (7):

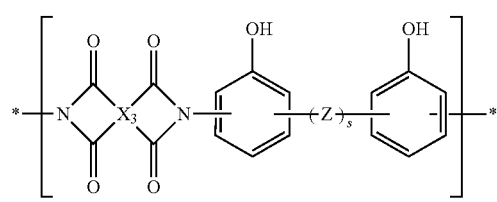
(3)

wherein $X_3$ is a tetravalent organic group that is the same as or different from $X_1$; s is 0 or 1; Z is a divalent linking group; and when s=0, two aromatic rings in the formula are directly bonded without interposition of a linking group;

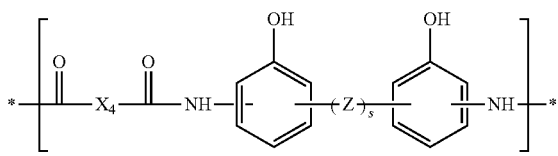
(4)

wherein $X_4$ is a divalent organic group; and s and Z are defined as above;

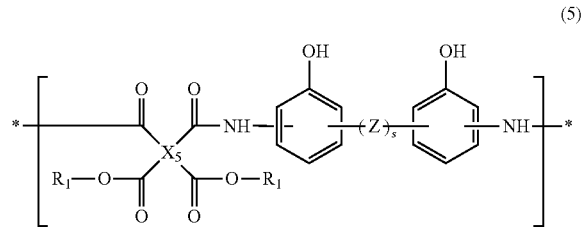
(5)

wherein $X_5$ is a tetravalent organic group that is the same as or different from $X_1$; $R_1$ is a group represented by the following general formula (6); and s and Z are defined as above:

(6)

wherein the dotted line represents a bond; $Y_1$ is an organic group with a valence of (k+1); Rf is a linear, branched or cyclic alkyl group having 1 to 20 carbon atoms or an aromatic group, in which part or all of hydrogen atoms are replaced with fluorine atoms; k is 1, 2 or 3; and n is 0 or 1; and

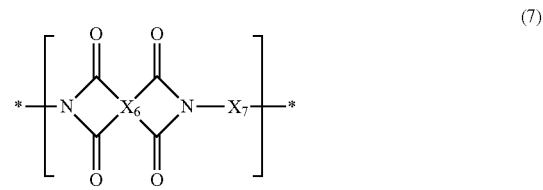
(7)

wherein $X_6$ is a tetravalent organic group that is the same as or different from $X_1$; and $X_7$ is a group represented by the following general formula (8):

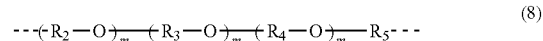
(8)

wherein $R_2$ to $R_5$ are each independently a linear or branched alkylene group having 2 to 10 carbon atoms; and $m_1$ is an integer of 1 to 40, and $m_2$ and $m_3$ are each independently an integer of 0 to 40.

When the polymer comprises any one or more structural units represented by general formulas (3), (4), (5) and (7), solubility in an aqueous alkaline solution becomes more suitable.

In addition, when the polymer comprises any one or more structural units represented by general formula (5) or (7), solubility in general organic solvents is improved and thus any solvents for the composition can be used without limitation, and a cured film with flexibility, high extensibility and low warpage can be obtained.

Moreover, upon this, it is preferable that $R_1$ in general formula (5) be an organic group selected from any groups represented by the following general formulas (9), (10), (11) and (12):

(9)

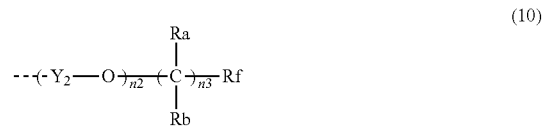
(10)

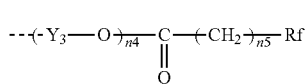

(11)

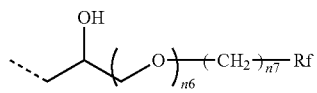

(12)

wherein the dotted line represents a bond; Rf is defined as above; Ra and Rb are respectively a hydrogen atom or an alkyl group having 1 to 3 carbon atoms; $Y_2$ and $Y_3$ are respectively a linear or branched alkylene group having 1 to 6 carbon atoms; and n1 is an integer of 0 to 6, n2 is an integer of 1 to 6, n3 is an integer of 0 to 6, n4 is an integer of 1 to 6, n5 is an integer of 0 to 6, n6 is an integer of 0 or 1, and n7 is an integer of 0 to 6. All integer ranges disclosed herein are inclusive (e.g., an integer of 0 to 2 should be construed to mean 0, 1, or 2).

It is preferable that $R_1$ be such a group mentioned above, because a compound to be a raw material for introducing $R_1$ is easily acquired.

Moreover, upon this, it is preferable that Z in general formulas (3), (4) and (5) be a divalent group represented by the following general formula (13) or (14):

(13)

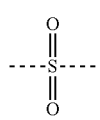

(14)

wherein the dotted line represents a bond.

It is preferable that Z be such a group mentioned above, because solubility in a developing solution, which is an aqueous alkaline solution, is improved.

In addition, the present invention provides a positive photosensitive resin composition comprising:

(A) the polymer mentioned above;

(B) a photosensitizer that generates an acid by light to increase the solubility rate in an aqueous alkaline solution, and that is a compound having a quinonediazide structure; and (D) a solvent.

As stated above, by using the photosensitizer of component (B), upon patterning, the exposed part becomes soluble because its solubility rate in a developing solution of an aqueous alkaline solution is increased, and the unexposed part is not dissolved due to the alkaline dissolution prevention property of the photosensitizer, and therefore, a positive image can be obtained. For the polymer comprising a structural unit(s) represented by general formulas (1) and/or (2), the polymer itself exhibits alkaline solubility, and therefore, residue such as scum and pattern degradation such as tailing are unlikely to occur at the bottom of an open pattern, which benefits fine patterning.

Moreover, upon this, it is preferable that the positive photosensitive resin composition further comprises (C) one or two or more crosslinking agents selected from an amino condensate modified with formaldehyde or formaldehyde-alcohol, a phenol compound having two or more methylol groups or alkoxymethylol groups on average in one molecule, a compound in which a hydrogen atom of a hydroxy group of a polyvalent phenol is replaced with a glycidyl group, a compound in which a hydrogen atom of a hydroxy group of a polyvalent phenol is replaced with a substituent represented by the following formula (C-1), and a compound containing two or more nitrogen atoms each having a glycidyl group represented by the following formula (C-2):

(C-1)

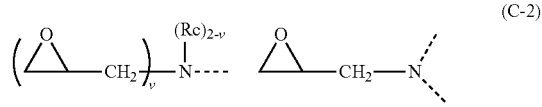

(C-2)

wherein the dotted line represents a bond; Rc represents a linear, branched or cyclic alkyl group having 1 to 6 carbon atoms; and v is 1 or 2.

Such component (C) can cause, after the patterning of the positive photosensitive resin composition according to the present invention, crosslinking reaction in the post-curing and further raise the strength of a cured product, thereby forming a more suitable cured film.

Furthermore, the present invention provides a negative photosensitive resin composition comprising:

(A') the polymer mentioned above;

(B') a photoacid generator;

(C) one or two or more crosslinking agents selected from an amino condensate modified with formaldehyde or formaldehyde-alcohol, a phenol compound having two or more methylol groups or alkoxymethylol groups on average in one molecule, a compound in which a hydrogen atom of a hydroxy group of a polyvalent phenol is replaced with a glycidyl group, a compound in which a hydrogen atom of a hydroxy group of a polyvalent phenol is replaced with a substituent represented by the following formula (C-1), and a compound containing two or more nitrogen atoms each having a glycidyl group represented by the following formula (C-2):

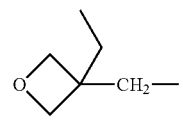

(C-1)

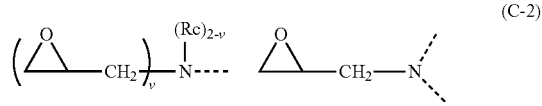

(C-2)

wherein the dotted line represents a bond; Rc represents a linear, branched or cyclic alkyl group having 1 to 6 carbon atoms; and v is 1 or 2; and (D) a solvent.

As stated above, by using the photoacid generator of component (B'), upon patterning, an acid is generated in the exposed part, allowing crosslinking groups of the added crosslinking agent of component (C) and crosslinking reaction points of the polymer to be crosslinked and making the exposed part insoluble in a developing solution, thereby making the composition providing a negative image.

Furthermore, the present invention provides a patterning method comprising:

(1) applying the positive photosensitive resin composition mentioned above onto a substrate to form a photosensitive material film;

(2) heating the photosensitive material film;

(3) exposing the photosensitive material film with a high energy beam having a wavelength of 190 to 500 nm or an electron beam through a photomask; and (4) developing the film with a developing solution of an aqueous alkaline solution.

In such a patterning method, by using the above-described positive photosensitive resin composition, the composition is soluble in an aqueous alkaline solution, fine patterns can be formed without occurrence of scum or the like, and high resolution can be achieved.

In addition, the present invention further provides a patterning method comprising:

(I) applying the negative photosensitive resin composition mentioned above onto a substrate to form a photosensitive material film;

(II) heating the photosensitive material film;

(III) exposing the photosensitive material film with a high energy beam having a wavelength of 190 to 500 nm or an electron beam through a photomask; and (IV) developing the film with a developing solution of an aqueous alkaline solution.

The polymer that is the base resin for the negative photosensitive resin composition according to the present invention comprises a structural unit(s) represented by the above-described general formulas (1) and/or (2), and therefore, alkaline development with an aqueous alkaline solution is possible.

Upon this, it is preferable that the patterning method comprise a post-exposure heating between the exposure (III) and the development (IV).

When the heating after the exposure (post-exposure bake (PEB)) is included, crosslinking reaction between crosslinking groups of the crosslinking agent and crosslinking reaction points of the polymer can be accelerated using an acid generated from the photoacid generator through the exposure as a catalyst.

Furthermore, the present invention provides a method of forming a cured film, comprising heating and post-curing a patterned film obtained by the patterning methods mentioned above at a temperature of 100 to 300° C.

In such a method of forming a cured film, even when the composition is cured at low temperature, a cured film (pattern) with good mechanical properties can be formed.

In addition, the present invention provides an interlayer insulating film or surface protective film comprising a cured film formed by curing the positive photosensitive resin composition mentioned above or the negative photosensitive resin composition mentioned above.

The cured film formed by curing the positive photosensitive resin composition according to the present invention or the negative photosensitive resin composition according to the present invention is excellent in adhesiveness to a substrate, heat resistance, electrical properties, mechanical strength and chemical resistance to an alkaline stripping solution or the like, and a semiconductor element using the cured film as a protective film is also excellent in reliability, and therefore, it is suitable as a protective film (interlayer insulating film or surface protective film) for electrical and electronic components, semiconductor elements and the like.

In addition, the present invention provides an electronic component having the above-described interlayer insulating film or surface protective film.

Such a protective film (interlayer insulating film or surface protective film) is effective for an insulating film for semiconductor elements including a rewiring application, an insulating film for multilayer printed circuit boards and the like due to its heat resistance, chemical resistance and insulating property, and can make the electronic component excellent in reliability.

Advantageous Effects of Invention

As described above, the present invention provides a polymer selected from polyamide, polyamide-imide, polyimide, polyimide precursor, polybenzoxazole and polybenzoxazole precursor, that can be used as a base resin for a positive photosensitive resin composition and a negative photosensitive resin composition, wherein the positive photosensitive resin composition and the negative photosensitive resin composition are soluble in an aqueous alkaline solution, can form a fine pattern, can achieve high resolution, and have good mechanical properties even when they are cured at low temperature.

In addition, the present invention also provides a positive photosensitive resin composition and a negative photosensitive resin composition using the above-described polymer, wherein, upon patterning, the positive photosensitive resin composition and the negative photosensitive resin composition are soluble in an aqueous alkaline solution, achieve high resolution, can form a fine pattern, and have good mechanical properties even when they are cured at low temperature.

DETAILED DESCRIPTION OF THE PREFERRED EMBODIMENTS

As mentioned above, a polymer has been required that can be used as a base resin for a photosensitive resin composition, wherein the photosensitive resin composition is soluble in an aqueous alkaline solution, can form a fine pattern, can achieve high resolution, and has good mechanical properties even when it is cured at low temperature.

As a result of inventors' intensive studies to achieve the object described above, the present invention provides that, when a polymer having a structural unit(s) represented by the following general formulas (1) and/or (2) is used as a base resin for a photosensitive resin composition, such a polymer can be utilized for either a positive photosensitive resin composition that allows development with an aqueous alkaline solution or a negative photosensitive resin composition that allows development with an aqueous alkaline solution because the polymer is soluble in a developing solution of an aqueous alkaline solution, and that a pattern obtained by using these photosensitive resin compositions is fine and the pattern shape is good.

Furthermore, the present invention provides that a protective film is excellent in mechanical strength and adhesiveness, wherein the protective film is obtained by using a photosensitive resin composition comprising a polymer having a structural unit(s) represented by the following general formulas (1) and/or (2) as a base resin, and by subjecting the composition to patterning and heating at low temperature. That is, the obtained cured film having a pattern formed by using the photosensitive resin composition comprising a polymer having the structural unit described above as a base resin is excellent as a protective film for electrical and electronic components and as an insulating protective film. Note that, in the specification, electrical and electronic components are altogether referred to as "electronic components".

The present invention is a polymer comprising a structural unit(s) represented by the following general formulas (1) and/or (2) (hereinafter, they may also be referred to as structural unit (1) and structural unit (2), respectively):

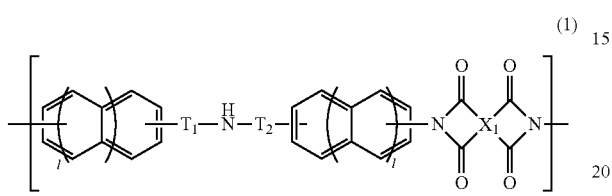
(1)

wherein $T_1$ and $T_2$ may be the same as or different from each other and represent any of —CO— and —SO$_2$—; $X_1$ is a tetravalent organic group; and 1 is 0 or 1; and

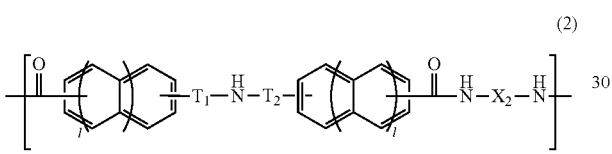
(2)

wherein $T_1$, $T_2$ and 1 are defined as above; and $X_2$ is a divalent organic group.

Hereinafter, the present invention will be described in detail, but the present invention is not limited to the description below.

Polymer Having Polyimide, Polyimide or Polyimide-Imide Structure

The polymer according to the present invention comprises a structural unit(s) represented by the following general formulas (1) and/or (2) (structural unit (1) and/or structural unit (2)):

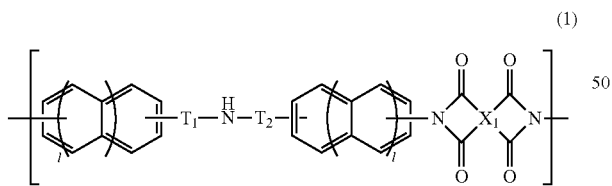
(1)

wherein $T_1$ and $T_2$ may be the same as or different from each other and represent any of —CO— and —SO$_2$—; $X_1$ is a tetravalent organic group; and 1 is 0 or 1; and

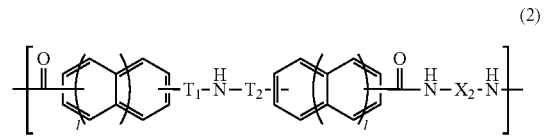
(2)

wherein $T_1$, $T_2$ and 1 are defined as above; and $X_2$ is a divalent organic group.

$X_1$ in the above-described general formula (1) is a tetravalent organic group, and is not specified as long as it is a tetravalent organic group. It is preferably a tetravalent organic group of an alicyclic aliphatic group or an aromatic group having 4 to 40 carbon atoms, and is further preferably a tetravalent organic group represented by the following formula (15). In addition, the structure of $X_1$ may be one kind or a combination of two or more kinds:

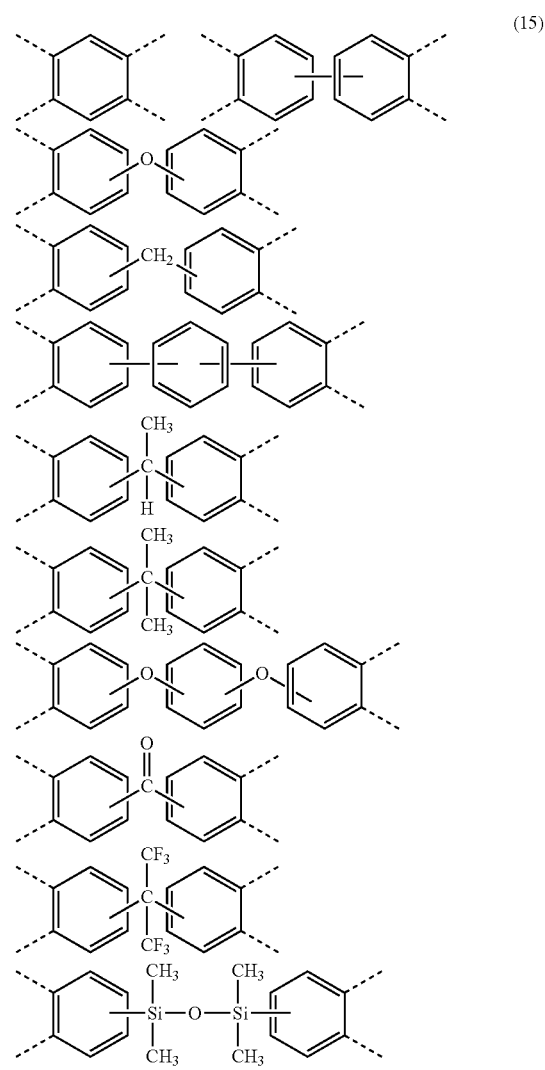
(15)

wherein the dotted line represents a bond.

$T_1$ and $T_2$ in the above-described general formula (1) may be the same or different and are any of —CO— and —SO$_2$—. When $T_1$ and $T_2$ are such an electron-withdrawing group, the acidity of NH sandwiched therebetween is raised and the polymer becomes soluble in an aqueous alkaline solution, and therefore, aromatic ring units presenting strong intermolecular interaction can be introduced into the polymer without impairing the solubility in an aqueous alkaline solution and mechanical properties of the cured film can be improved.

1 in the above-described general formula (1) 0 or 1, with the aromatic linking group being a phenyl group when l=0, and a naphthyl group when l=1. From the viewpoint of solubility in an organic solvent that is used as a solvent for the composition and solubility in an aqueous alkaline solution, l=0 is preferable.

$T_1$, $T_2$ and l in the above-described general formula (2) are defined as above, and $X_2$ in the above-described general formula (2) is a divalent organic group, and is not specified as long as it is a divalent organic group, but it is preferably a divalent organic group having 6 to 40 carbon atoms, and more preferably a cyclic organic group containing 1 to 4 aromatic rings or aliphatic rings having substituents, or an aliphatic group or a siloxane group having no cyclic structure. Examples of a further suitable $X_2$ include a structure represented by any one of the following formula (16) or (17). In addition, the structure of $X_2$ may be one kind or a combination of two or more kinds:

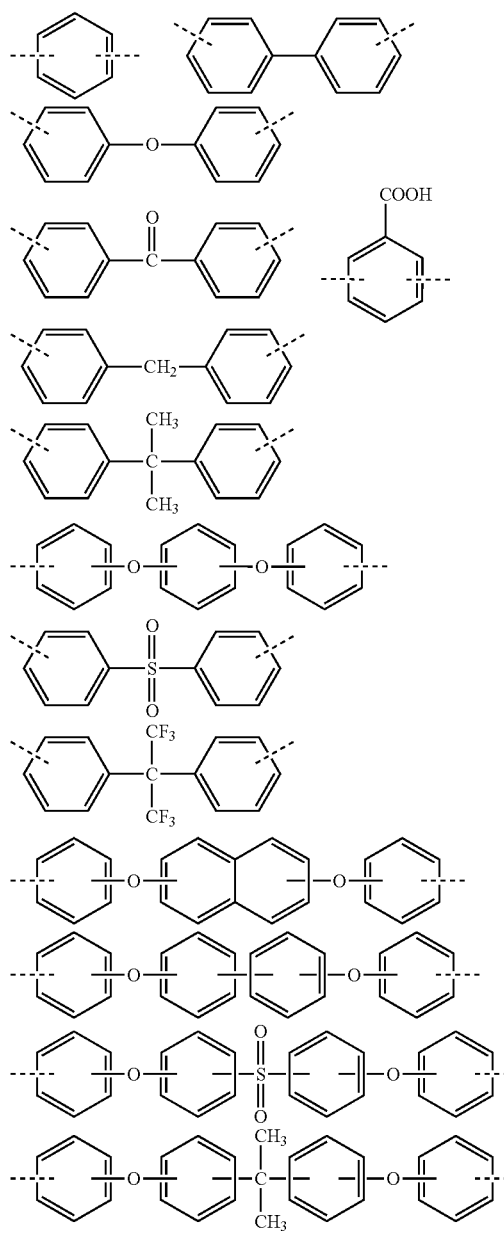

(16)

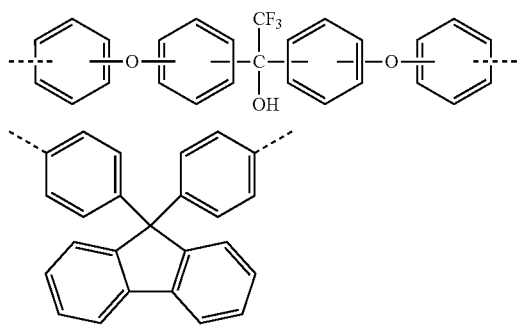

wherein the dotted line represents a bond with an amino group; and

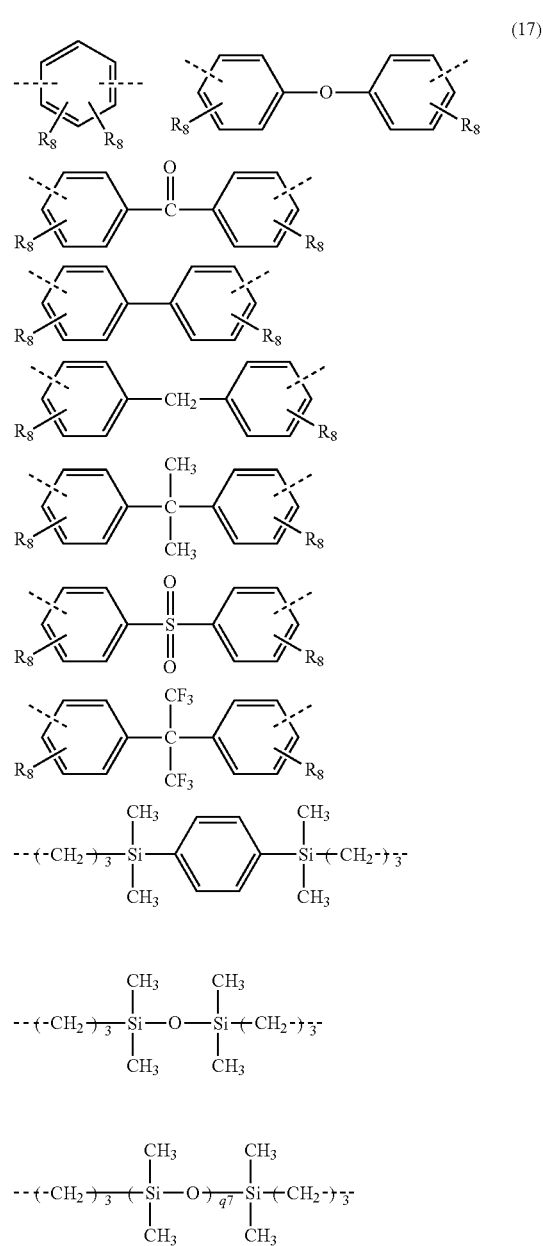

(17)

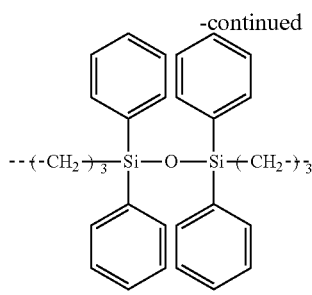

wherein the dotted line represents a bond with an amino group; $R_8$ each independently represents a methyl group, an ethyl group, a propyl group, a n-butyl group or a trifluoromethyl group; and $q_7$ is a positive number of 2 to 20.

In addition, it is preferable that the polymer according to the present invention further contain, in addition to the structural unit(s) represented by the above-described general formulas (1) and/or (2), a structural unit represented by the following general formula (3) (hereinafter, this may also be referred to as structural unit (3)):

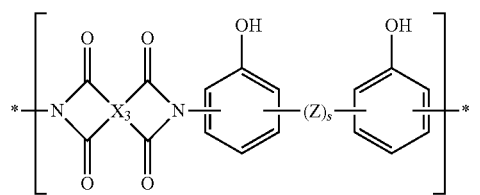

(3)

wherein $X_3$ is a tetravalent organic group that is the same as or different from $X_1$; s is 0 or 1; Z is a divalent linking group; and when s=0, two aromatic rings in the formula are directly bonded without interposition of a linking group;

$X_3$ in the above-described general formula (3) is a tetravalent organic group, but it may be the same as or different from the above-described $X_1$, and is not specified as long as it is a tetravalent organic group. It is preferably a tetravalent organic group of an alicyclic aliphatic group or an aromatic group having 4 to 40 carbon atoms, and is further preferably a tetravalent organic group represented by the above-described formula (15). In addition, the structure of $X_3$ may be one kind or a combination of two or more kinds.

s in the above-described general formula (3) is 0 or 1, and when s=0, two aromatic rings in the above-described general formula (3) are directly bonded without interposition of the divalent linking group Z.

On the other hand, when s=1, two aromatic rings in the above-described general formula (3) are bonded through the divalent linking group Z. Z is not specified as long as it is the divalent group. It is preferably a divalent organic group of an alicyclic aliphatic group or am aromatic group having 4 to 40 carbon atoms, and is further preferably a divalent linking group represented by the following formula (18). In addition, the structure of Z may be one kind or a combination of two or more kinds:

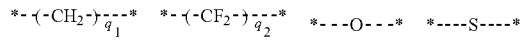

(18)

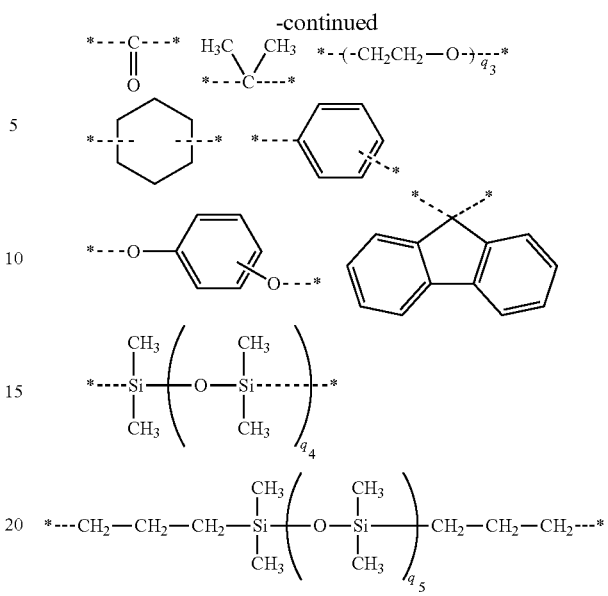

wherein $q_1$, $q_2$ and $q_3$ each represent an integer of 1 to 6; $q_4$ and $q_5$ each represent an integer of 1 to 10; and the dotted line represents a bond.

In particular, a preferable divalent linking group Z is a divalent group represented by the following general formula (13) or (14):

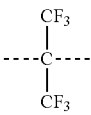

(13)

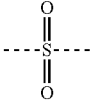

(14)

wherein the dotted line represents a bond.

It is preferable that Z be such a group because solubility in a developing solution, which is an aqueous alkaline solution, is improved.

As the structural unit represented by the above-described general formula (3), when Z in the above-described general formula (3) is a group represented by the above-described formula (13), a structural unit represented by the following general formula (3-1) is preferable, and when Z in the above-described general formula (3) is a group represented by the above-described formula (14), a structural unit represented by the following general formula (3-2) is preferable:

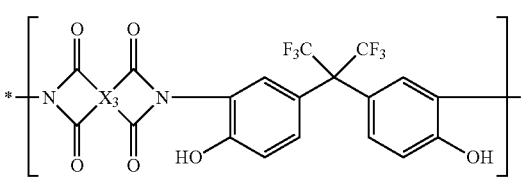

(3-1)

-continued (3-2)

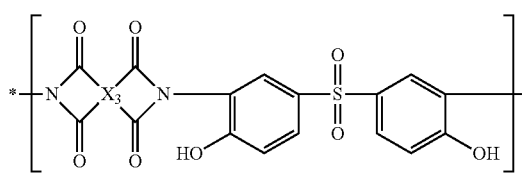

wherein $X_3$ is defined as above.

As in the above-described general formula (3-1), when the divalent linking group Z is a hexafluoropropylene group represented by the above-described formula (13) and is located at the para-position of the phenolic hydroxy groups, the acidity of the phenolic hydroxy groups is raised because the hexafluoropropylene group is an electron-withdrawing group and the solubility in a developing solution of an aqueous alkaline solution is improved, which is thus preferable.

Similarly, as in the above-described general formula (3-2), when the divalent linking group Z is a sulfone group represented by the above-described formula (14) and is located at the para-position of the phenolic hydroxy groups, the acidity of the phenolic hydroxy groups is raised because the sulfone group is also an electron-withdrawing group and the solubility in a developing solution of an aqueous alkaline solution is improved, which is thus preferable.

In addition, it is preferable that the polymer according to the present invention further contain, in addition to the structural unit(s) represented by the above-described general formulas (1) and/or (2), a structural unit represented by the following general formula (4) (hereinafter, this may also be referred to as structural unit (4)):

(4)

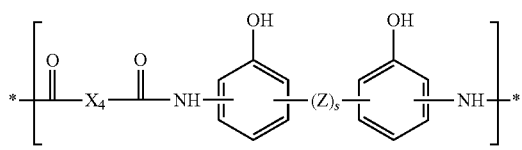

wherein $X_4$ is a divalent organic group; and s and Z are defined as above.

$X_4$ in the above-described general formula (4) is a divalent organic group, and is not specified as long as it is a divalent organic group. It is preferably a divalent organic group of a long-chain aliphatic structure or an alicyclic aliphatic group, or an aromatic group, having 4 to 40 carbon atoms. Further preferably, it is a divalent organic group represented by the following formula (19). In addition, the structure of $X_4$ may be one kind or a combination of two or more kinds:

(19)

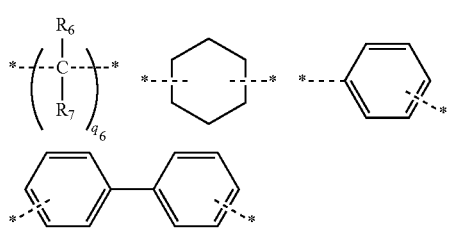

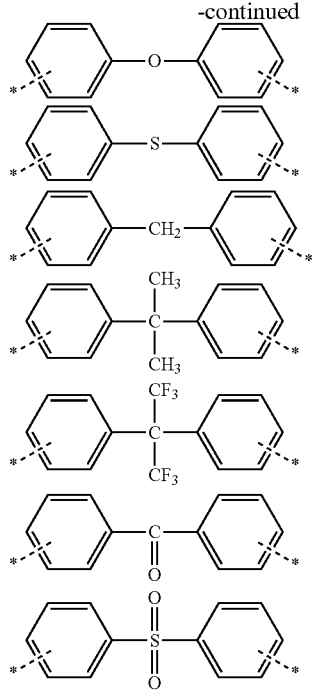

wherein $R_6$ and $R_7$ are each independently a hydrogen atom, a fluorine atom or an alkyl group having 1 to 6 carbon atoms; $q_6$ is an integer of 1 to 30; and the dotted line represents a bond.

When $X_4$ in the above-described general formula (4) is a divalent organic group that is a long-chain aliphatic structure, mechanical properties, in particular extensibility, of a cured film of the positive photosensitive resin composition according to the present invention are enhanced, which is thus preferable.

s and Z in the above-described general formula (4) are defined as above, and it is preferable that Z be the above-described general formula (13) or (14) from the viewpoint of solubility in a developing solution of an aqueous alkaline solution.

In addition, it is preferable that the polymer according to the present invention further contain, in addition to the structural unit(s) represented by the above-described general formulas (1) and/or (2), a structural unit represented by the following general formula (5) (hereinafter, this may also be referred to as structural unit (5)):

(5)

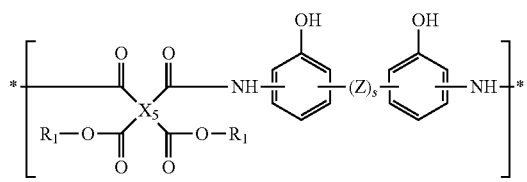

wherein $X_5$ is a tetravalent organic group that is the same as or different from $X_1$; $R_1$ is a group represented by the following general formula (6); and s and Z are defined as above:

(6)

wherein the dotted line represents a bond; $Y_1$ is an organic group with a valence of (k+1); Rf is a linear, branched or cyclic alkyl group having 1 to 20 carbon atoms or an aromatic group, in which part or all of hydrogen atoms are replaced with fluorine atoms, the aromatic group optionally substituted with alkyl groups; k is 1, 2 or 3; and n is 0 or 1.

When the polymer according to the present invention comprises structural unit (5), solubility in general organic solvents such as propylene glycol monomethyl ether acetate is improved and thus any solvents for the composition can be used but not specified. In addition, when the polymer according to the present invention comprises structural unit (5), mechanical properties of a cured film can be improved. The reason for the above is not certain, but this is assumed to be because, due to the heating upon making a cured film, imidization is advanced and a substituent containing fluorine atoms, represented by the above-described general formula (6), is desorbed, and although this substituent is removed from the system, it acts like a plasticizer until it is removed, and interaction between the polymers according to the present invention is thus made appropriate upon forming the cured film.

It is preferable that $Y_1$ in the above-described general formula (6) be a linear or branched divalent organic group (for example, an alkylene group) having 1 to 6 carbon atoms.

Furthermore, it is preferable that $R_1$ in the above-described general formula (5) be an organic group selected from any groups represented by the following general formulas (9), (10), (11) and (12). For the following formula (10), an organic group represented by the following formula (10') is more preferable:

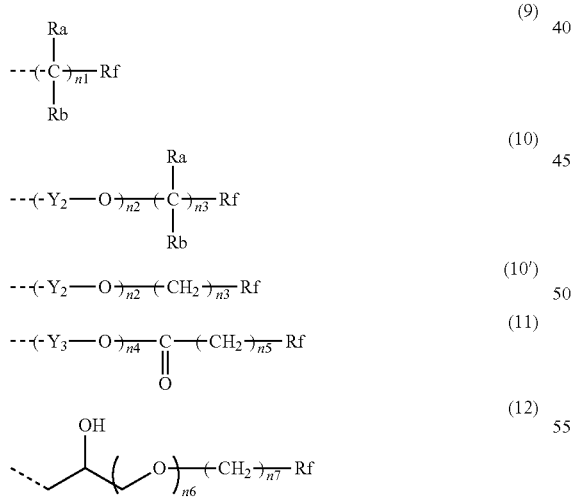

wherein the dotted line represents a bond; Rf is defined as above; Ra and Rb are a hydrogen atom or an alkyl group having 1 to 3 carbon atoms; $Y_2$ and $Y_3$ are a linear or branched alkylene group having 1 to 6 carbon atoms; and n1 is an integer of 0 to 6, n2 is an integer of 1 to 6, n3 is an integer of 0 to 6, n4 is an integer of 1 to 6, n5 is an integer of 0 to 6, n6 is an integer of 0 or 1, and n7 is an integer of 0 to 6.

It is preferable that $R_1$ be a group as described above because a compound to be a raw material for introducing $R_1$ is easily acquired.

Among the organic group represented by the above-described general formula (9), specific examples of an organic group that can be favorably used may include, but are not limited to, the following:

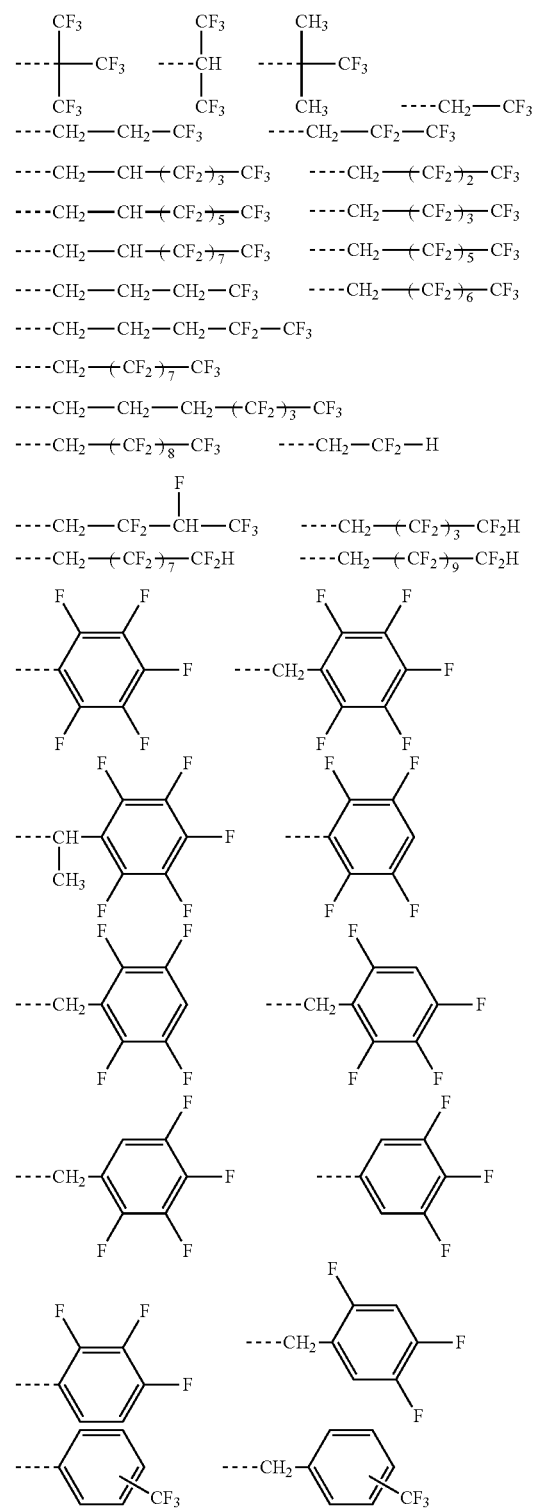

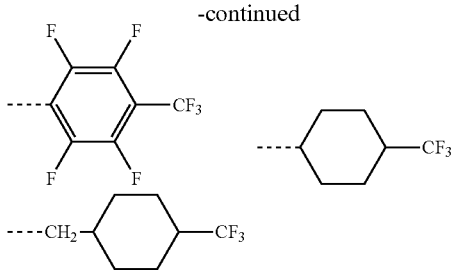
wherein the dotted line represents a bond.
Among the organic group represented by the above-described general formula (10), specific examples of an organic group that can be favorably used may include, but are not limited to, the following:
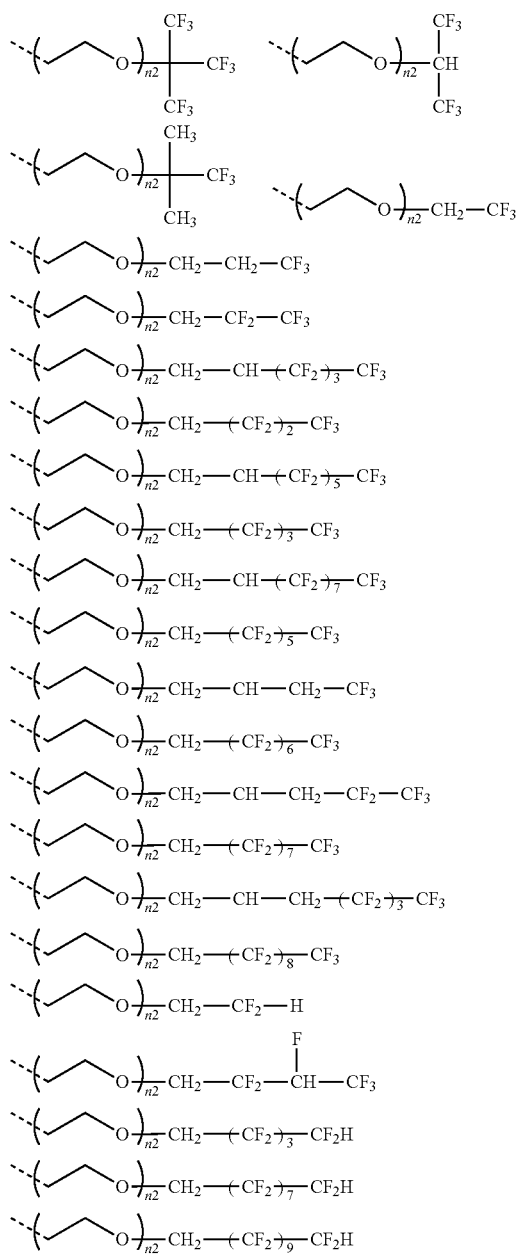
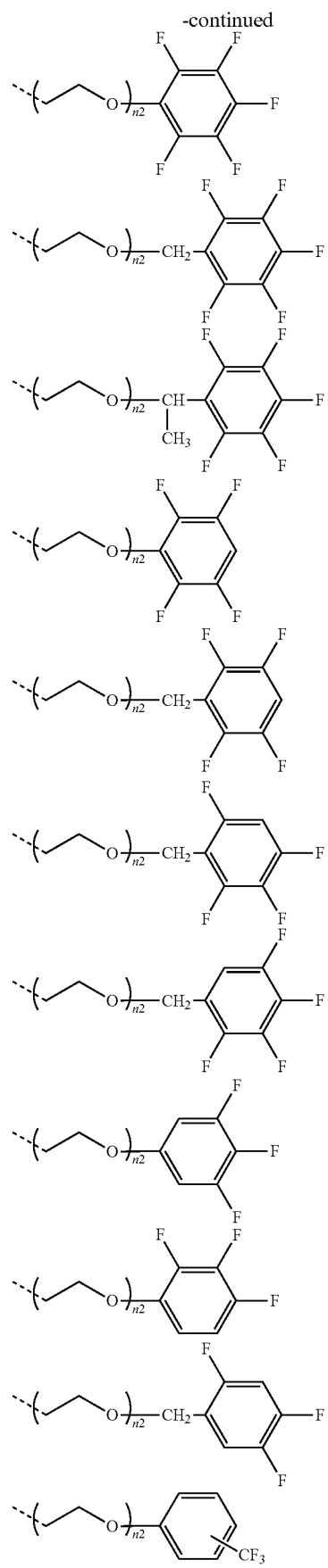

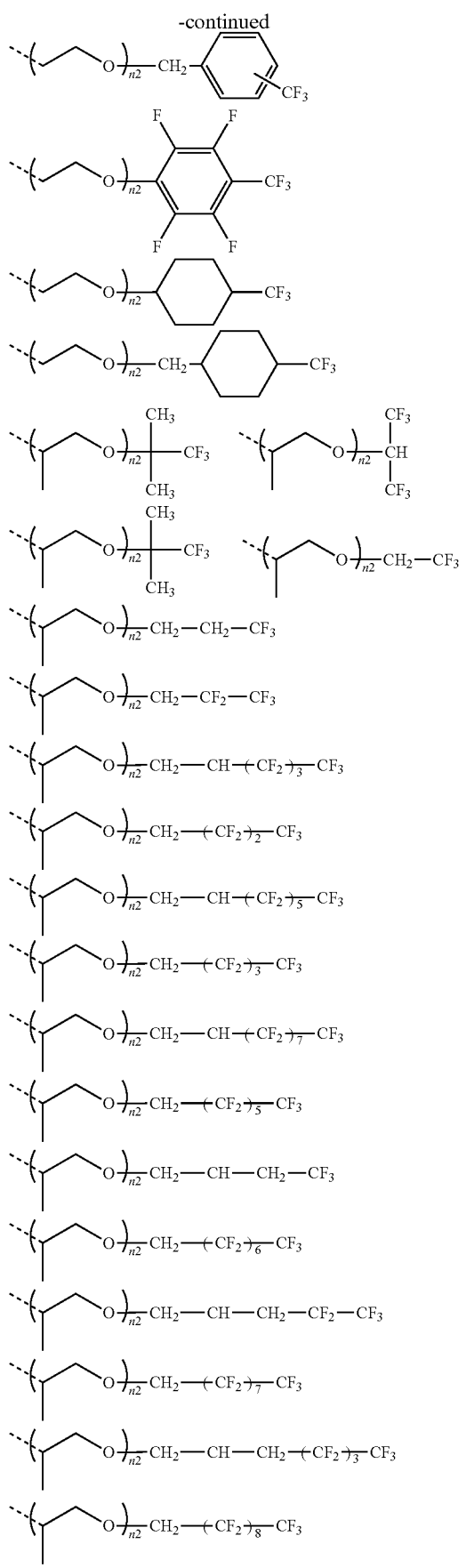
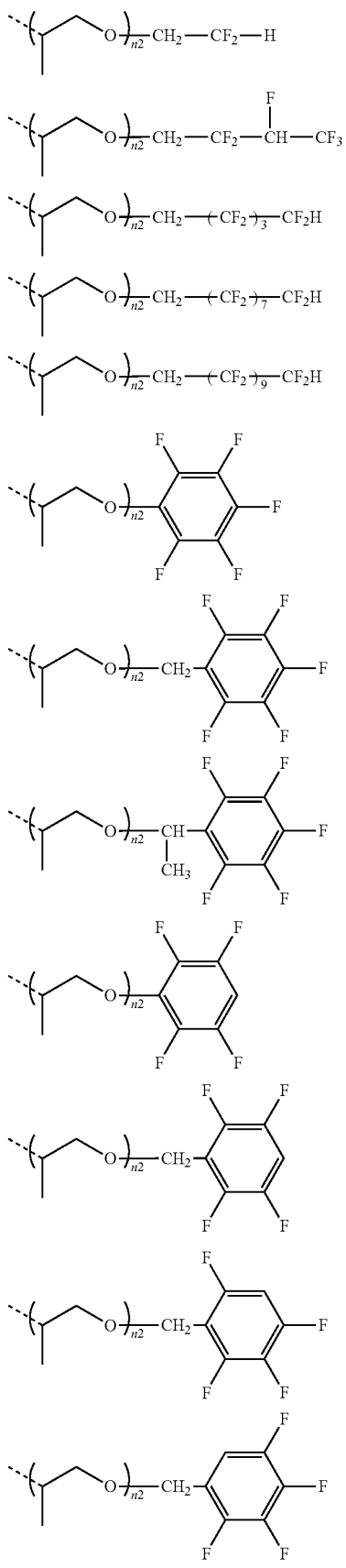

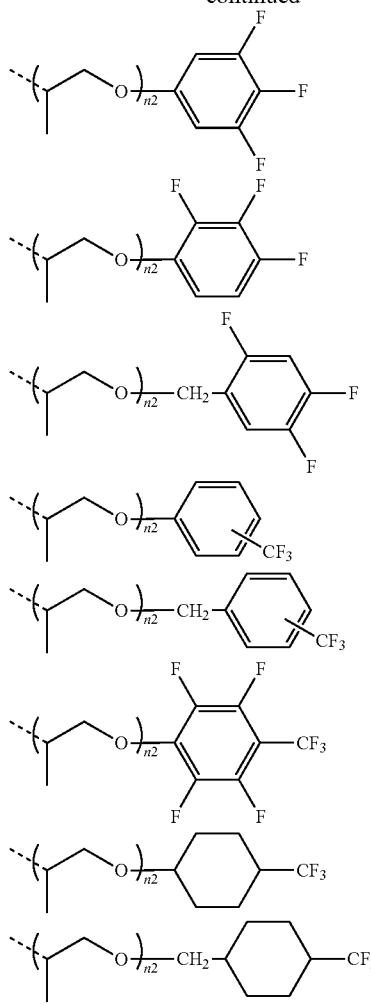
wherein the dotted line represents a bond; and n2 is an integer of 1 to 6, preferably an integer of 1 to 3, more preferably 1 or 2, and most preferably 1.
Among the organic group represented by the above-described general formula (11), specific examples of an organic group that can be favorably used may include, but are not limited to, the following:
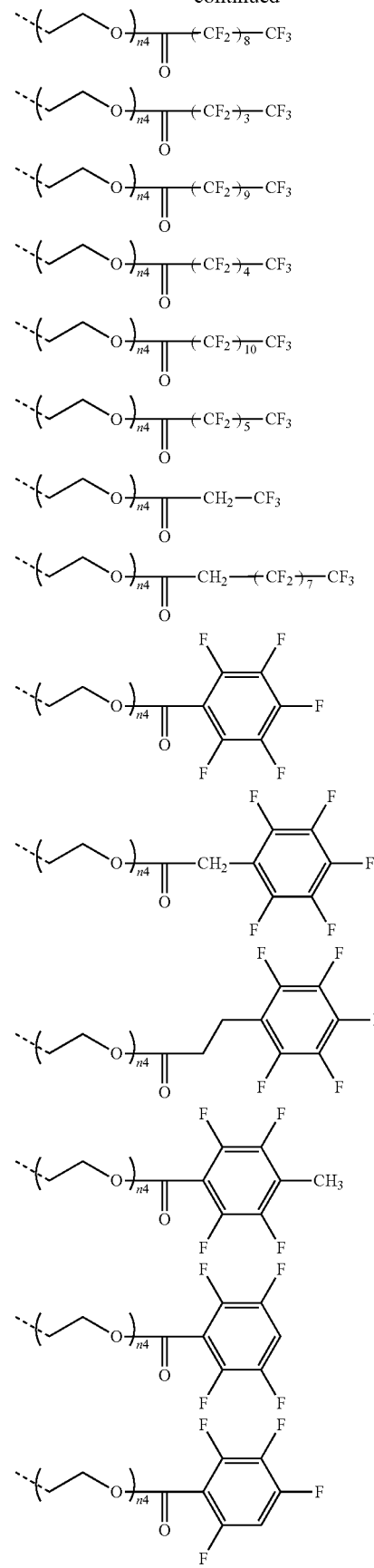

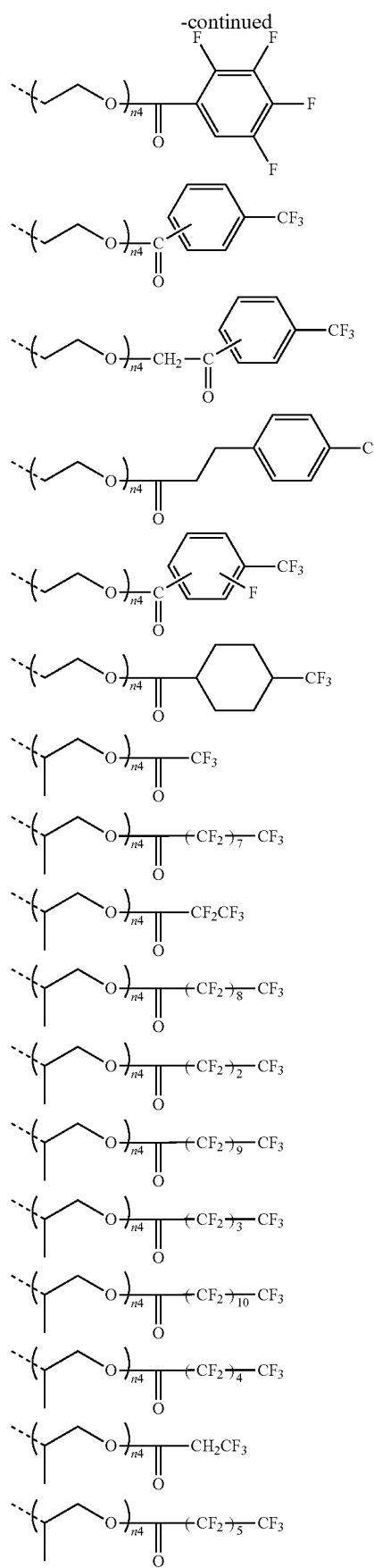
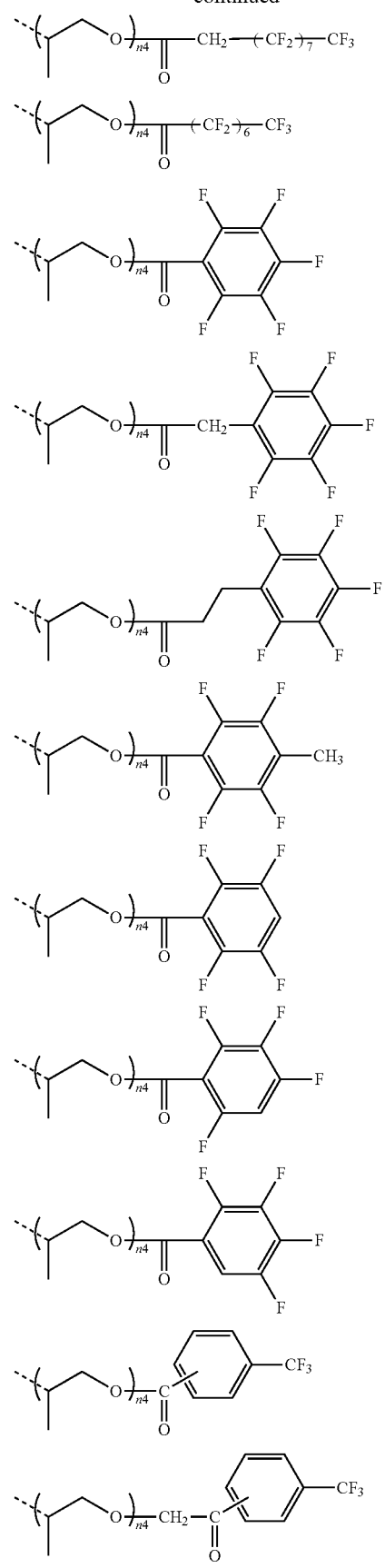

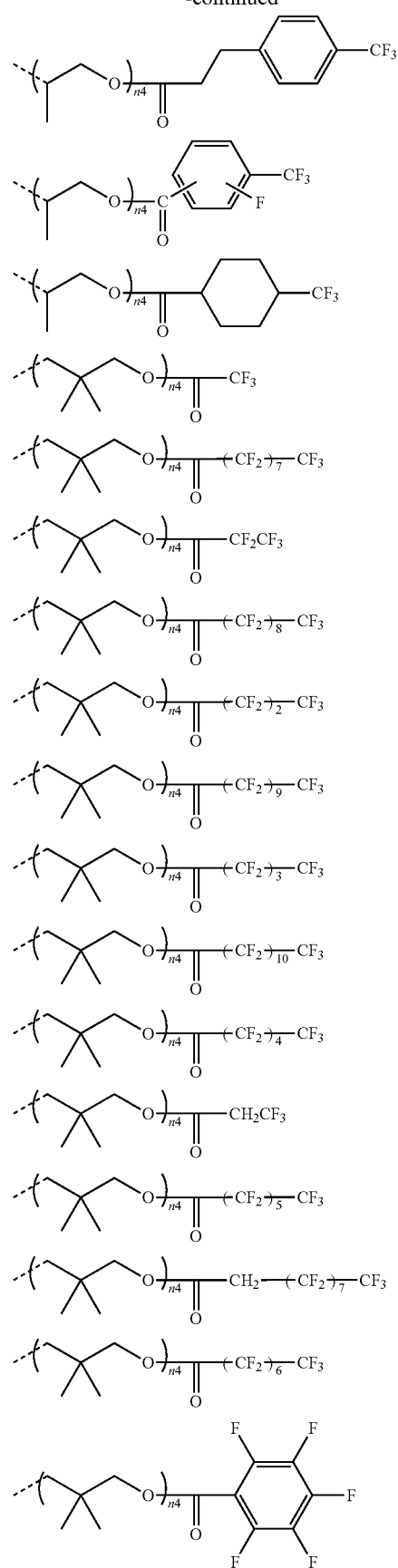
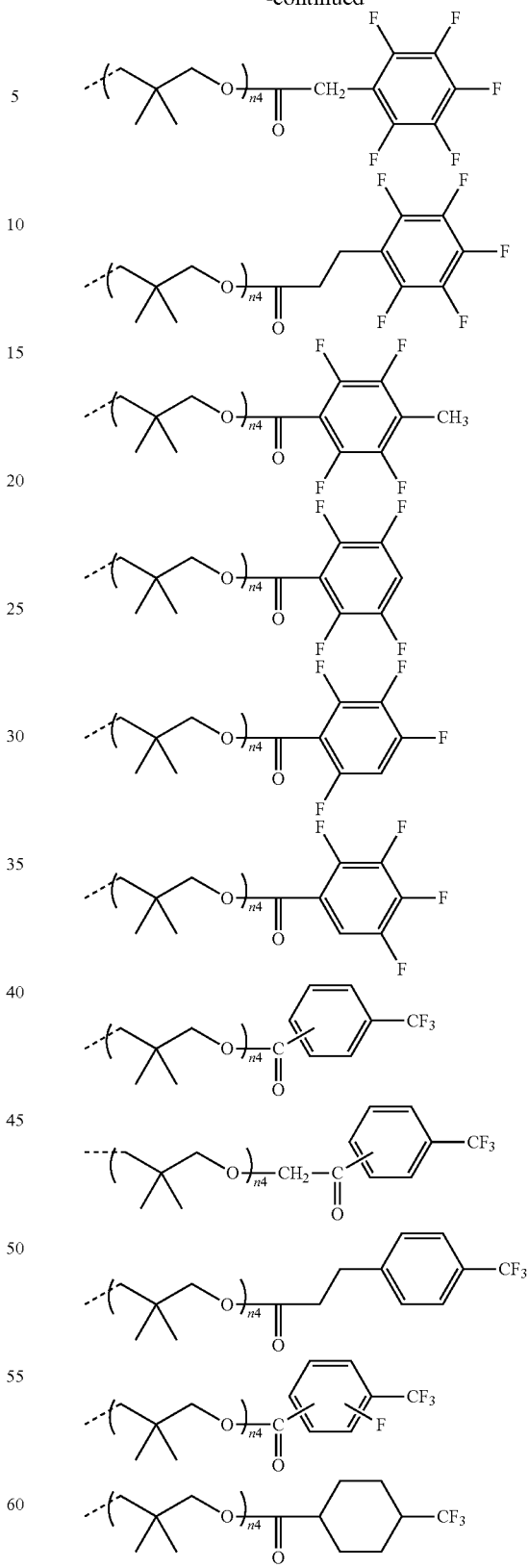
wherein the dotted line represents a bond; and n4 is an integer of 1 to 6, preferably an integer of 1 to 3, more preferably 1 or 2, and most preferably 1.

Among the organic group represented by the above-described general formula (12), specific examples of an organic group that can be favorably used may include, but are not limited to, the following:

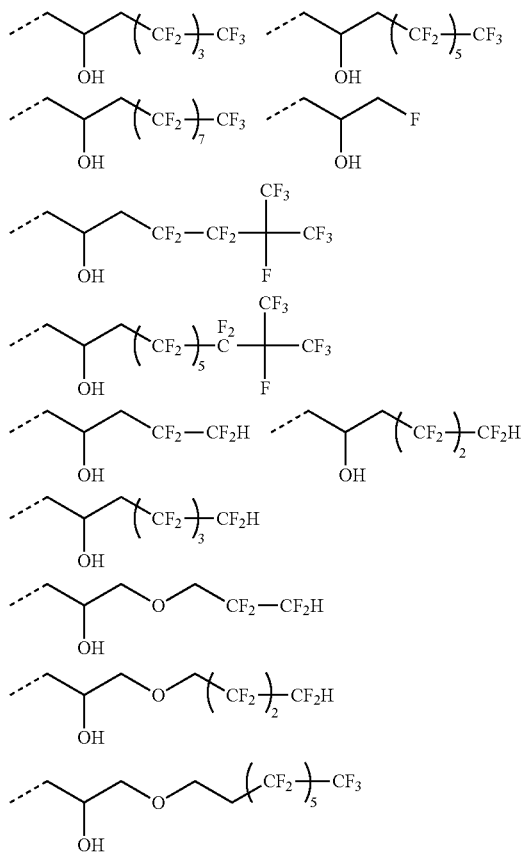

wherein the dotted line represents a bond.

Here, after patterning the photosensitive resin composition according to the present invention, in the post-curing, ring-closing reaction of imidization is proceeded in the structural unit of the polyimide precursor represented by general formula (5), but upon this, the introduced $R_1$ is desorbed and removed from the system, and thus, reduction in the film thickness of the formed film is observed. Accordingly, in order to minimize film thinning upon the post-curing, $R_1$ with low molecular weight is further suitable.

s and Z in the above-described general formula (5) are defined as above, and it is preferable that Z be the above-described general formula (13) or (14) from the viewpoint of solubility in a developing solution of an aqueous alkaline solution.

Further, it is preferable that the polymer according to the present invention further contain, in addition to the structural unit(s) represented by the above-described general formulas (1) and/or (2), a structural unit represented by the following general formula (7) (hereinafter, this may also be referred to as structural unit (7)):

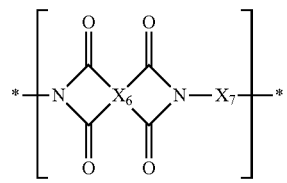

wherein $X_6$ is a tetravalent organic group that is the same as or different from $X_1$; and $X_7$ is a group represented by the following general formula (8):

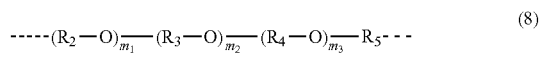

wherein $R_2$ to $R_5$ are each independently a linear or branched alkylene group having 2 to 10 carbon atoms; and $m_1$ is an integer of 1 to 40, and $m_2$ and $m_3$ are each independently an integer of 0 to 40.

$X_6$ in formula (7) can be a tetravalent organic group mentioned for $X_1$, for example, a tetravalent organic group represented by the above-described formula (15). And, among X7 (a group represented by the above-described general formula (8)), specific examples of an organic group that can be favorably used may include, but are not limited to, the following:

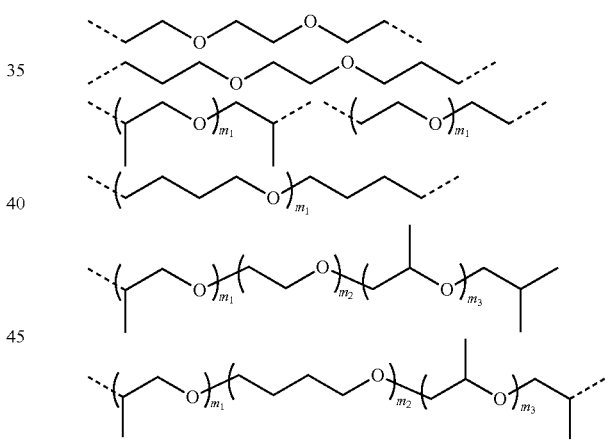

When the polymer according to the present invention comprises such structural unit (7), a cured film with flexibility, high extensibility and low warpage can be obtained.

In addition, the polymer according to the present invention may further comprise, in addition to the structural unit(s) represented by the above-described general formulas (1) and/or (2), a structural unit represented by the following general formula (20) (hereinafter, this may also be referred to as structural unit (20)):

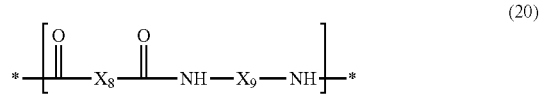

wherein $X_8$ is a divalent organic group that is the same as or different from $X_4$; and $X_9$ is a divalent organic group that is the same as or different from $X_2$.

$X_8$ in the above-described general formula (20) is a divalent organic group, but it may be the same as or different from the above-described $X_4$, and is not specified as long as it is a divalent organic group. It is preferably a divalent organic group of a long-chain aliphatic structure or an alicyclic aliphatic group, or an aromatic group having 4 to 40 carbon atoms. Further preferably, it is a divalent organic group represented by the above-described formula (19). In addition, the structure of $X_8$ may be one kind or a combination of two or more kinds.

On the other hand, $X_9$ in the above-described general formula (20) is a divalent organic group, and it may be the same as or different from the above-described $X_2$, but is not specified as long as it is a divalent organic group. It is preferably a divalent organic group having 6 to 40 carbon atoms, and is a cyclic organic group containing 1 to 4 aromatic rings or aliphatic rings having substituents, or an aliphatic group or a siloxane group having no cyclic structure. Further preferably, examples thereof include a structure represented by the above-described formula (16) or (17). In addition, the structure of $X_9$ may be one kind or a combination of two or more kinds.

In addition, the polymer according to the present invention may further comprise, in addition to the structural unit(s) represented by the above-described general formulas (1) and/or (2), a structural unit represented by the following general formula (21) (hereinafter, this may also be referred to as structural unit (21)):

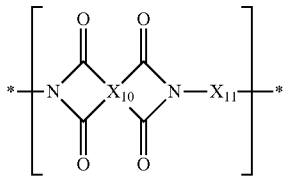

(21)

wherein $X_{10}$ is a tetravalent organic group that is the same as or different from $X_1$; and $X_{11}$ is a divalent organic group that is the same as or different from $X_2$.

$X_{10}$ in the above-described general formula (21) is a tetravalent organic group, and it may be the same as or different from the above-described $X_1$, but is not specified as long as it is a tetravalent organic group. It is preferably a tetravalent organic group of an alicyclic aliphatic group or an aromatic group having 4 to 40 carbon atoms, and is further preferably a tetravalent organic group represented by the above-described formula (15). In addition, the structure of $X_{10}$ may be one kind or a combination of two or more kinds.

On the other hand, $X_{11}$ in the above-described general formula (21) is a divalent organic group, and it may be the same as or different from the above-described $X_2$, but is not specified as long as it is a divalent organic group. It is preferably a divalent organic group having 6 to 40 carbon atoms, and is a cyclic organic group containing 1 to 4 aromatic rings or aliphatic rings having substituents, or an aliphatic group or a siloxane group having no cyclic structure. Further preferably, examples thereof include a structure represented by the above-described formula (16) or (17). In addition, the structure of $X_{11}$ may be one kind or a combination of two or more kinds.

Method of Producing Polymer Comprising Polyimide, Polyamide or Polyamide-Imide Structure The polymer according to the present invention comprises a structural unit(s) represented by the following general formulas (1) and/or (2):

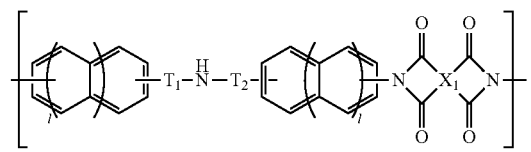

(1)

wherein $T_1$, $T_2$, l and $X_1$ are defined as above; and

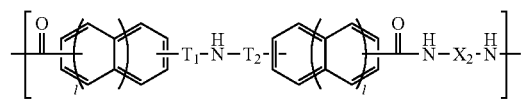

(2)

wherein $T_1$, $T_2$, l and $X_2$ are defined as above.

In addition, the polymer according to the present invention may further comprise, in addition to the above-described structural unit, other structural unit (such as structural units represented by general formulas (3) to (5) and (7)). Hereinafter, a method of producing polymers comprising these structural units will be described.

Method of Producing Polymer Comprising Structural Unit (1)

A polymer comprising a structural unit represented by the above-described general formula (1) can be obtained by allowing a tetracarboxylic dianhydride represented by the following general formula (22) to react with a diamine represented by the following general formula (23). At first, an amic acid is synthesized by allowing a tetracarboxylic dianhydride represented by the following general formula (22) to react with a diamine represented by the following general formula (23), and then, an imide ring is formed through thermal dehydration, thereby obtaining a polymer comprising structural unit (1).

The structural unit (1) can be prepared by: dissolving a diamine in a solvent that has a high boiling point and high polarity, such as γ-butyrolactone and N-methyl-2-pyrrolidone; then adding an acid anhydride thereto and reacting the resultant mixture at 0 to 80° C., preferably 10 to 50° C., to form an amic acid; then adding a non-polar solvent such as xylene thereto; and heating the reaction solution to 100 to 200° C., preferably 130 to 180° C., thereby carrying out imidization reaction while removing water from the reaction system:

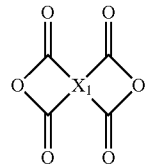

(22)

wherein $X_1$ is defined as above; and

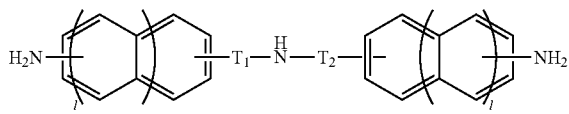
(23)

wherein $T_1$, $T_2$ and l are defined as above.

Suitable examples of the tetracarboxylic dianhydride represented by the above-described general formula (22) include aromatic acid dianhydrides, alicyclic acid dianhydrides, aliphatic acid dianhydrides and the like. Examples of the aromatic acid dianhydride include, but are not limited to, for example, pyromellitic dianhydride, 3,3',4,4'-biphenyltetracarboxylic dianhydride, 2,3,3',4'-biphenyltetracarboxylic dianhydride, 2,3,2',3'-biphenyltetracarboxylic dianhydride, 3,3',4,4'-terphenyltetracarboxylic dianhydride, 3,3',4,4'-oxyphthalic dianhydride, 2,3,3',4'-oxyphthalic dianhydride, 2,3,2',3'-oxyphthalic dianhydride, diphenylsulfone-3,3',4,4'-tetracarboxylic dianhydride, benzophenone-3,3',4,4'-tetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, 1,4-(3,4-dicarboxyphenoxy) benzene dianhydride, p-phenylenebis(trimellitic acid monoester acid anhydride), bis(1,3-dioxo-1,3-dihydroisobenzfuran-5-carboxylic acid)1,4-phenylene, 2,2-bis(4-(4-aminophenoxy)phenyl)propane, 1,2,5,6-naphthalenetetracarboxylic dianhydride, 2,3,6,7-naphthalenetetracarboxylic dianhydride, 9,9-bis(3,4-dicarboxyphenyl)fluorene dianhydride, 2,3,5,6-pyridinetetracarboxylic dianhydride, 3,4,9,10-perylenetetracarboxylic dianhydride, 2,2-bis(3,4-dicarboxyphenyl)hexafluoropropane dianhydride, 2,2-bis(4-(3,4-dicarboxybenzoyloxy)phenyl)hexafluoropropane dianhydride, 1,6-difluoropyromellitic dianhydride, 1-trifluoromethylpyromellitic dianhydride, 1,6-ditrifluoromethylpyromellitic dianhydride, 2,2'-bis(trifluoromethyl)-4,4'-bis(3,4-dicarboxyphenoxy)biphenyl dianhydride, 2,2'-bis[(dicarboxyphenoxy)phenyl]propane dianhydride, 2,2'-bis[(dicarboxyphenoxy)phenyl] hexafluoropropane dianhydride, and acid dianhydride compounds formed by substituting aromatic rings of the above compounds with an alkyl group, an alkoxy group, a halogen atom or the like.

Examples of the alicyclic acid dianhydride include, but are not limited to, for example, 1,2,3,4-cyclobutanetetracarboxylic dianhydride, 1,2,3,4-cyclopentanetetracarboxylic dianhydride, 1,2,4,5-cyclohexanetetracarboxylic dianhydride, 1,2,4,5-cyclopentanetetracarboxylic dianhydride, 1,2,3,4-tetramethyl-1,2,3,4-cyclobutanetetracarboxylic dianhydride, 1,2-dimethyl-1,2,3,4-cyclobutanetetracarboxylic dianhydride, 1,3-dimethyl-1,2,3,4-cyclobutanetetracarboxylic dianhydride, 1,2,3,4-cycloheptanetetracarboxylic dianhydride, 2,3,4,5-tetrahydrofurantetracarboxylic dianhydride, 3,4-dicarboxy-1-cyclohexylsuccinic dianhydride, 2,3,5-tricarboxycyclopentylacetic dianhydride, 3,4-dicarboxy-1,2,3,4-tetrahydro-1-naphthalenesuccinic dianhydride, bicyclo[3.3.0]octane-2,4,6,8-tetracarboxylic dianhydride, bicyclo[4.3.0]nonane-2,4,7,9-tetracarboxylic dianhydride, bicyclo[4.4.0]decane-2,4,7,9-tetracarboxylic dianhydride, bicyclo[4.4.0]decane-2,4,8,10-tetracarboxylic dianhydride, tricycle[6.3.0.0$^{2,6}$]undecane-3,5,9,11-tetracarboxylic dianhydride, bicyclo[2.2.2]octane-2,3,5,6-tetracarboxylic dianhydride, bicyclo[2.2.2]oct-7-ene-2,3,5,6-tetracarboxylic dianhydride, bicyclo[2.2.1]heptanetetracarboxylic dianhydride, bicyclo[2.2.1]heptane-5-carboxymethyl-2,3,6-tricarboxylic dianhydride, 7-oxabicyclo[2.2.1]heptane-2,4,6,8-tetracarboxylic dianhydride, octahydronaphthalene-1,2,6,7-tetracarboxylic dianhydride, tetradecahydroanthracene-1,2,8,9-tetracarboxylic dianhydride, 3,3',4,4'-dicyclohexanetetracarboxylic dianhydride, 3,3',4,4'-oxydicyclohexanetetracarboxylic dianhydride, 5-(2,5-dioxotetrahydro-3-furanyl)-3-methyl-3-cyclohexene-1,2-dicarboxylic anhydride, and "RIKACID" (Registered Trademark) BT-100 (trade name, manufactured by New Japan Chemical Co., Ltd.) and their derivatives, or acid dianhydride compounds formed by substituting aliphatic rings of the above compounds with an alkyl group, an alkoxy group, a halogen atom or the like.

Examples of the aliphatic acid dianhydride include, but are not limited to, for example, 1,2,3,4-butanetetracarboxylic dianhydride, 1,2,3,4-pentanetetracarboxylic dianhydride and their derivatives.

Any one of these aromatic acid dianhydrides, alicyclic acid dianhydrides or aliphatic acid dianhydrides may be used singly, or two or more of them may be used in combination.

A method of producing a diamine compound represented by the above-described general formula (23) includes a process in which an amide or sulfonamide compound represented by the following general formula (24) and an acid halide or sulfonic acid halide compound represented by the following general formula (25) are subjected to amidation in an organic solvent in the presence of a basic catalyst such as pyridine, thereby obtaining a dinitro compound represented by the following general formula (26), and a process in which the nitro groups are then reduced:

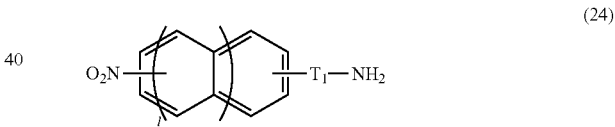
(24)

wherein $T_1$ and l are defined as above;

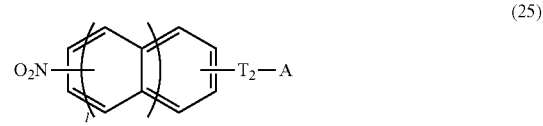
(25)

wherein $T_2$ and l are defined as above; and A represents a halogen atom; and

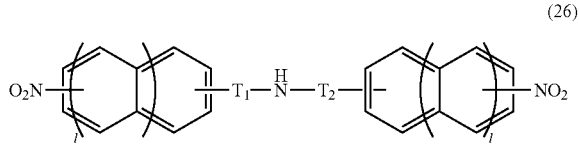
(26)

wherein $T_1$, $T_2$ and l are defined as above.

In the above-described general formula (25), A represents a halogen group (halogen atom) selected from a fluoro group, a chloro group, a bromo group and an iodine group. From the viewpoint of reactivity with a compound represented by the above-described general formula (24), it is preferable that A be a chloro group or a bromo group.

The organic solvent to be used for the above-described amidation reaction is not particularly specified as long as it is a solvent that does not affect the reaction, and aromatic hydrocarbons such as benzene, toluene and xylene; aliphatic hydrocarbons such as n-hexane, n-heptane and cyclohexane; amides such as N,N-dimethylformamide, N,N-dimethylacetamide and N-methyl-2-pyrrolidone; ethers such as diethyl ether, tetrahydrofuran, 1,4-dioxane, 1,2-dimethoxyethane and cyclopentyl methyl ether; ketones such as 2-butanone and 4-methyl-2-pentanone; nitriles such as acetonitrile; halogenated hydrocarbons such as chloroform, dichloromethane and dichloroethane; esters such as ethyl acetate, methyl acetate and butyl acetate; dimethylsulfoxide; and the like can be used. Any one of these solvents may be used singly, or two or more of them may be used in combination. Note that, when water is included in the solvent in a large amount, hydrolysis of an acid chloride or the like may occur, and therefore, it is preferable that a dehydrated solvent be used as the solvent or dehydration be carried out before use.

It is sufficient that the reaction temperature be the boiling point of the solvent or lower, and it can be approximately 0 to 200° C., and it is preferably 0 to 100° C.

Examples of the basic catalyst used in the above-described reaction may include trialkylamines such as triethylamine, tributylamine and N,N-dimethylcyclohexylamine; aliphatic cyclic tertiary amines such as N-methylmorpholine; aromatic amines such as N,N-dimethylaniline and triphenylamine; and heterocyclic amines such as pyridine, picoline, lutidine, quinoline and N,N-dimethyl-4-aminopyridine. Any one of these basic catalysts may be used singly, or two or more of them may be used in combination.

For the process of reducing the nitro groups of the above-described general formula (26), any known reduction method may be employed and there is no particular limitation thereon, but an exemplary process thereof includes a reduction process carried out with palladium-carbon, platinum oxide, Raney nickel, platinum-carbon, rhodium-alumina, platinum sulfide-carbon, reduced iron, iron chloride, tin, tin chloride, zinc or the like as a catalyst, and by using hydrogen gas, hydrazine, hydrogen chloride, ammonium chloride as a hydrogen atom source. In particular, catalytic hydrogenation is preferable because it is unlikely to cause side reactions and can readily provide the target product. In addition, the amount of the catalyst to be used is not particularly limited because it is determined appropriately depending on the type of hydrogen source or reaction conditions, but it is normally 0.01 mol % to 50 mol %, and preferably 0.1 mol % to 20 mol % in metal conversion for the dinitro compound.

As the reaction solvent for the above-described reduction reaction, a solvent that does not affect the reaction can be used. For example, examples thereof include ester solvents such as ethyl acetate and methyl acetate; aromatic hydrocarbon solvents such as toluene and xylene; aliphatic hydrocarbon solvents such as n-hexane, n-heptane and cyclohexane; ether solvents such as 1,2-dimethoxyethane, tetrahydrofuran and dioxane; alcohol solvents such as methanol and ethanol; ketone solvents such as 2-butanone and 4-methyl-2-pentanone; aprotic polar solvents such as N,N-dimethylformamide, N,N-dimethylacetamide, N-methyl-2-pyrrolidone and dimethylsulfoxide; and water. One of these solvents may be used singly, or two or more of them may be used in combination.

The reaction temperature for the above-described reduction reaction is preferably 0 to 100° C. and more preferably 10 to 50° C. In addition, the catalytic hydrogenation may be carried out under a pressurized condition, using an autoclave or the like, from the viewpoint of improving the reaction rate, allowing the reaction at low temperature, and the like.

Suitable examples of the amide or sulfonamide compound represented by the above-described general formula (24) include, but are not limited to, for example, 2-nitrobenzenesulfonamide, 3-nitrobenzenesulfonamide, 4-nitrobenzenesulfonamide, 2-nitrobenzamide, 3-nitrobenzamide, 4-nitrobenzamide, 5-nitro-1-naphthalenesulfonamide, 6-nitro-1-naphthalenesulfonamide, 7-nitro-1-naphthalenesulfonamide, 8-nitro-1-naphthalenesulfonamide, 5-nitro-2-naphthalenesulfonamide, 6-nitro-2-naphthalenesulfonamide, 7-nitro-2-naphthalenesulfonamide, 8-nitro-2-naphthalenesulfonamide, 5-nitro-2-naphthalenecarboxamide, 6-nitro-2-naphthalenecarboxamide, 7-nitro-2-naphthalenecarboxamide, 8-nitro-2-naphthalenecarboxamide, 5-nitro-1-naphthalenecarboxamide, 6-nitro-1-naphthalenecarboxamide, 7-nitro-1-naphthalenecarboxamide, and 8-nitro-1-naphthalenecarboxamide.

In addition, suitable examples of the acid halide or sulfonic acid halide compound represented by the above-described general formula (25) include, but are not limited to, for example, 2-nitrobenzenesulfonyl chloride, 3-nitrobenzenesulfonyl chloride, 4-nitrobenzenesulfonyl chloride, 2-nitrobenzenesulfonyl bromide, 3-nitrobenzenesulfonyl bromide, 4-nitrobenzenesulfonyl bromide, 2-nitrobenzoyl chloride, 3-nitrobenzoyl chloride, 4-nitrobenzoyl chloride, 2-nitrobenzoyl bromide, 3-nitrobenzoyl bromide, 4-nitrobenzoyl bromide, 5-nitro-1-naphthalenesulfonyl chloride, 6-nitro-1-naphthalenesulfonyl chloride, 7-nitro-1-naphthalenesulfonyl chloride, 8-nitro-1-naphthalenesulfonyl chloride, 5-nitro-2-naphthalenesulfonyl chloride, 6-nitro-2-naphthalenesulfonyl chloride, 7-nitro-2-naphthalenesulfonyl chloride, 8-nitro-2-naphthalenesulfonyl chloride, 5-nitro-1-naphthalenecarbonyl chloride, 6-nitro-1-naphthalenecarbonyl chloride, 7-nitro-1-naphthalenecarbonyl chloride, 8-nitro-1-naphthalenecarbonyl chloride, 5-nitro-2-naphthalenecarbonyl chloride, 6-nitro-2-naphthalenecarbonyl chloride, 7-nitro-2-naphthalenecarbonyl chloride, and 8-nitro-2-naphthalenecarbonyl chloride.

Method of Producing Polymer Comprising Structural Unit (2)

On the other hand, a polymer comprising a structural unit represented by the above-described general formula (2) can be obtained by reacting a dicarboxylic acid compound represented by the following general formula (27) with a diamine represented by the following general formula (28):

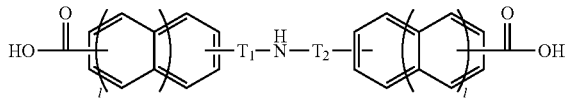

(27)

wherein $T_1$, $T_2$ and l are defined as above; and $$NH_2-X_2-NH_2 \qquad (28)$$

wherein $X_2$ is defined as above.

Here, the polymer comprising structural unit (2) can be obtained by, for example, reacting a dicarboxylic acid compound represented by the above-described general formula (27) with a diamine represented by the above-described general formula (28) in the presence of a dehydration condensation agent. That is, the polymer comprising structural unit (2) can be obtained by using the dicarboxylic acid compound represented by the above-described general formula (27) for the reaction in the state of being dissolved in a reaction solvent; adding into this reaction solution a known dehydration condensation agent (for example, dicyclohexylcarbodiimide, 1-ethoxycarbonyl-2-ethoxy-1,2-dihydroquinoline, 1,1-carbonyldioxy-di-1,2,3-benzotriazole, N,N'-disuccinimidyl carbonate or the like) and mixing the resultant mixture under ice cooling to make the dicarboxylic acid compound represented by the above-described general formula (27) into an acid anhydride; and then adding dropwise to this the diamine represented by the above-described general formula (28) that has been dissolved or dispersed in a solvent separately to make polycondensation.

In addition, examples of another method of obtaining the polymer comprising structural unit (2) by reacting the dicarboxylic acid compound represented by the above-described general formula (27) with the diamine (diamine compound) represented by the above-described general formula (28) include a process in which the polymer is synthesized by converting the dicarboxylic acid diester compound represented by the above-described general formula (27) into an acid chloride, using a chlorinating agent such as thionyl chloride or dichlorooxalic acid, and reacting the acid chloride with the diamine represented by the above-described general formula (28).

In the above-mentioned reaction in which the dicarboxylic acid compound is converted into an acid chloride, using a chlorinating agent, a basic compound may be used. For this basic compound, for example, pyridine, N,N-dimethyl-4-aminopyridine, triethylamine or the like can be used.

Then, by reacting the obtained acid chloride of the dicarboxylic acid compound with the diamine represented by the above-described general formula (28) in the presence of a basic catalyst, the target polymer comprising structural unit (2) can be obtained. Upon this, examples of the basic catalyst include pyridine, N,N-dimethyl-4-aminopyridine, 1,8-diazabicyclo[5.4.0]undec-7-ene, and 1,5-diazabicyclo[4.3.0]non-5-ene. Any one of these basic catalysts may be used singly, or two or more of them may be used in combination.

In the method of producing the polymer according to the present invention, it is preferable that the solvent to be used in the process through the acid chloride, be the above-described dicarboxylic acid compound and an acid chloride thereof, as well as a solvent to which the polymer obtained through polycondensation with the diamine can be dissolved well. Specific examples thereof include N-methyl-2-pyrrolidone, N,N-dimethylacetamide, N,N-dimethylformamide, dimethylsulfoxide, tetramethylurea, hexamethylphosphoric triamide and γ-butyrolactone. In addition, other than polar solvents, ketones, esters, lactones, ethers, halogenated hydrocarbons, hydrocarbons and the like can also be used. For example, examples thereof include acetone, diethyl ketone, methyl ethyl ketone, methyl isobutyl ketone, cyclohexanone, methyl acetate, ethyl acetate, butyl acetate, diethyl oxalate, diethyl malonate, diethyl ether, ethylene glycol dimethyl ether, diethylene glycol dimethyl ether, tetrahydrofuran, dichloromethane, 1,2-dichloroethane, 1,4-dichlorobutane, trichloroethane, chlorobenzene, o-dichlorobenzene, hexane, heptane, octane, benzene, toluene and xylene. Any one of these organic solvents may be used singly, or two or more of them may be used in combination.

Examples of a method of producing a dicarboxylic acid compound represented by the above-described general formula (27) include a process in which an amide or sulfonamide compound represented by the following general formula (29) and an acid halide or sulfonic acid halide compound represented by the following general formula (30) are subjected to amidation in an organic solvent in the presence of a basic catalyst such as pyridine, thereby obtaining a dicyano compound or diester compound represented by the following general formula (31), and the cyano groups or the ester groups are then hydrolyzed:

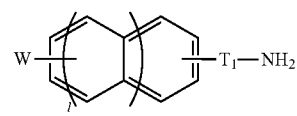

(29)

wherein $T_1$ and l are defined as above; and W is a cyano group or an ester group;

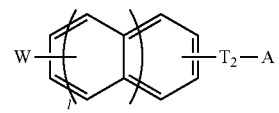

(30)

wherein $T_2$ and l are defined as above; and A represents a halogen atom; and

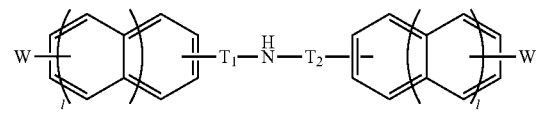

(31)

wherein $T_1$, $T_2$, l and W are defined as above.

In the above-described general formula (30), A represents a halogen group (halogen atom) selected from a fluoro group, a chloro group, a bromo group and an iodine group. From the viewpoint of reactivity with a compound represented by the above-described general formula (29), it is preferable that A be a chloro group or a bromo group.

The above-described amidation reaction can be carried out in the same as the method of producing a diamine compound represented by the above-described general formula (23).

For a method of hydrolyzing the cyano groups or the ester groups in the above-described general formula (31), any of known methods may be employed and there is no particular limitation thereon, but it is preferable that the hydrolysis be carried out in the presence of a strong acid or a strong base.

There is no particular limitation on the acid that can be used, but it is preferably a strong acid, for example, hydrochloric acid, sulfuric acid, nitric acid, p-toluenesulfonic acid and strong acid based ion exchange resin. Any one of these acids may be used singly, or two or more of them may be used in combination.

There is no particular limitation on the base that can be used, but it is preferably a strong base, for example, alkaline metal hydroxides such as potassium hydroxide and sodium hydroxide; alkaline metal hydrides such as lithium hydride and sodium hydride; alkyl lithiums such as methyl lithium, ethyl lithium, n-butyl lithium, s-butyl lithium and t-butyl lithium; and aryl lithiums such as phenyl lithium. Any one of these bases may be used singly, or two or more of them may be used in combination.

Among them, from the viewpoint of reactivity, bases are preferable, alkaline metal hydroxides are more preferable, and potassium hydroxide is further preferable.

The amount of the strong acid or strong base to be used is normally, from the viewpoint of reactivity, preferably 0.1 to 100 moles and more preferably 1 to 20 moles for 1 mole of the dicyano compound or diester compound represented by the above-described general formula (31).

This reaction can be carried out normally in the presence of a solvent. For the solvent that can be used, other than water, which hydrolyzes the dicyano compound or diester compound represented by the above-described general formula (31), organic solvents can also be used. Examples of the organic solvent include aromatic hydrocarbon solvents such as toluene, xylene and benzene; ether solvents such as diethyl ether, tetrahydrofuran, dioxane, dimethoxyethane and diisopropyl ether; halogenated hydrocarbon solvents such as methyl chloride, chloroform, dichloromethane, dichloroethane and dibromoethane; ketone solvents such as acetone and methyl ethyl ketone; amide solvents such as dimethylformamide and dimethylacetamide; nitrile solvents such as acetonitrile; alcohol solvents such as methanol, ethanol, isopropyl alcohol, 2-methoxyethanol and 2-ethoxyethanol; and dimethylsulfoxide. One of these organic solvents may be used singly, or two or more of them may be used in combination. Among them, from the viewpoint of reactivity, alcohol solvents are preferable, and methanol and ethanol are particularly preferable.

The reaction temperature for the above-described hydrolysis reaction is normally 50 to 200° C., and preferably 80 to 180° C.

Suitable examples of the amide or sulfonamide compound represented by the above-described general formula (29) include, but are not limited to, for example, 2-cyanobenzenesulfonamide, 3-cyanobenzenesulfonamide, 4-cyanobenzenesulfonamide, methyl-2-(aminosulfonyl)benzoate, methyl-3-(aminosulfonyl)benzoate, methyl-4-(aminosulfonyl)benzoate, 2-cyanobenzamide, 3-cyanobenzamide, 4-cyanobenzamide, methyl-2-carbamoylbenzoate, methyl-3-carbamoylbenzoate, methyl-4-carbamoylbenzoate, 5-cyano-1-naphthalenesulfonamide, 6-cyano-1-naphthalenesulfonamide, 7-cyano-1-naphthalenesulfonamide, 8-cyano-1-naphthalenesulfonamide, 5-cyano-2-naphthalenesulfonamide, 6-cyano-2-naphthalenesulfonamide, 7-cyano-2-naphthalenesulfonamide, 8-cyano-2-naphthalenesulfonamide, 5-cyano-2-naphthalenecarboxamide, 6-cyano-2-naphthalenecarboxamide, 7-cyano-2-naphthalenecarboxamide, 8-cyano-2-naphthalenecarboxamide, methyl-5-(aminocarbonyl)-1-naphthoate, methyl-6-(aminocarbonyl)-1-naphthoate, methyl-7-(aminocarbonyl)-1-naphthoate, methyl-8-(aminocarbonyl)-1-naphthoate, methyl-5-(aminocarbonyl)-2-naphthoate, methyl 6-(aminocarbonyl)-2-naphthoate, methyl-7-(aminocarbonyl)-2-naphthoate, and methyl-8-(aminocarbonyl)-2-naphthoate.

In addition, suitable examples of the acid halide or sulfonic acid halide compound represented by the above-described general formula (30) include, but are not limited to, for example, 2-cyanobenzenesulfonyl chloride, 3-cyanobenzenesulfonyl chloride, 4-cyanobenzenesulfonyl chloride, methyl-2-(chlorosulfonyl)benzoate, methyl-3-(chlorosulfonyl)benzoate, methyl-4-(chlorosulfonyl)benzoate, 2-cyanobenzoyl chloride, 3-cyanobenzoyl chloride, 4-cyanobenzoyl chloride, methyl-2-(chloroformyl)benzoate, methyl-3-(chloroformyl)benzoate, methyl-4-(chloroformyl) benzoate, 5-cyano-2-naphthalenesulfonyl chloride, 6-cyano-2-naphthalenesulfonyl chloride, 7-cyano-2-naphthalenesulfonyl chloride, 8-cyano-2-naphthalenesulfonyl chloride, 5-cyano-1-naphthalenesulfonyl chloride, 6-cyano-1-naphthalenesulfonyl chloride, 7-cyano-1-naphthalenesulfonyl chloride, 8-cyano-1-naphthalenesulfonyl chloride, methyl-5-(chlorosulfonyl)-2-naphthoate, methyl-6-(chlorosulfonyl)-2-naphthoate, methyl-7-(chlorosulfonyl)-2-naphthoate, methyl-8-(chlorosulfonyl)-2-naphthoate, methyl-5-(chlorosulfonyl)-1-naphthoate, methyl-6-(chlorosulfonyl)-1-naphthoate, methyl-7-(chlorosulfonyl)-1-naphthoate, methyl-8-(chlorosulfonyl)-1-naphthoate, 5-cyano-2-naphthalenecarbonyl chloride, 6-cyano-2-naphthalenecarbonyl chloride, 7-cyano-2-naphthalenecarbonyl chloride, 8-cyano-2-naphthalenecarbonyl chloride, 5-cyano-1-naphthalenecarbonyl chloride, 6-cyano-1-naphthalenecarbonyl chloride, 7-cyano-1-naphthalenecarbonyl chloride, 8-cyano-1-naphthalenecarbonyl chloride, methyl-5-(chlorocarbonyl)-2-naphthoate, methyl-6-(chlorocarbonyl)-2-naphthoate, methyl-7-(chlorocarbonyl)-2-naphthoate, methyl-8-(chlorocarbonyl)-2-naphthoate, methyl-5-(chlorocarbonyl)-1-naphthoate, methyl-6-(chlorocarbonyl)-1-naphthoate, methyl-7-(chlorocarbonyl)-1-naphthoate, and methyl-8-(chlorocarbonyl)-1-naphthoate.

In addition, examples of the diamine represented by the above-described general formula (28) include aromatic diamines, alicyclic diamines and aliphatic diamines. Preferable examples of the aromatic diamine include, but are not limited to, for example, 3,4'-diaminodiphenyl ether, 4,4'-diaminodiphenyl ether, 3,4'-diaminodiphenylmethane, 4,4'-diaminodiphenylmethane, 3,3'-diaminodiphenylsulfone, 3,4'-diaminodiphenylsulfone, 4,4'-diaminodiphenylsulfone, 3,4'-diaminodiphenylsulfide, 4,4'-diaminodiphenylsulfide, 1,4-bis(4-aminophenoxy)benzene, benzidine, 2,2'-bis(trifluoromethyl)benzidine, 3,3'-bis(trifluoromethyl)benzidine, 2,2'-dimethylbenzidine, 3,3'-dimethylbenzidine, 2,2'3,3'-tetramethylbenzidine, 2,2'-dichlorobenzidine, 3,3'-dichlorobenzidine, 2,2'3,3'-tetrachlorobenzidine, m-phenylene diamine, p-phenylene diamine, 1,5-naphthalenediamine, 2,6-naphthalenediamine, bis(4-aminophenoxy-phenyl)sulfone, bis(3-aminophenoxyphenyl)sulfone, bis[4-(3-aminophenoxy)phenyl]sulfone, bis(4-aminophenoxy)biphenyl, bis{4-(4-aminophenoxy)phenyl} ether, 1,4-bis(4-aminophenoxy)benzene, 9,9-bis(4-aminophenyl)fluorene, 2,2'-bis[3-(3-aminobenzamide)-4-hydroxyphenyl]hexafluoropropane, 4-aminophenyl-4'-aminobenzoate, 4,4'-diaminobenzanilide, or diamine compounds formed by substituting aromatic rings of the above compounds with an alkyl group, an alkoxy group, a halogen atom or the like.

Examples of the alicyclic diamine include, but are not limited to, for example, cyclobutanediamine, isophoronediamine, bicyclo[2.2.1]heptanebismethylamine, tricyclo[3.3.1.1$^{3,7}$]decane-1,3-diamine, 1,2-cyclohexyldiamine, 1,3-cyclohexyldiamine, 1,4-diaminocyclohexane, trans-1,4-diaminocyclohexane, cis-1,4-diaminocyclohexane, 4,4'-diaminodicyclohexylmethane, 3,3'-dimethyl-4,4'-diaminodicyclohexylmethane, 3,3'-diethyl-4,4'-diaminodicyclohexylmethane, 3,3',5,5'-tetramethyl-4,4'- diaminodicyclohexylmethane, 3,3',5,5'-tetraethyl-4,4'-diaminodicyclohexylmethane, 3,5-diethyl-3',5'-dimethyl-4,4'-diaminodicyclohexylmethane, 4,4'-diaminodicyclohexyl ether, 3,3'-dimethyl-4,4'-diaminodicyclohexyl ether, 3,3'-diethyl-4,4'-diaminodicyclohexyl ether, 3,3',5,5'-tetramethyl-4,4'-diaminodicyclohexyl ether, 3,3',5,5'-tetraethyl-4,4'-diaminodicyclohexyl ether, 3,5-diethyl-3',5'-dimethyl-4,4'-diaminodicyclohexyl ether, 2,2-bis(4-aminocyclohexyl)propane, 2,2-bis(3-methyl-4-aminocyclohexyl)propane, 2,2-bis(3-ethyl-4-aminocyclohexyl)propane, 2,2-bis(3,5-dimethyl-4-aminocyclohexyl)propane, 2,2-bis(3,5-diethyl-4-aminocyclohexyl)propane, 2,2-(3,5-diethyl-3',5'-dimethyl-4,4'-diaminodicyclohexyl)propane, or diamine compounds formed by substituting aliphatic rings of the above compounds with an alkyl group, an alkoxy group, a halogen atom or the like.

Examples of the aliphatic diamine include, but are not limited to, for example, alkylene diamines such as ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane and 1,10-diaminodecane; ethylene glycol diamines such as bis(aminomethyl) ether, bis(2-aminoethyl) ether and bis(3-aminopropyl) ether; and siloxane diamines such as 1,3-bis(3-aminopropyl)tetramethyldisiloxane, 1,3-bis(4-aminobutyl)tetramethyldisiloxane and α,ω-bis(3-aminopropyl)polydimethylsiloxane.

Any one of these aromatic diamines, alicyclic diamines or aliphatic diamines may be used singly, or two or more of them may be used in combination.

In addition, siloxane diamines can also be suitably used.

Method of Producing Polymer Comprising Another Structural Unit

As mentioned above, the polymer according to the present invention can further contain, in addition to the structural unit(s) represented by the above-described general formulas (1) and/or (2), other structural units. Specifically, the polymer can further contain the following structural unit (3):

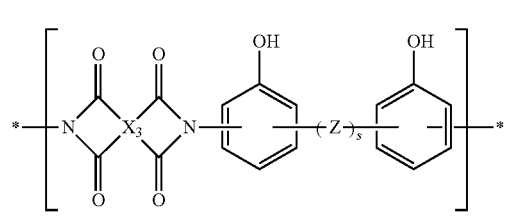

(3)

wherein $X_3$, s and Z are defined as above.

A polymer comprising the above-described structural unit (3) can be obtained by carrying out the same reaction procedure as that of the above-mentioned structural unit (1). That is, it can be obtained by reacting a tetracarboxylic dianhydride represented by the following general formula (32) with a diamine represented by the following general formula (33). At first, an amic acid is synthesized by reacting a tetracarboxylic dianhydride represented by the following general formula (32) with a diamine represented by the following general formula (33), and then, an imide ring is formed through thermal dehydration, thereby obtaining a polymer comprising structural unit (3):

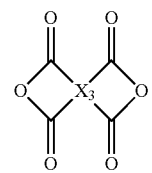

(32)

wherein $X_3$ is defined as above; and

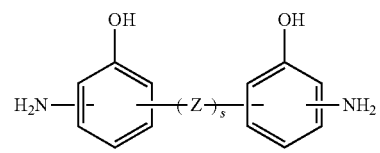

(33)

wherein s and Z are defined as above.

Suitable examples of the tetracarboxylic dianhydride represented by the above-described general formula (32) may include the examples recited for the tetracarboxylic dianhydride represented by the above-described general formula (22).

s in the above-described general formula (33) is 0 or 1, and when s=0, two aromatic rings in the above-described general formula (33) are directly bonded without interposition of the divalent linking group Z.

And, when s=1 in the above-described general formula (33), Z in the above-described general formula (33) is not specified as long as it is a divalent group. It is preferably a divalent organic group of an alicyclic aliphatic group or an aromatic group having 4 to 40 carbon atoms, as mentioned above, and is further preferably a divalent linking group represented by the above-described formula (18). In addition, the structure of Z may be one kind or a combination of two or more kinds.

Furthermore, suitable examples of the diamine represented by the above-described general formula (33) are compounds represented by the following general formulas (34) and (35):

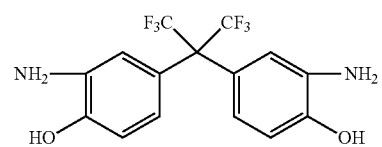

(34)

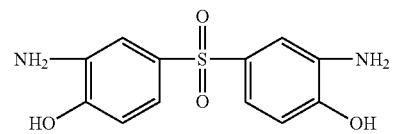

(35)

A polymer obtained by reacting the diamine represented by the above-described general formula (34) with the tetracarboxylic dianhydride represented by the above-described general formula (32) is a polymer comprising a structural unit represented by the above-described general formula (3-1), which is a preferable structural unit.

And, a polymer obtained by reacting the diamine represented by the above-described general formula (35) with the tetracarboxylic dianhydride represented by the above-described general formula (32) is a polymer comprising a structural unit represented by the above-described general formula (3-2), which is a preferable structural unit.

As mentioned above, the polymer according to the present invention can further contain, in addition to the structural unit(s) represented by the above-described general formulas (1) and/or (2), the following structural unit (4):

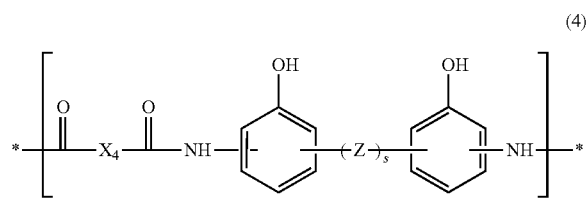

(4)

wherein $X_4$, s and Z are defined as above.

A polymer comprising the above-described structural unit (4) can be obtained by carrying out the same reaction procedure as that of the above-mentioned structural unit (2). That is, it can be obtained by reacting a dicarboxylic acid compound represented by the following general formula (36) with the diamine represented by the above-described general formula (33) through reaction in the presence of a dehydration condensation agent, or, by converting the dicarboxylic acid compound using a chlorinating agent into an acid chloride, and then reacting the chlorinated dicarboxylic acid compound with the diamine:

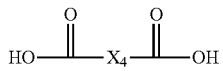

(36)

wherein $X_4$ is defined as above.

Suitable examples of $X_4$ in the dicarboxylic acid compound represented by the above-described general formula (36) may include the same examples as those mentioned above.

In addition, examples of the dicarboxylic acid compound represented by the above-described general formula (36) include, for example, malonic acid, dimethylmalonic acid, ethylmalonic acid, isopropylmalonic acid, di-n-butylmalonic acid, succinic acid, tetrafluorosuccinic acid, methylsuccinic acid, 2,2-dimethylsuccinic acid, 2,3-dimethylsuccinic acid, dimethylmethylsuccinic acid, glutaric acid, hexafluoroglutaric acid, 2-methylglutaric acid, 3-methylglutaric acid, 2,2-dimethylglutaric acid, 3,3-dimethylglutaric acid, 3-ethyl-3-methylglutaric acid, adipic acid, octafluoroadipic acid, 3-methyladipic acid, octafluoroadipic acid, pimelic acid, 2,2,6,6-tetramethylpimelic acid, suberic acid, dodecafluorosuberic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, heneicosanedioic acid, docosanedioic acid, tricosanedioic acid, tetracosanedioic acid, pentacosanedioic acid, hexacosanedioic acid, heptacosanedioic acid, octacosanedioic acid, nonacosanedioic acid, triacontanedioic acid, hentriacontanedioic acid, dotriacontanedioic acid, and diglycolic acid.

In addition, further examples of the dicarboxylic acid compound having an aromatic ring include, but are not limited to, for example, phthalic acid, isophthalic acid, terephthalic acid, 4,4'-diphenyl ether dicarboxylic acid, 3,4'-diphenyl ether dicarboxylic acid, 3,3'-diphenyl ether dicarboxylic acid, 4,4'-biphenyldicarboxylic acid, 3,4'-biphenyldicarboxylic acid, 3,3'-biphenyldicarboxylic acid, 4,4'-benzophenonedicarboxylic acid, 3,4'-benzophenonedicarboxylic acid, 3,3'-benzophenonedicarboxylic acid, 4,4'-hexafluoroisopropylidenedibenzoic acid, 4,4'-dicarboxydiphenylamide, 1,4-phenylenediethanoic acid, bis(4-carboxyphenyl)sulfide, 2,2-bis(4-carboxyphenyl)-1,1,1,3,3,3-hexafluoropropane, bis(4-carboxyphenyl)tetraphenyldisiloxane, bis(4-carboxyphenyl)tetramethyldisiloxane, bis(4-carboxyphenyl)sulfone, bis(4-carboxyphenyl)methane, 5-tert-butylisophthalic acid, 5-bromoisophthalic acid, 5-fluoroisophthalic acid, 5-chloroisophthalic acid, 2,2-bis-(p-carboxyphenyl)propane, and 2,6-naphthalenedicarboxylic acid. In addition, they may be used singly or mixed for use.

Suitable examples of s and Z in the above-described general formula (33) may include the same examples as those mentioned above.

Further, as mentioned above, the polymer according to the present invention can contain, in addition to the structural unit(s) represented by the above-described general formulas (1) and/or (2), the following structural unit (5):

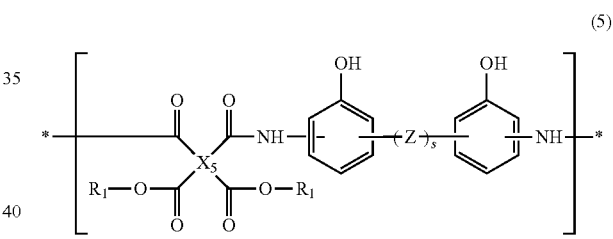

(5)

wherein $X_5$, $R_1$, s and Z are defined as above:

(6)

where $Y_1$, Rf, k and n are defined as above.

A polymer comprising the above-described structural unit (5) can be obtained by carrying out the same reaction procedure as that of the above-mentioned structural unit (2). That is, it can be obtained by reacting a tetracarboxylic acid diester compound represented by the following general formula (37) with the diamine represented by the above-described general formula (33) through reaction in the presence of a dehydration condensation agent, or, by converting the tetracarboxylic acid diester compound using a chlorinating agent into an acid chloride, and then reacting the chlorinated dicarboxylic acid compound with the diamine:

(37)

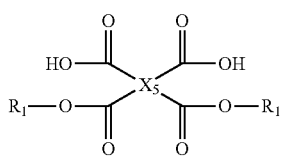

wherein $R_1$ and $X_5$ are defined as above.

Examples of a method of preparing a tetracarboxylic acid diester compound represented by the above-described general formula (37) include a process in which a tetracarboxylic dianhydride represented by the following general formula (38) reacts with a compound having a hydroxy group at the end thereof represented by the following general formula (39) in the presence of a basic catalyst such as pyridine, thereby introducing $R_1$ thereinto. Here, the tetracarboxylic dianhydride represented by the following general formula (38) is a material from which $X_5$ in the above-described general formula (5) (for example, the tetravalent organic groups represented by the above-described formula (15)) is derived, and the compound having a hydroxy group at the end thereof represented by the following general formula (39) is a material that can introduce the group represented by the above-described general formula (6):

(38)

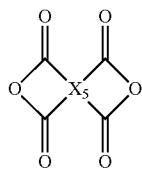

wherein $X_5$ is defined as above; and (39)

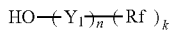

wherein $Y_1$, Rf, k and n are defined as above.

Suitable examples of the tetracarboxylic dianhydride represented by the above-described general formula (38) may include the examples recited for the tetracarboxylic dianhydride represented by the above-described general formula (22).

The reaction between the tetracarboxylic dianhydride represented by the above-described general formula (38) and the compound having a hydroxy group at the end thereof (HOR$_1$) represented by the above-described general formula (39), includes that the tetracarboxylic dianhydride represented by the above-described general formula (38) and the compound having a hydroxy group at the end thereof represented by the above-described general formula (39) are stirred, dissolved and mixed in a reaction solvent in the presence of a basic catalyst such as pyridine at a reaction temperature of 20 to 50° C. for 4 to 10 hours, thereby advancing half esterification reaction of the acid dianhydride, and a desired tetracarboxylic acid diester compound represented by the above-described general formula (37) can be obtained as a solution in a state where the compound is dissolved in the reaction solvent.

The obtained tetracarboxylic acid diester compound may be isolated, or the obtained solution thereof may be used as is in reaction with a diamine of the subsequent step, which will be mentioned later.

For the above-described reaction solvent, preferable are those in which the above-described tetracarboxylic acid diester compound, as well as a polymer having a structural unit of polyimide precursor obtained through polycondensation reaction between the tetracarboxylic acid diester compound and a diamine, which is carried out subsequently to the above reaction, can be dissolved well, and examples thereof include, for example, N-methyl-2-pyrrolidone, N,N-dimethylacetamide, N,N-dimethylformamide, dimethylsulfoxide, tetramethylurea, and γ-butyrolactone. In addition, ketones, esters, lactones, ethers, halogenated hydrocarbons, hydrocarbons and the like can also be used, and specific examples thereof include acetone, methyl ethyl ketone, methyl isobutyl ketone, cyclohexanone, methyl acetate, ethyl acetate, butyl acetate, diethyl oxalate, ethylene glycol dimethyl ether, diethylene glycol dimethyl ether, tetrahydrofuran, dichloromethane, 1,2-dichloroethane, 1,4-dichlorobutane, chlorobenzene, o-dichlorobenzene, hexane, heptane, benzene, toluene and xylene. As necessary, they may be used singly, or two or more of them may be mixed for use.

Suitable examples of the group $R_1$ represented by general formula (6) in the above-described general formula (39) are the same as those mentioned above.

Further, as mentioned above, the polymer according to the present invention can contain, in addition to the structural unit(s) represented by the above-described general formulas (1) and/or (2), the following structural unit (7):

(7)

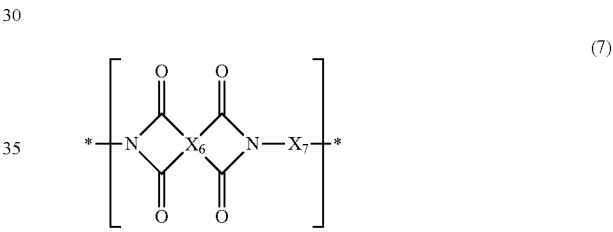

wherein $X_6$ and $X_7$ are defined as above:

(8)

wherein $R_2$ to $R_5$, $m_1$, $m_2$ and $m_3$ are defined as above.

A polymer containing the above-described structural unit (7) can be obtained by carrying out the same reaction procedure as that of the above-mentioned structural unit (1). That is, an amic acid is synthesized by reacting a tetracarboxylic dianhydride represented by the following general formula (40) with a diamine represented by the following general formula (41), and then, an imide ring is formed through a thermal dehydration step, thereby obtaining a polymer containing the above-described structural unit (7):

(40)

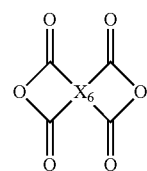

wherein $X_6$ is defined as above; and

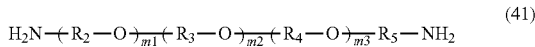 (41)

wherein $R_2$ to $R_5$, $m_1$, $m_2$ and $m_3$ are defined as above.

Suitable examples of the tetracarboxylic dianhydride represented by the above-described general formula (40) may include the examples recited for the tetracarboxylic dianhydride represented by the above-described general formula (22).

The diamine represented by the above-described general formula (41) include, but are not limited to, for example, 1,2-bis(aminoethoxy)ethane, HK-511, ED-600, ED-900, ED-2003, EDR-148, EDR-176, D-230, D-400, D-2000, THF-100, THF-140, THF-170, RE-600, RE-900, RE-2000, RP-405, RP-409, RP-2005, RP-2009, RT-1000, HE-1000 and HT-1700 (trade names, manufactured by Huntsman Corporation). In addition, they may be used singly or mixed for use.

Furthermore, as mentioned above, the polymer according to the present invention can contain, in addition to the structural unit(s) represented by the above-described general formulas (1) and/or (2), the following structural units (20) and (21):

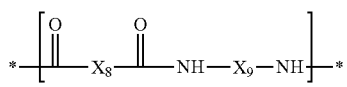 (20)

wherein $X_8$ and $X_9$ are defined as above; and

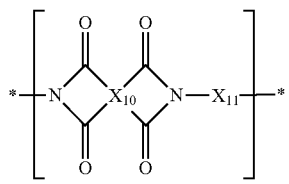 (21)

wherein $X_{10}$ and $X_{11}$ are defined as above.

A polymer comprising the above-described structural unit (20) can be obtained by carrying out the same reaction procedure as that of the above-mentioned structural unit (2). That is, it can be obtained by reacting a dicarboxylic acid compound represented by the following general formula (42) with a diamine represented by the following general formula (43) through reaction in the presence of a dehydration condensation agent, or, by converting the dicarboxylic acid compound using a chlorinating agent into an acid chloride, and then reacting the chlorinated dicarboxylic acid compound with the diamine:

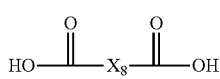 (42)

wherein $X_4$ is defined as above; and

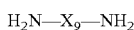 (43)

wherein $X_9$ is defined as above.

Suitable examples of the dicarboxylic acid compound represented by the above-described general formula (42) may include those recited for the dicarboxylic acid compound represented by the above-described general formula (36).

Suitable examples of the diamine represented by the above-described general formula (43) may include the those recited for the diamine represented by the above-described general formula (28).

And, a polymer containing the above-described structural unit (21) can be obtained by carrying out the same reaction procedure as that of the above-mentioned structural unit (1). That is, an amic acid is synthesized by reacting a tetracarboxylic dianhydride represented by the following general formula (44) with a diamine represented by the following general formula (45), and then, an imide ring is formed through a thermal dehydration step, thereby obtaining a polymer containing the above-described structural unit (21):

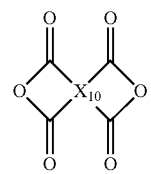 (44)

wherein $X_{10}$ is defined as above; and

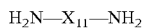 (45)

wherein $X_{11}$ is defined as above.

Suitable examples of the tetracarboxylic dianhydride represented by the above-described general formula (44) may include those recited for the tetracarboxylic dianhydride represented by the above-described general formula (22).

Suitable examples of the diamine represented by the above-described general formula (45) may include those recited for the diamine represented by the above-described general formula (28).

Molecular Weight of Polymer and Introduction of End-Capping AGENT

A suitable weight average molecular weight of the above-mentioned alkaline soluble resin composition is preferably 5,000 to 100,000 and more preferably 7,000 to 30,000. If the molecular weight is 5,000 or more, it becomes easy to make a film of a photosensitive resin composition using the above-described alkaline soluble resin as a base resin with a desired film thickness on a substrate, and if the molecular weight is 100,000 or less, the viscosity of such a photosensitive resin composition is not remarkably high, and thus, there is no fear of not being able to form a film.

Note that the weight average molecular weight herein is a value measured by gel permeation chromatography (GPC) in terms of polystyrene.

The above-mentioned alkaline soluble resin may be capped at both ends with an end-capping agent for the purposes of controlling the molecular weight in the polycondensation reaction and preventing temporal change in the molecular weight of the obtained polymer, that is, gelation. Examples of an end-capping agent that reacts with an acid dianhydride include monoamines and monohydric alcohols. In addition, examples of an end-capping agent that reacts with a diamine compound include acid anhydrides, monocarboxylic acids, monoacid chloride compounds, monoactive ester compounds, dicarbonate esters and vinyl ethers. In addition, by reacting with an end-capping agent, a variety of organic groups can be introduced as an end group.

Examples of the monoamine to be used as the capping agent for the acid anhydride group terminal include, but are not limited to, aniline, 5-amino-8-hydroxyquinoline, 4-amino-8-hydroxyquinoline, 1-hydroxy-8-aminonaphthalene, 1-hydroxy-7-aminonaphthalene, 1-hydroxy-6-aminonaphthalene, 1-hydroxy-5-aminonaphthalene, 1-hydroxy-4-aminonaphthalene, 1-hydroxy-3-aminonaphthalene, 1-hydroxy-2-aminonaphthalene, 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, 1-amino-2-hydroxynaphthalene, 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxynaphthalene, 2-carboxy-7-aminonaphthalene, 2-carboxy-6-aminonaphthalene, 2-carboxy-5-aminonaphthalene, 2-carboxy-4-aminonaphthalene, 2-carboxy-3-aminonaphthalene, 1-amino-2-carboxynaphthalene, 2-aminonicotinic acid, 4-aminonicotinic acid, 5-aminonicotinic acid, 6-aminonicotinic acid, 4-aminosalicylic acid, 5-aminosalicylic acid, 6-aminosalicylic acid, ammelide, 2-aminobenzoic acid, 3-aminobenzoic acid, 4-aminobenzoic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 5-amino-8-mercaptoquinoline, 4-amino-8-mercaptoquinoline, 1-mercapto-8-aminonaphthalene, 1-mercapto-7-aminonaphthalene, 1-mercapto-6-aminonaphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5-aminonaphthalene, 2-mercapto-4-aminonaphthalene, 2-mercapto-3-aminonaphthalene, 1-amino-2-mercaptonaphthalene, 3-amino-4,6-dimercaptopyrimidine, 2-aminothiophenol, 3-aminothiophenol, 4-aminothiophenol, 2-ethynylaniline, 3-ethynylaniline, 4-ethynylaniline, 2,4-diethynylaniline, 2,5-diethynylaniline, 2,6-diethynylaniline, 3,4-diethynylaniline, 3,5-diethynylaniline, 1-ethynyl-2-aminonaphthalene, 1-ethynyl-3-aminonaphthalene, 1-ethynyl-4-aminonaphthalene, 1-ethynyl-5-aminonaphthalene, 1-ethynyl-6-aminonaphthalene, 1-ethynyl-7-aminonaphthalene, 1-ethynyl-8-aminonaphthalene, 2-ethynyl-1-aminonaphthalene, 2-ethynyl-3-aminonaphthalene, 2-ethynyl-4-aminonaphthalene, 2-ethynyl-5-aminonaphthalene, 2-ethynyl-6-aminonaphthalene, 2-ethynyl-7-aminonaphthalene, 2-ethynyl-8-aminonaphthalene, 3,5-diethynyl-1-aminonaphthalene, 3,5-diethynyl-2-aminonaphthalene, 3,6-diethynyl-1-aminonaphthalene, 3,6-diethynyl-2-aminonaphthalene, 3,7-diethynyl-1-aminonaphthalene, 3,7-diethynyl-2-aminonaphthalene, 4,8-diethynyl-1-aminonaphthalene, and 4,8-diethynyl-2-aminonaphthalene. One of these monoamines may be used singly, or two or more of them may be used in combination.

On the other hand, examples of the monohydric alcohol to be used as the capping agent for the acid anhydride group terminal include, but are not limited to, methanol, ethanol, 1-propanol, 2-propanol, 1-butanol, 2-butanol, 1-pentanol, 2-pentanol, 3-pentanol, 1-hexanol, 2-hexanol, 3-hexanol, 1-heptanol, 2-heptanol, 3-heptanol, 1-octanol, 2-octanol, 3-octanol, 1-nonanol, 2-nonanol, 1-decanol, 2-decanol, 1-undecanol, 2-undecanol, 1-dodecanol, 2-dodecanol, 1-tridecanol, 2-tridecanol, 1-tetradecanol, 2-tetradecanol, 1-pentadecanol, 2-pentadecanol, 1-hexadecanol, 2-hexadecanol, 1-heptadecanol, 2-heptadecanol, 1-octadecanol, 2-octadecanol, 1-nonadecanol, 2-nonadecanol, 1-icosanol, 2-methyl-1-propanol, 2-methyl-2-propanol, 2-methyl-1-butanol, 3-methyl-1-butanol, 2-methyl-2-butanol, 3-methyl-2-butanol, 2-propyl-1-pentanol, 2-ethyl-1-hexanol, 4-methyl-3-heptanol, 6-methyl-2-heptanol, 2,4,4-trimethyl-1-hexanol, 2,6-dimethyl-4-heptanol, isononyl alcohol, 3,7-dimethyl-3-octanol, 2,4-dimethyl-1-heptanol, 2-heptylundecanol, ethylene glycol monoethyl ether, ethylene glycol monomethyl ether, ethylene glycol monobutyl ether, propylene glycol 1-methyl ether, diethylene glycol monoethyl ether, diethylene glycol monomethyl ether, diethylene glycol monobutyl ether, cyclopentanol, cyclohexanol, cyclopentanemonomethylol, dicyclopentanemonomethylol, tricyclodecanemonomethylol, norborneol, and terpineol. Any one of these monohydric alcohols may be used singly, or two or more of them may be used in combination.

Examples of the acid anhydride, monocarboxylic acid, monoacid chloride compound and mono-active ester compound to be used as the capping agent for the amino group terminal include acid anhydrides such as phthalic anhydride, maleic anhydride, nadic anhydride, cyclohexanedicarboxylic anhydride and 3-hydroxyphthalic anhydride; monocarboxylic acids such as 2-carboxyphenol, 3-carboxyphenol, 4-carboxyphenol, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxynaphthalene, 1-mercapto-4-carboxynaphthalene, 1-mercapto-3-carboxynaphthalene, 1-mercapto-2-carboxynaphthalene, 2-carboxybenzenesulfonic acid, 3-carboxybenzenesulfonic acid, 4-carboxybenzenesulfonic acid, 2-ethynylbenzoic acid, 3-ethynylbenzoic acid, 4-ethynylbenzoic acid, 2,4-diethynylbenzoic acid, 2,5-diethynylbenzoic acid, 2,6-diethynylbenzoic acid, 3,4-diethynylbenzoic acid, 3,5-diethynylbenzoic acid, 2-ethynyl-1-naphthoic acid, 3-ethynyl-1-naphthoic acid, 4-ethynyl-1-naphthoic acid, 5-ethynyl-1-naphthoic acid, 6-ethynyl-1-naphthoic acid, 7-ethynyl-1-naphthoic acid, 8-ethynyl-1-naphthoic acid, 2-ethynyl-2-naphthoic acid, 3-ethynyl-2-naphthoic acid, 4-ethynyl-2-naphthoic acid, 5-ethynyl-2-naphthoic acid, 6-ethynyl-2-naphthoic acid, 7-ethynyl-2-naphthoic acid and 8-ethynyl-2-naphthoic acid, and monoacid chloride compounds in which the carboxyl group of the above monocarboxylic acids is acid-chlorinated; monoacid chloride compounds of dicarboxylic acids such as terephthalic acid, phthalic acid, maleic acid, cyclohexanedicarboxylic acid, 3-hydroxyphthalic acid, 5-norbornene-2,3-dicarboxylic acid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7-dicarboxynaphthalene, 1,8-dicarboxynaphthalene, 2,3-dicarboxynaphthalene, 2,6-dicarboxynaphthalene and 2,7-dicarboxynaphthalene, in which only a monocarboxyl group is acid-chlorinated; and active ester compounds obtained through reaction between monoacid chloride compounds and N-hydroxybenzotriazole or N-hydroxy-5-norbornene-2,3-dicarboxyimide.

Examples of the dicarbonate ester compound to be used as the capping agent for the amino group terminal include di-tert-butyl dicarbonate, dibenzyl dicarbonate, dimethyl dicarbonate and diethyl dicarbonate.

Examples of the vinyl ether compound to be used as the capping agent for the amino group terminal include butyl vinyl ether, cyclohexyl vinyl ether, ethyl vinyl ether, 2-ethylhexyl vinyl ether, isobutyl vinyl ether, isopropyl vinyl ether, n-propyl vinyl ether, tert-butyl vinyl ether and benzyl vinyl ether.

Examples of another compound to be used as the capping agent for the amino group terminal include benzoyl chloride; chloroformate esters such as fluorenylmethyl chloroformate, 2,2,2-trichloroethyl chloroformate, tert-butyl chloroformate, n-butyl chloroformate, isobutyl chloroformate, benzyl chloroformate, allyl chloroformate, ethyl chloroformate and isopropyl chloroformate; isocyanate compounds such as butyl isocyanate, 1-naphthyl isocyanate, octadecyl isocyanate and phenyl isocyanate; methanesulfonic acid chloride; and p-toluenesulfonic acid chloride.

The proportion of the capping agent to be introduced for the acid anhydride group terminal is preferably in the range of 0.1 to 60 mol %, particularly preferably 5 to 50 mol %, and further preferably 5 to 20 mol % relative to the tetracarboxylic dianhydride component corresponding to the above-described general formula (22), which is a raw material of the polymer according to the present invention. And, the proportion of the capping agent to be introduced for the amino group terminal is preferably in the range of 0.1 to 100 mol % and particularly preferably 5 to 90 mol % relative to the diamine component. Moreover, by reacting with a plurality of end-capping agents, a plurality of different end groups may be introduced.

Photosensitive Resin Composition

Next, a photosensitive resin composition using the polymer according to the present invention as a base resin will be described. In the present invention, by using the above-mentioned polymer according to the present invention as a base resin, a positive photosensitive resin composition and a negative photosensitive resin composition can be obtained.

Positive Photosensitive Resin Composition

At first, among photosensitive resin compositions using the polymer according to the present invention as a base resin, a positive photosensitive resin composition capable of alkaline development will be described. The positive photosensitive resin composition according to the present invention can be taken, for example, two embodiments as described below, but is not limited to them.

The first embodiment of the positive photosensitive resin composition according to the present invention comprises:

(A) a polymer comprising structural unit (1) and/or structural unit (2), or a polymer further comprising, in addition to structural unit (1) and/or structural unit (2), any one or more structural units (3) to (5) and (7);

(B) a photosensitizer that generates an acid by light to increase the dissolution rate in an aqueous alkaline solution, and that is a compound having a quinonediazide structure; and (D) a solvent.

The polymer of component (A) comprising structural unit (1) and/or structural unit (2) in the positive photosensitive resin composition according to the present invention contains, as mentioned above, an amino group with a high acidity sandwiched between electron-withdrawing groups such as a carbonyl group or a sulfonyl group represented by $T_1$ and $T_2$. Due to this, a desired alkaline dissolution rate in an aqueous alkaline developing solution can be obtained, and there is no fear of occurrence of failure in the pattern opening upon patterning, scum being observed at the bottom of the pattern, and reduced resolution.

Component (B) in the positive photosensitive resin composition according to the present invention is a photosensitizer that generates an acid by light to increase the dissolution rate in an aqueous alkaline solution, and that is a compound having a quinonediazide structure. Examples of component (B) may include compounds having a 1,2-naphthoquinonediazidosulfonyl group in the molecular structure.

Examples of the compound having a 1,2-naphthoquinonediazidosulfonyl group in the molecular structure include a compound having a 1,2-naphthoquinonediazidosulfonyl group in the molecule represented by the following general formula (46) or (47).

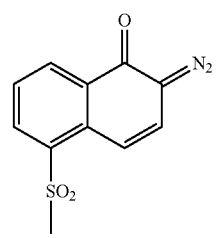

(46)

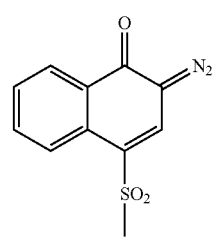

(47)

As a compound to which the above-described 1,2-naphthoquinonediazidosulfonyl group is introduced, specifically, trihydroxybenzophenone or tetrahydroxybenzophenone, a ballast molecule having phenolic hydroxy groups represented by the following general formula (48), or a novolac resin having a repeating unit represented by the formula (53) described later with a weight average molecular weight in the range of 2,000 to 20,000, preferably 3,000 to 10,000 is suitably used. That is, those formed by replacing the hydrogen atom of phenolic hydroxy group of the resin or compound having phenolic hydroxy groups, which will be mentioned below, with the above-described 1,2-naphthoquinonediazidosulfonyl groups are suitably used as component (B).

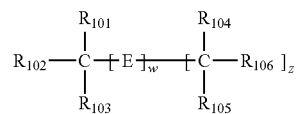

(48)

Here, $R^{101}$ to $R^{106}$ are each independently a hydrogen atom, a methyl group, a group represented by the following formula (49), or a group represented by the following formula (50). w is an integer of 0 to 2, z is an integer of 0 to 2, and when z is 0, w is 1 or 2. When z is 0 and w is 1, E is a hydrogen atom, a methyl group or a group represented by the following formula (49); when z is 0 and w is 2, one E is a methylene group or a group represented by the following formula (51) and the other E is a hydrogen atom, a methyl group or a group represented by the following formula (49); and when z is 1, E is a methylene group or a group represented by the following formula (51). In the case of z being 2, when w is 1, E is a methine group or a group represented by the following formula (52), and when w is 2, one of the Es is a methylene group or a group represented by the following formula (51) and the other E is a methine group or a group represented by the following formula (52);

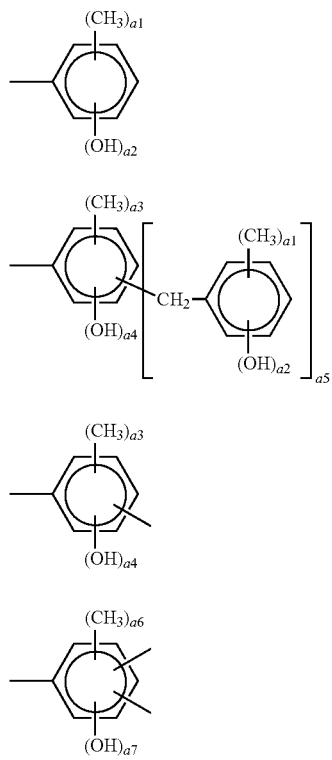

wherein a1, a2, a3, a4, a5, a6 and a7 are each an integer of 0 to 3 provided that a1+a2≤5, a3+a4≤4, and a6+a7≤3.

In this case, in a low nuclide (ballast molecule) of the above-described formula (48), it is suitable that the number of benzene rings be 2 to 20, more preferably 2 to 10, and further preferably 3 to 6, and that the ratio between the number of phenolic hydroxy groups and the number of benzene rings be 0.5 to 2.5, more preferably 0.7 to 2.0, and further preferably 0.8 to 1.5.

Specific examples of such a low nuclide (ballast molecule) include the following (B-1) to (B-44).

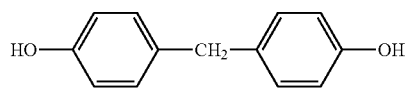

(B-1)

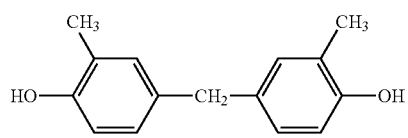

(B-2)

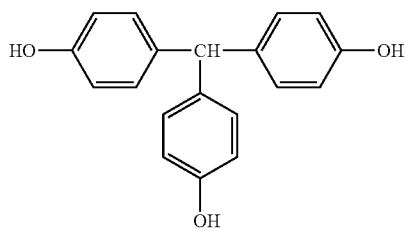

(B-3)

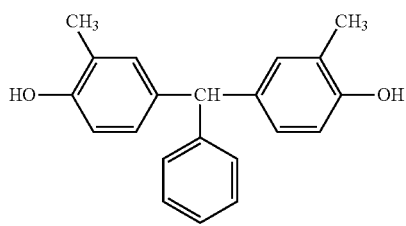

(B-4)

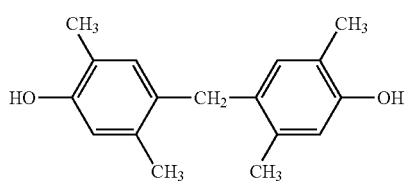

(B-5)

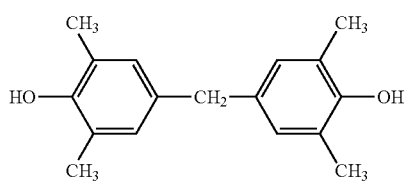

(B-6)

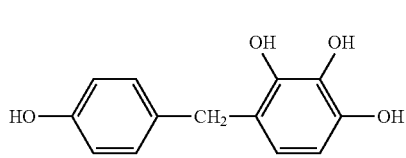

(B-7)

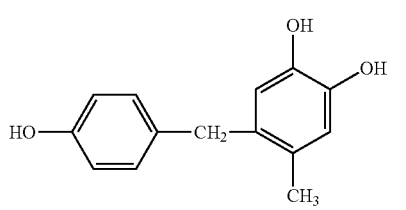

(B-8)

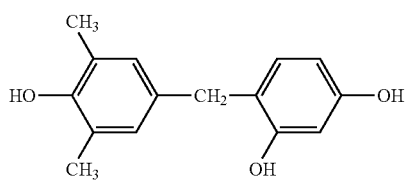

(B-9)

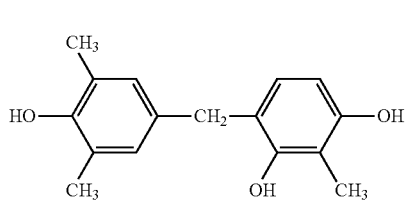

(B-10)

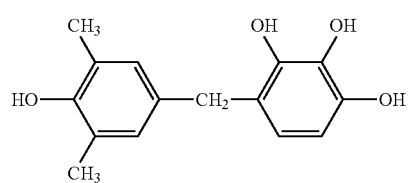
(B-11)
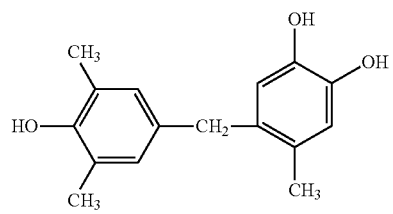
(B-12)
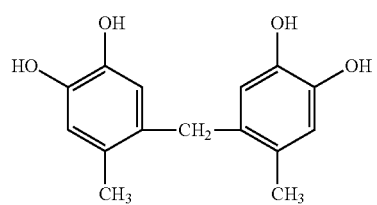
(B-13)
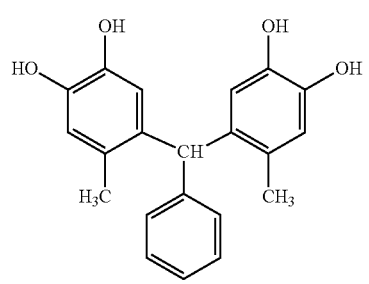
(B-14)
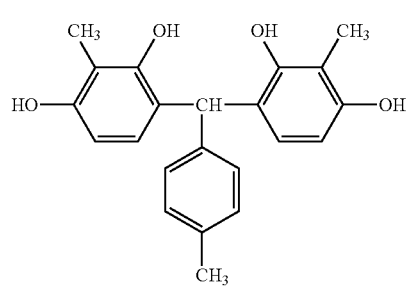
(B-15)
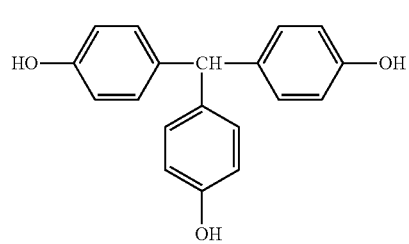
(B-16)
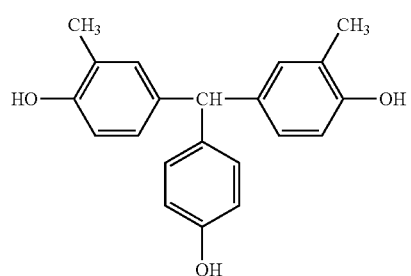
(B-17)
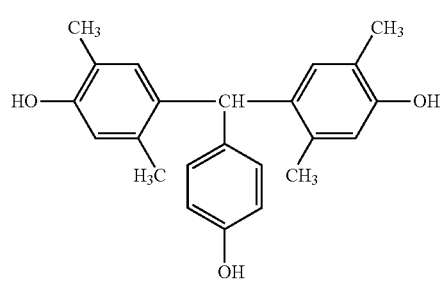
(B-18)
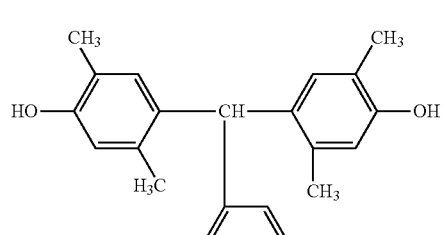
(B-19)
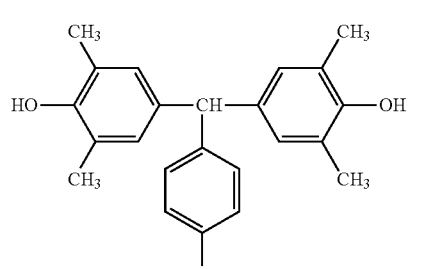
(B-20)
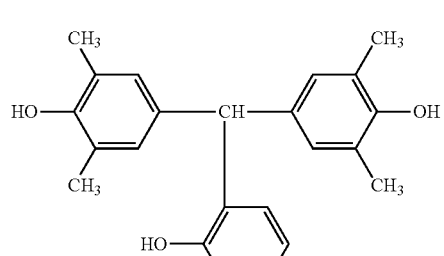
(B-21)
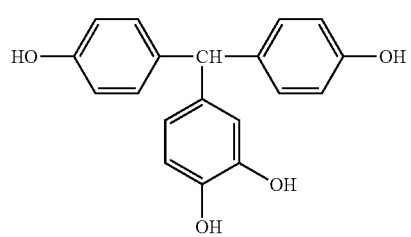
(B-22)

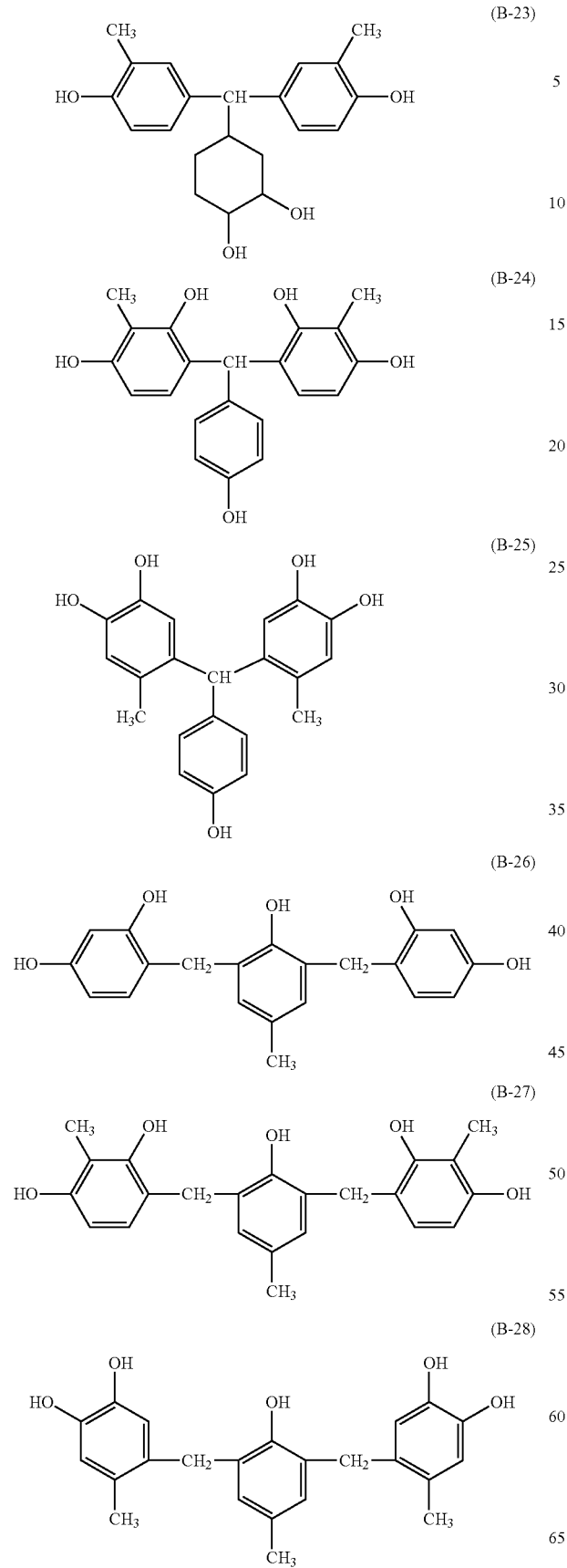
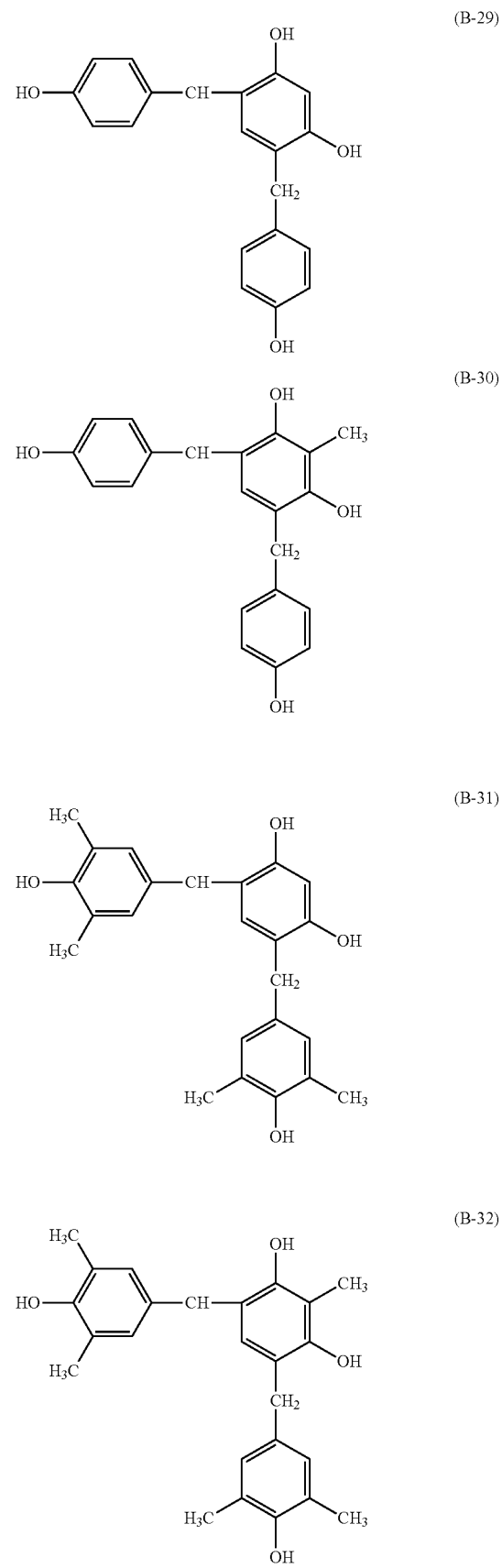

(B-33)
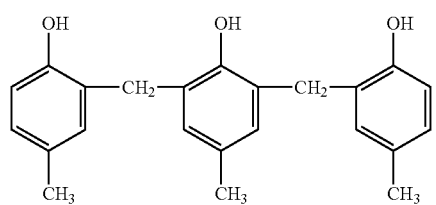
(B-34)
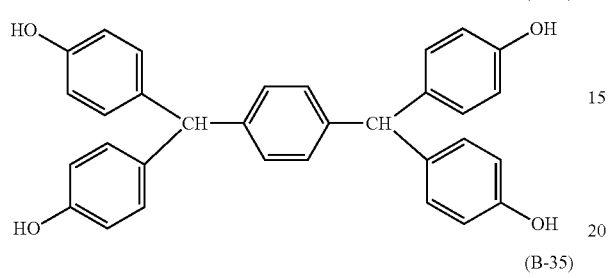
(B-35)
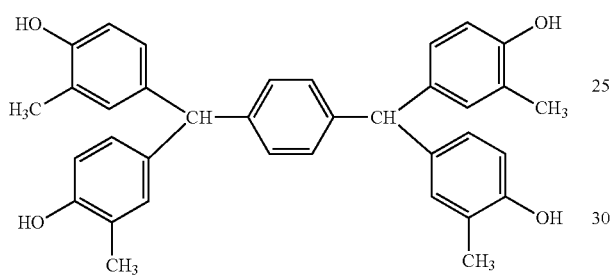
(B-36)
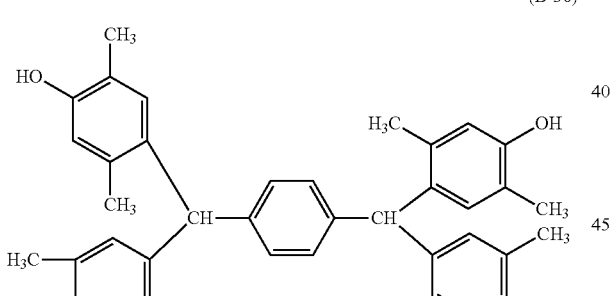
(B-37)
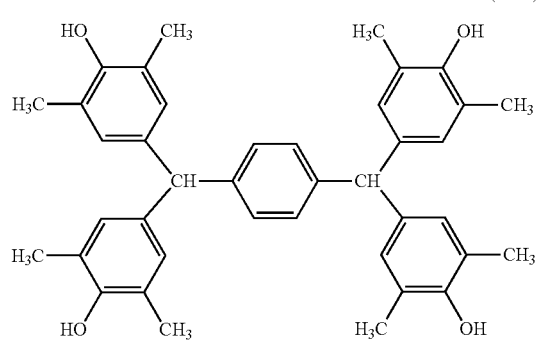
(B-38)
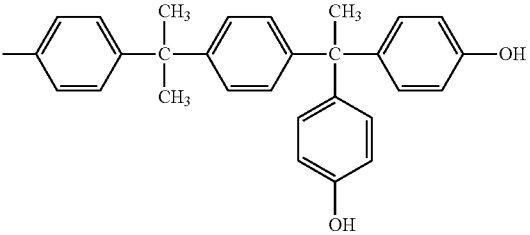
(B-39)
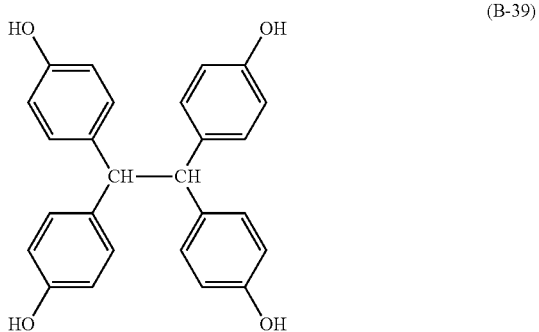
(B-40)
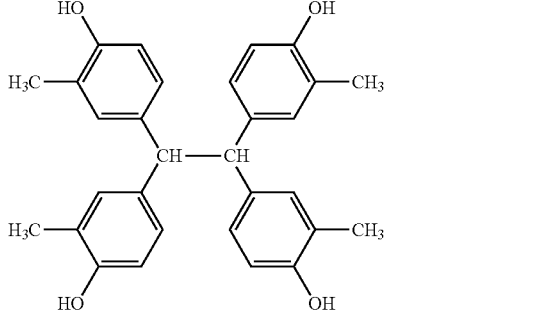
(B-41)
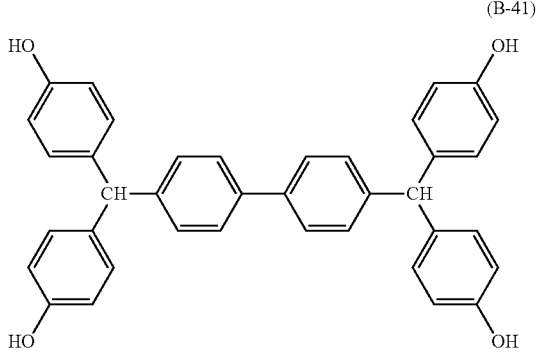
(B-42)
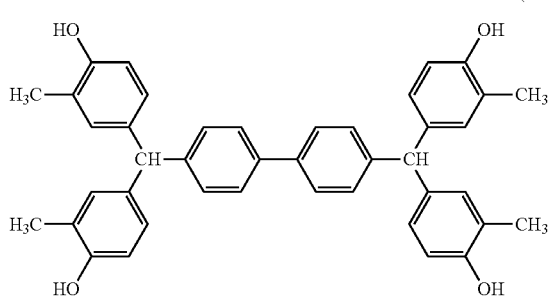

-continued

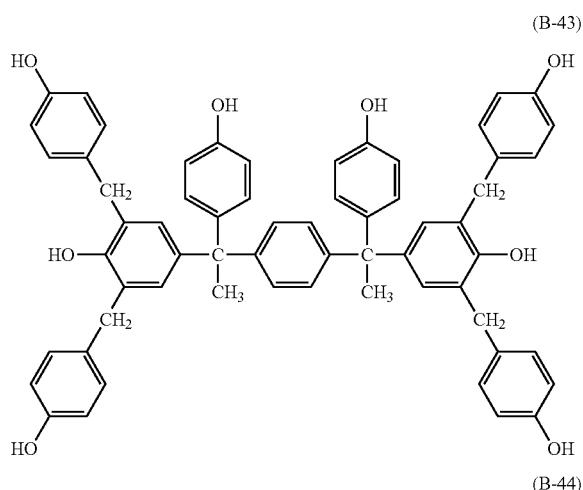

(B-43)

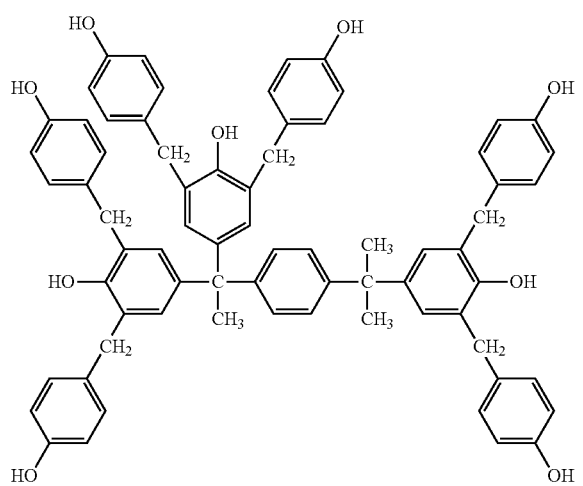

(B-44)

Among the exemplified low nuclides (ballast molecules) described above, (B-3), (B-29), (B-33), (B-38) and the like are suitably used, and the compounds formed by replacing the hydrogen atom of the phenolic hydroxy group of these ballast molecules with a 1,2-naphthoquinonediazidosulfonyl group are suitably used as component (B) of the positive photosensitive resin composition according to the present invention.

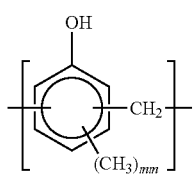

(53)

wherein mm is an integer of 0 to 3.

A novolak resin having a repeating unit represented by the above-described formula (53) can be synthesized by condensing phenols represented by the following formula (54), specifically, at least one phenol such as o-cresol, m-cresol, p-cresol and 3,5-xylenol with aldehydes through a conventional method:

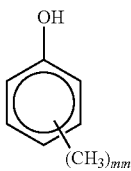

(54)

wherein mm is an integer of 0 to 3.

In this case, examples of the aldehyde include formaldehyde, paraformaldehyde, acetaldehyde and benzaldehyde, and formaldehyde is more suitable.

Note that the proportion between phenols represented by the above-described formula (54) and aldehydes is preferably 0.2 to 2, particularly 0.3 to 2 in the molar ratio.

As a method of introducing a 1,2-naphthoquinonediazidosulfonyl group to the above-described compound to which the 1,2-naphthoquinonediazidosulfonyl group is introduced, it is preferable to use dehydrochlorination condensation reaction, with a basic catalyst, between 1,2-naphthoquinonediazidosulfonyl chloride and the phenolic hydroxy group. In the case of the ballast molecule represented by the above-described formula (48), trihydroxybenzophenone or tetrahydroxybenzophenone, the proportion of replacing the hydrogen atom of the phenolic hydroxy group with a 1,2-naphthoquinonediazidosulfonyl group is 10 to 100 mol % and preferably 50 to 100 mol %, and in the case of the novolak resin having a repeating unit represented by the above-described formula (53), it is preferable that the proportion of replacing the hydrogen atom of the phenolic hydroxy group with a 1,2-naphthoquinonediazidosulfonyl group be 2 to 50 mol % and preferably 3 to 27 mol %.

It is preferable that the amount of component (B) to be added be 1 to 50 parts by mass, and more preferably 10 to 40 parts by mass relative to 100 parts by mass of component (A). And, any one kind of component (B) or a combination of two or more kinds thereof may be used.

By containing such component (B), before exposure, the solubility in an aqueous alkaline solution is prevented due to the dissolution inhibitory property of component (B) and the system is thus alkaline insoluble, and on the other hand, upon exposure, the photosensitizer of component (B) generates an acid by light to increase the dissolution rate in an aqueous alkaline solution, thereby making the system alkaline soluble.

That is, when an aqueous alkaline solution is used as the developing solution, the unexposed part is not dissolved in the developing solution and the exposed part is soluble in the developing solution, and therefore, a positive pattern can be formed.

Next, component (D) in the positive photosensitive resin composition according to the first embodiment is a solvent. The component (D) as a solvent is not specified as long as it can dissolve component (A) and component (B). Examples of the solvent include, for example, ketones such as cyclohexanone, cyclopentanone and methyl 2-n-amyl ketone; alcohols such as 3-methoxybutanol, 3-methyl-3-methoxybutanol, 1-methoxy-2-propanol and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate and γ-butyrolactone, and one or more of these solvents can be used. In particular, preferable is ethyl lactate, cyclohexanone, cyclopentanone, propylene glycol monomethyl ether acetate, γ-butyrolactone, or a mixed solvent thereof.

The amount of component (D) to be contained is preferably 50 to 2,000 parts by mass and particularly preferably 100 to 1,000 parts by mass relative to 100 parts by mass of the total amount of component (A) and component (B) to be contained.

Next, the second embodiment of the positive photosensitive resin composition according to the present invention will be described. The second embodiment of the positive photosensitive resin composition according to the present invention further comprises, in addition to the above-described components (A), (B) and (D), (C) one or two or more crosslinking agents selected from an amino condensate modified with formaldehyde or formaldehyde-alcohol, a phenol compound having two or more methylol groups or alkoxymethylol groups on average in one molecule, a compound in which a hydrogen atom of a hydroxy group of a polyvalent phenol is replaced with a glycidyl group, a compound in which a hydrogen atom of a hydroxy group of a polyvalent phenol is replaced with a substituent represented by the following formula (C-1), and a compound containing two or more nitrogen atoms each having a glycidyl group represented by the following formula (C-2):

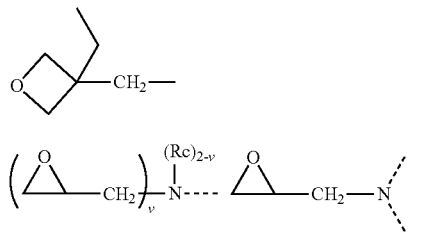

wherein the dotted line represents a bond; Rc represents a linear, branched or cyclic alkyl group having 1 to 6 carbon atoms; and v is 1 or 2.

For component (A) and component (B) of the second embodiment of the positive photosensitive resin composition according to the present invention, those that are the same as the above-mentioned first embodiment of the positive photosensitive resin composition can be suitably used.

Component (C) in the second embodiment of the positive photosensitive resin composition according to the present invention is one or two or more crosslinking agents selected from an amino condensate modified with formaldehyde or formaldehyde-alcohol, a phenol compound having two or more methylol groups or alkoxymethylol groups (alkoxymethyl groups) on average in one molecule, a compound in which a hydrogen atom of a hydroxy group of a polyvalent phenol is replaced with a glycidyl group, a compound in which a hydrogen atom of a hydroxy group of a polyvalent phenol is replaced with a group represented by the following formula (C-1), and a compound containing two or more nitrogen atoms each having a glycidyl group represented by the following formula (C-2):

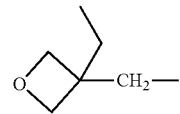

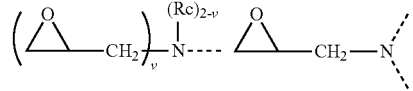

wherein the dotted line represents a bond; Rc represents a linear, branched or cyclic alkyl group having 1 to 6 carbon atoms; and v is 1 or 2.

Examples of the amino condensate modified with formaldehyde or formaldehyde-alcohol include a melamine condensate modified with formaldehyde or formaldehyde-alcohol, or a urea condensate modified with formaldehyde or formaldehyde-alcohol.

In preparation of the above-described melamine condensate modified with formaldehyde or formaldehyde-alcohol, for example, at first, a melamine monomer is modified with formalin for methylolation by a known method, which may be further modified with an alcohol for alkoxylation, thereby obtaining a modified melamine represented by the following general formula (55). Note that the above-described alcohol is preferably a lower alcohol, for example, an alcohol having 1 to 4 carbon atoms.

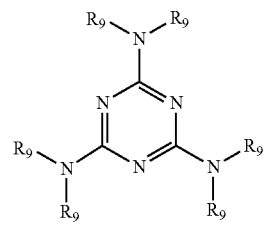

wherein $R_9$ may be the same or different, and represents a methylol group, an alkoxymethyl group including an alkoxy group having 1 to 4 carbon atoms, or a hydrogen atom, but at least one of them is a methylol group or the above-described alkoxymethyl group.

Examples of the above-described $R_9$ include a methylol group, an alkoxymethyl group such as a methoxymethyl group and an ethoxymethyl group, and a hydrogen atom.

Specific examples of the modified melamine represented by the above-described general formula (55) include trimethoxymethylmonomethylolmelamine, dimethoxymethylmonomethylolmelamine, trimethylolmelamine, hexamethylolmelamine and hexamethoxymethylolmelamine. Then, the modified melamine represented by the above-described general formula (55) or a multimer thereof (for example, oligomer such as dimer and trimer) is subjected to addition condensation polymerization with formaldehyde by a conventional method until a desired molecular weight is achieved, thereby obtaining a melamine condensate modified with formaldehyde or formaldehyde-alcohol.

In preparation of the above-described urea condensate modified with formaldehyde or formaldehyde-alcohol, for example, a urea condensate with a desired molecular weight is modified with formaldehyde for methylolation by a known method, which may be further modified with an alcohol for alkoxylation.

Specific examples of the above-described urea condensate modified with formaldehyde or formaldehyde-alcohol include a methoxymethylated urea condensate, an ethoxymethylated urea condensate and a propoxymethylated urea condensate.

Note that one of these modified melamine condensate and modified urea condensate may be used singly, or two or more of them may be used in combination.

Next, examples of the phenol compound having two or more methylol groups or alkoxymethylol groups on average in one molecule include (2-hydroxy-5-methyl)-1,3-benzenedimethanol, 2,2',6,6'-tetramethoxymethyl bisphenol A, and compounds represented by the following formulas (C-3) to (C-7):

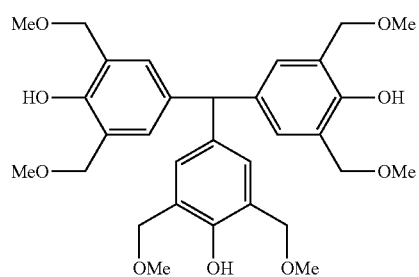

C-3

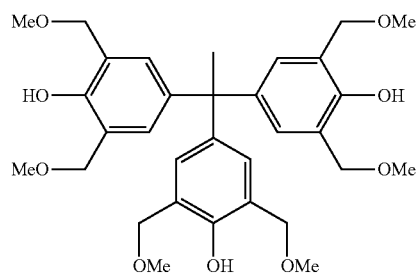

C-4

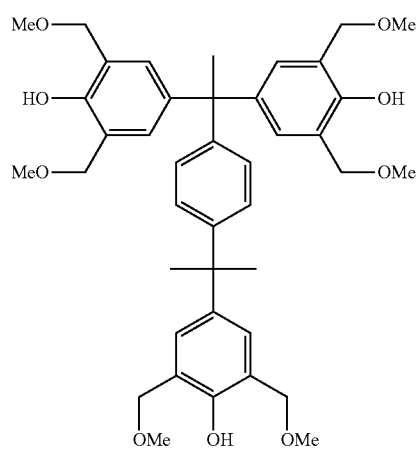

C-5

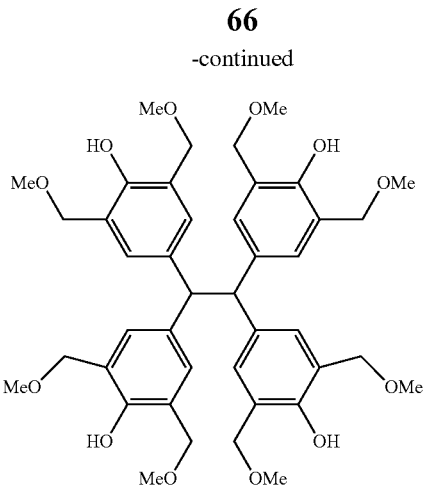

C-6

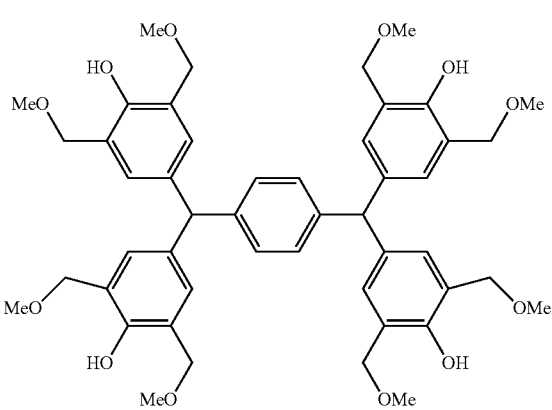

C-7

Note that one of the above-described crosslinking agents may be used singly, or two or more of them may be used in combination.

And, examples of the compound in which a hydrogen atom of a hydroxy group of a polyvalent phenol is replaced with a glycidyl group may include compounds obtained by allowing hydroxy groups of bisphenol A, tris(4-hydroxyphenyl)methane and 1,1,1-tris(4-hydroxyphenyl)ethane to react with epichlorohydrin in the presence of a base. Suitable examples of the compound in which a hydrogen atom of a hydroxy group of a polyvalent phenol is replaced with a glycidyl group may include compounds represented by the following formulas (C-8) to (C-14):

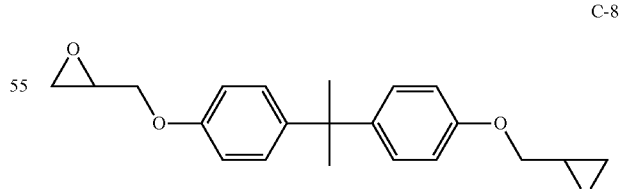

C-8

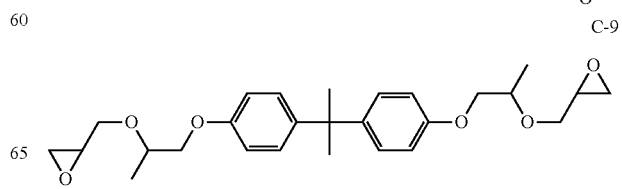

C-9

C-10

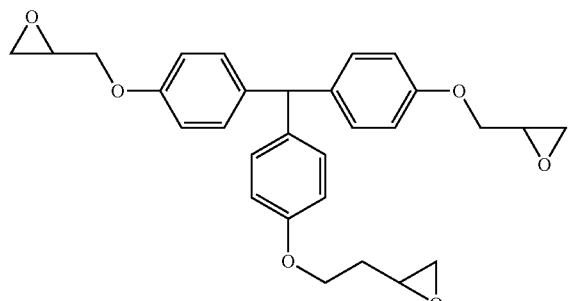

C-11

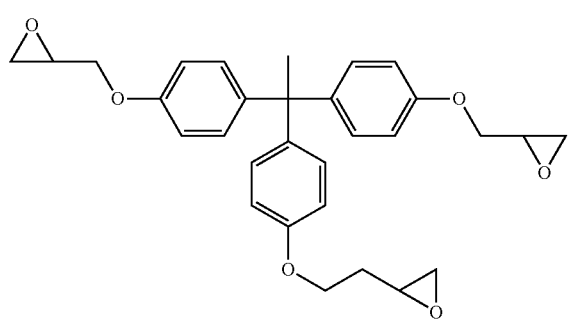

C-12

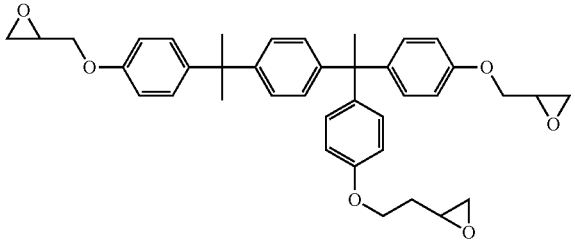

C-13

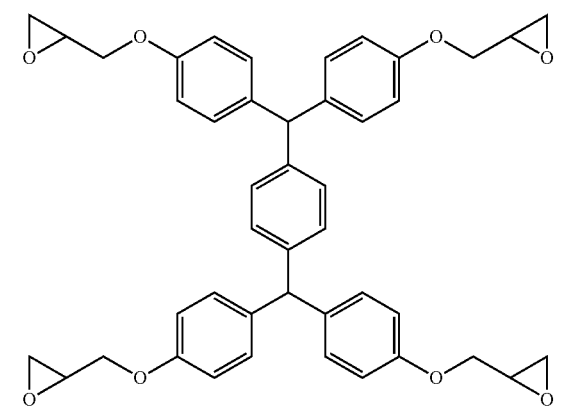

C-14

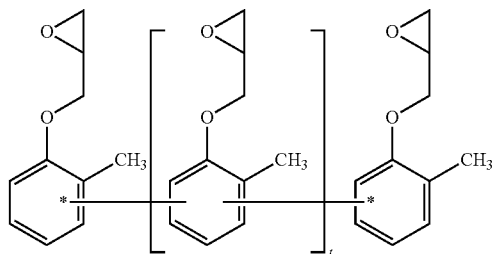

wherein t is 2≤t≤3.

One or two of these compounds in which a hydroxy group of a polyvalent phenol is substituted with a glycidoxy group (a compound in which a hydrogen atom of a hydroxy group of a polyvalent phenol is replaced with a glycidyl group) may be used as the crosslinking agent.

Examples of the compound in which a hydrogen atom of a hydroxy group of a polyvalent phenol is replaced with a substituent represented by the following formula (C-1) may include a compound containing two or more such substituents and represented by the following formula (C-15):

(C-1)

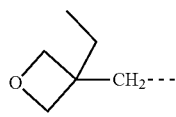

wherein the dotted line represents a bond; and (C-15)

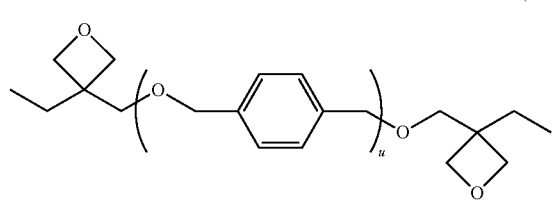

wherein 1≤u≤3.

Besides, examples of the compound containing two or more nitrogen atoms each having a glycidyl group represented by the following formula (C-2) may include a compound represented by the following formula (C-16):

(C-2)

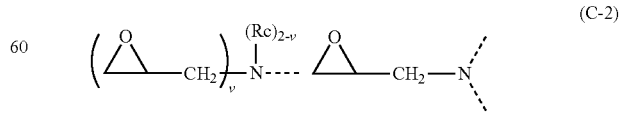

wherein the dotted line represents a bond; Rc represents a linear, branched or cyclic alkyl group having 1 to 6 carbon atoms; and v is 1 or 2; and

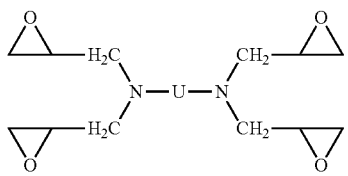

(C-16)

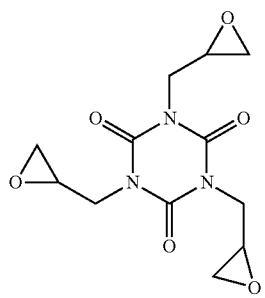

C-21 wherein U represents a linear, branched or cyclic alkylene group having 2 to 12 carbon atoms, or a divalent aromatic group.

Examples of the compound represented by the above-described formula (C-16) may include compounds represented by the following formulas (C-17) to (C-20):

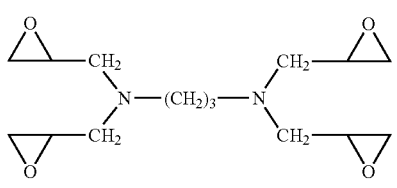

(C-17)

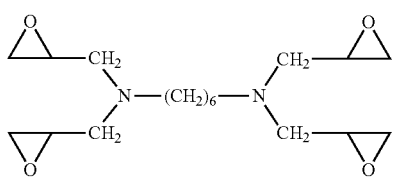

(C-18)

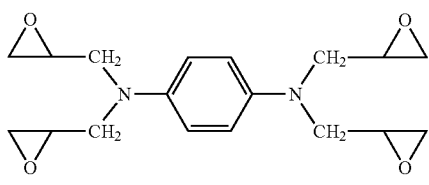

(C-19)

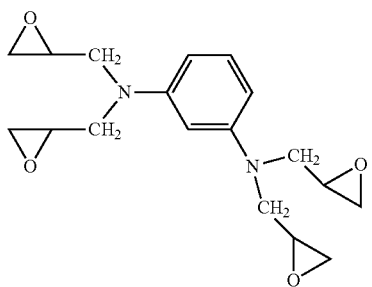

(C-20)

Further, as the compound containing two or more nitrogen atoms each having a glycidyl group represented by the above-described formula (C-2), a compound represented by the following formula (C-21) can be suitably used:

One or two of these compounds containing two or more nitrogen atoms each having a glycidyl group represented by the above-described formula (C-2) may be used as the crosslinking agent.

Component (C) is a component that causes, after the patterning of the positive photosensitive resin composition using a polymer of polyimide precursor according to the present invention, crosslinking reaction in the post-curing and further increase in the strength of a cured product. The weight average molecular weight of such component (C) is preferably 150 to 10,000 and more preferably 200 to 3,000 from the viewpoint of photo-curability and heat resistance.

The amount of component (C) to be contained is preferably 0.5 to 50 parts by mass and more preferably 1 to 30 parts by mass relative to 100 parts by mass of component (A) in the second embodiment of the positive photosensitive resin composition according to the present invention.

In addition, suitable examples of the solvent of component (D) in the second embodiment of the positive photosensitive resin composition according to the present invention may include the same solvents as those described in the first embodiment of the positive photosensitive resin composition.

The positive photosensitive resin composition according to the present invention may further comprise (E) a compound that generates an acid by heat. As component (E), the compound that generates an acid by heat can be added for the purpose of thermally accelerating crosslinking reaction with component (A) in the above-described step of heating and post-curing the composition at a temperature of 100 to 300° C. performed after the patterning.

In particular, as component (E), preferable are those that do not promote curing of the film before a pattern is formed by development and do not inhibit the patterning. In order to accomplish this, it is preferable that component (E) not generate an acid at a temperature of the step of removing the solvent and drying the film followed by coating the photosensitive resin composition, but generate an acid and promote curing of the pattern and film of the positive photosensitive resin composition only after the heat treatment after the patterning. Specifically, it is preferable that component (E) be a compound that is decomposed and generates an acid through a heat treatment at 100° C. to 300° C., preferably 150° C. to 300° C. When such component (E) is contained, in the step of heating and post-curing at a temperature of 100 to 300° C. performed after the patterning of a pattern or film of the positive photosensitive resin composition, that pattern or film can be changed to a state where crosslinking and curing reaction are advanced more. Component (E) can even further improve the mechanical strength, chemical resistance, adhesiveness and the like of the obtained pattern or film by even further advancing crosslinking and curing reaction.

A suitable compound that generates an acid by heat is not particularly limited, but for example, compounds described in paragraphs [0061] to [0085] of Japanese Patent Laid-Open No. 2007-199653 can be used.

The amount of the compound that generates an acid by heat to be contained is preferably 0.1 part by mass or more and more preferably 0.5 part by mass or more, and preferably 30 parts by mass or less and more preferably 10 parts by mass or less relative to 100 parts by mass of component (A) in the positive photosensitive resin composition according to the present invention.

In addition, the positive photosensitive resin composition according to the present invention may further contain components other than component (A), component (B), component (C), component (D) and component (E). Examples of the other components may include, for example, an adhesion auxiliary and surfactant (G), and as surfactant (G), the compounds recited below and the like can be suitably used.

Surfactant (G) is preferably nonionic, examples thereof include fluorine-based surfactants, specifically, perfluoroalkyl polyoxyethylene ethanols, fluorinated alkyl esters, perfluoroalkylamine oxides and fluorine-containing organosiloxane-based compounds.

For these surfactants, those that are commercially available can be used, and examples thereof include FLUORAD® "FC-4430" (manufactured by Sumitomo 3M Limited, Tokyo, Japan and 3M Company, St. Paul, Minn., USA), SURFLON' "S-141" and "S-145" (the above, manufactured by Asahi Glass Co., Ltd., Tokyo, Japan), UNIDYNE® "DS-401", "DS-4031" and "DS-451" (the above, manufactured by Daikin Industries, Ltd., Osaka, Japan), MEGAFAC™ "F-8151" (manufactured by DIC Corporation, Tokyo, Japan) and "X-70-093" (manufactured by Shin-Etsu Chemical Co., Ltd., Tokyo, Japan). Among them, FLUORAD® "FC-4430" (manufactured by Sumitomo 3M Limited, Tokyo, Japan and 3M Company, St. Paul, Minn., USA) and "X-70-093" (manufactured by Shin-Etsu Chemical Co., Ltd., Tokyo, Japan) are preferable.

Negative Photosensitive Resin Composition

Among photosensitive resin compositions using the polymer according to the present invention as a base resin, a negative photosensitive resin composition capable of alkaline development will be described. The negative photosensitive resin composition according to the present invention can be, for example, an embodiment to be described below, but is not limited thereto.

The negative photosensitive resin composition according to the present invention comprises:

(A') a polymer comprising structural unit (1) and/or structural unit (2), or a polymer further comprising, in addition to structural unit (1) and/or structural unit (2), any one or more structural units (3) to (5) and (7);

(B') a photoacid generator;

(C) one or two or more crosslinking agents selected from an amino condensate modified with formaldehyde or formaldehyde-alcohol, a phenol compound having two or more methylol groups or alkoxymethylol groups on average in one molecule, a compound in which a hydrogen atom of a hydroxy group of a polyvalent phenol is replaced with a glycidyl group, a compound in which a hydrogen atom of a hydroxy group of a polyvalent phenol is replaced with a substituent represented by the following formula (C-1), and a compound containing two or more nitrogen atoms each having a glycidyl group represented by the following formula (C-2):

(C-1)

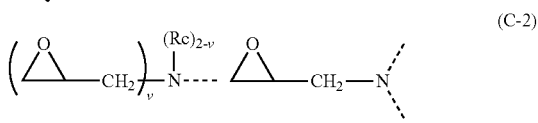

(C-2)

wherein the dotted line represents a bond; Rc represents a linear, branched or cyclic alkyl group having 1 to 6 carbon atoms; and v is 1 or 2; and (D) a solvent.

Component (A') of the negative photosensitive resin composition is a polymer comprising structural unit (1) and/or structural unit (2), or a polymer further comprising, in addition to structural unit (1) and/or structural unit (2), any one or more structural units (3) to (5) and (7).

In the negative photosensitive resin composition, crosslinking groups of component (C) can be crosslinked with the polymer of component (A') using an acid generated from component (B') as a catalyst, thereby forming a negative type photosensitive resin composition.

Component (B') of the negative photosensitive resin composition is a photoacid generator. As the photoacid generator, those that generate an acid by photoirradiation at a wavelength of 190 to 500 nm, which becomes a catalyst for curing, can be used. Examples of the photoacid generator include onium salts, diazomethane derivatives, glyoxime derivatives, β-ketosulfone derivatives, disulfone derivatives, nitrobenzylsulfonate derivatives, sulfonate ester derivatives, imid-yl-sulfonate derivatives, oximesulfonate derivatives, iminosulfonate derivatives and triazine derivatives.

Examples of the above-described onium salt include a compound represented by the following general formula (56a):

wherein $R_{10}$ represents a linear, branched or cyclic alkyl group having 1 to 12 carbon atoms, aryl group having 6 to 12 carbon atoms, or aralkyl group having 7 to 12 carbon atoms, optionally having a substituent; $M^+$ represents iodonium or sulfonium; $K^-$ represents a non-nucleophilic counter ion; and j is 2 or 3.

In the above-described $R_{10}$, examples of the alkyl group include a methyl group, an ethyl group, a propyl group, a butyl group, a cyclohexyl group, a 2-oxocyclohexyl group, a norbornyl group and an adamantyl group. Examples of the aryl group include, for example, a phenyl group; an alkoxyphenyl group such as o-, m- or p-methoxyphenyl group, ethoxyphenyl group, and m- or p-tert-butoxyphenyl group; and an alkylphenyl group such as 2-, 3- or 4-methylphenyl group, ethylphenyl group, 4-tert-butylphenyl group, 4-butylphenyl group, and dimethylphenyl group. Examples of the aralkyl group include, for example, each group of a benzyl group, a phenethyl group, and the like.

Examples of the non-nucleophilic counter ion of $K^-$ include a halide ion such as chloride ion and bromide ion; a fluoroalkylsulfonate such as triflate, 1,1,1-trifluoroethanesulfonate and nonafluorobutanesulfonate; an arylsulfonate such as tosylate, benzenesulfonate, 4-fluorobenzenesulfonate and 1,2,3,4,5-pentafluorobenzenesulfonate; and an alkylsulfonate such as mesylate and butanesulfonate.

Examples of the diazomethane derivative include a compound represented by the following general formula (56b):

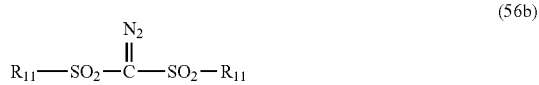

(56b)

wherein $R_{11}$ may be the same or different, and each represents a linear, branched or cyclic alkyl group or halogenated alkyl group having 1 to 12 carbon atoms, an aryl group or a halogenated aryl group having 6 to 12 carbon atoms, or an aralkyl group having 7 to 12 carbon atoms.

In the above-described $R_{11}$, examples of the alkyl group include a methyl group, an ethyl group, a propyl group, a butyl group, an amyl group, a cyclopentyl group, a cyclohexyl group, a norbornyl group and an adamantyl group. Examples of the halogenated alkyl group include, for example, a trifluoromethyl group, a 1,1,1-trifluoroethyl group, a 1,1,1-trichloroethyl group and a nonafluorobutyl group. Examples of the aryl group include, for example, a phenyl group; an alkoxyphenyl group such as o-, m- or p-methoxyphenyl group, ethoxyphenyl group, and m- or p-tert-butoxyphenyl group; and an alkylphenyl group such as 2-, 3- or 4-methylphenyl group, ethylphenyl group, 4-tert-butylphenyl group, 4-butylphenyl group, and dimethylphenyl group. Examples of the halogenated aryl group include, for example, a fluorophenyl group, a chlorophenyl group and a 1,2,3,4,5-pentafluorophenyl group. Examples of the aralkyl group include a benzyl group and a phenethyl group.

Specific examples of such a photoacid generator include onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl) diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate and diphenyl(4-thiophenoxyphenyl)sulfonium hexafluoroantimonate; diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl) diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane and 1-tert-amylsulfonyl-1-(tert-butylsulfonyl)diazomethane; glyoxime derivatives such as bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime and bis-o-(camphorsulfonyl)-α-dimethylglyoxime; oximesulfonate derivatives such as α-(benzenesulfonium oxyimino)-4-methylphenylacetonitrile; β-ketosulfone derivatives such as 2-cyclohexylcarbonyl-2-(p-toluenesulfonyl)propane and 2-isopropylcarbonyl-2-(p-toluenesulfonyl)propane; disulfone derivatives such as diphenyldisulfone and dicyclohexyldisulfone; nitrobenzylsulfonate derivatives such as 2,6-dinitrobenzyl p-toluenesulfonate and 2,4-dinitrobenzyl p-toluenesulfonate; sulfonate ester derivatives such as 1,2,3-tris(methanesulfonyloxy)benzene, 1,2,3-tris(trifluoromethanesulfonyloxy)benzene, 1,2,3-tris(p-toluenesulfonyloxy)benzene; imid-yl-sulfonate derivatives such as phthalimid-yl-triflate, phthalimid-yl-tosylate, 5-norbornene 2,3-dicarboxyimid-yl-triflate, 5-norbornene 2,3-dicarboxyimid-yl-tosylate, 5-norbornene 2,3-dicarboxyimid-yl-n-butyl-sulfonate and n-trifluoromethylsulfonyloxynaphthylimide; iminosulfonates such as (5-(4-methylphenyl)sulfonyloxyimino-5H-thiophen-2-ylidene)-(2-methylphenyl)acetonitrile and (5-(4-(4-methylphenylsulfonyloxy)phenylsulfonyloxyimino)-5H-thiophen-2-ylidene)-(2-methylphenyl)-acetonitrile; and 2-methyl-2[(4-methylphenyl)sulfonyl]-1-[(4-methylthio)phenyl]-1-propane. Among them, imid-yl-sulfonates, iminosulfonates, oximesulfonates and the like are suitably used. One of the above-described photoacid generators, or two or more of them can be used.

The amount of the above-described photoacid generator of component (B') to be contained is preferably 0.05 to 20 parts by mass and particularly preferably 0.2 to 5 parts by mass relative to 100 parts by mass of component (A') in the negative photosensitive resin composition according to the present invention from the viewpoint of photoabsorption of the photoacid generator itself and photocurability in a thick film.

As component (C) of the negative photosensitive resin composition according to the present invention, the same crosslinking agents as component (C) described in the second embodiment of the positive photosensitive resin composition can be preferably used.

As mentioned above, component (C) of the negative photosensitive resin composition according to the present invention is a component that not only can form a negative type pattern by using an acid generated from component (B')

as a catalyst to crosslink the crosslinking groups of component (C) with the polymer of component (A'), but also causes crosslinking reaction in the post-curing after the patterning, thereby further increase in the strength of a cured product. The weight average molecular weight of such component (C) is preferably 150 to 10,000 and particularly preferably 200 to 3,000 from the viewpoint of photocurability and heat resistance.

Component (C) is a component that causes, after the patterning of the negative photosensitive resin composition using a polymer according to the present invention, crosslinking reaction in the post-curing and further increase in the strength of a cured product. The weight average molecular weight of such component (C) is preferably 150 to 10,000 and particularly preferably 200 to 3,000 from the viewpoint of photocurability and heat resistance.

The amount of component (C) to be contained is preferably 0.5 to 50 parts by mass and particularly preferably 1 to 30 parts by mass relative to 100 parts by mass of component (A') in the negative photosensitive resin composition according to the present invention.

As the solvent of component (D), the solvents recited in the positive photosensitive resin compositions can be preferably used.

The amount of component (D) to be contained is preferably 50 to 2,000 parts by mass and particularly preferably 100 to 1,000 parts by mass relative to 100 parts by mass of the total amount of component (A') and component (B') to be contained.

The negative photosensitive resin composition according to the present invention may also further contain components other than component (A'), component (B'), component (C) and component (D). Examples of the other components may include an adhesion auxiliary, a polymerization inhibitor to enhance storage stability, and surfactant (G) to be contained for the purpose of improving coating performance, and as surfactant (G), the compounds recited above and the like can be suitably used.

In the negative photosensitive resin composition according to the present invention, a basic compound can be added as component (F), as necessary. As this basic compound, suitable is a compound that can inhibit a diffusion rate of the acid generated from the photoacid generator to be diffused in the resist film. Then, by containing the above-described basic compound, resolution can be improved, change in sensitivity after exposure can be inhibited, a substrate or environment dependency can be reduced, and exposure margin, pattern shape or the like can be improved.

Examples of the above-described basic compound may include ammonia, primary, secondary and tertiary aliphatic amines, hybrid amines, aromatic amines, heterocyclic amines, nitrogen-containing compounds having a carboxyl group, nitrogen-containing compounds having a sulfonyl group, nitrogen-containing compounds having a hydroxyl group, nitrogen-containing compounds having a hydroxyphenyl group, alcoholic nitrogen-containing compounds, amide derivatives and imide derivatives, as well as compounds represented by the following general formula (57):

$$N(\alpha)_q(\beta)_{3-q} \quad (57)$$

wherein q=1, 2 or 3. The side chain α may be the same or different, and is any of the substituents represented by the following general formulas (58) to (60). The side chain β may be the same or different, and represents a hydrogen atom, or a linear, branched or cyclic alkyl group having 1 to 20 carbon atoms, which may contain an ether bond or a hydroxyl group. In addition, the side chain α may be bonded to each other to form a ring.

$$*-[R^{300}-O-R^{301}] \quad (58)$$

$$*-\left[R^{302}-O-R^{303}-\overset{O}{\underset{\|}{C}}-R^{303}\right] \quad (59)$$

$$*-\left[R^{305}-\overset{O}{\underset{\|}{C}}-O-R^{306}\right] \quad (60)$$

Here, $R^{300}$, $R^{302}$ and $R^{305}$ are each a linear or branched alkylene group having 1 to 4 carbon atoms, and $R^{301}$ and $R^{304}$ are each a hydrogen atom or a linear, branched or cyclic alkyl group having 1 to 20 carbon atoms, each of which may contain one or more hydroxyl groups, ether bonds, ester bonds or lactone rings. $R^{303}$ is a single bond or a linear or branched alkylene group having 1 to 4 carbon atoms, and $R^{306}$ is a linear, branched or cyclic alkyl group having 1 to 20 carbon atoms, each of which may contain one or more hydroxyl groups, ether bonds, ester bonds or lactone rings. Note that *-represents a bonding end.

Examples of the primary aliphatic amine include methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Examples of the secondary aliphatic amine include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine.

Examples of the tertiary aliphatic amine include, for example, trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of the hybrid amine include dimethylethylamine, methylethylpropylamine, benzylamine, phenethyl amine, and benzyldimethylamine.

Examples of the aromatic amine and the heterocyclic amine include aniline derivatives (for example, aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, N,N-dimethyltoluidine and the like), diphenyl(p-tolyl)amine, methyldiphenylamine, triphenylamine, phenylenediamine, naphthylamine, diaminonaphthalene, pyrrole derivatives (for example, pyrrole, 2H-pyrrole, 1-methylpyrrole, 2,4-dimethylpyrrole, 2,5-dimethylpyrrole, N-methylpyrrole and the like), oxazole derivatives (for example, oxazole, isoxazole and the like), thiazole derivatives (for example, thiazole, isothiazole and the like), imidazole derivatives (for example, imidazole, 4-methylimidazole, 4-methyl-2-phenylimidazole and the like), pyrazole derivatives, furazan derivatives, pyrroline derivatives (for example, pyrroline, 2-methyl-1-pyrroline and the like), pyrrolidine derivatives (for example, pyrrolidine, N-methylpyrrolidine, pyrrolidinone, N-methylpyrrolidone and the like), imidazoline derivatives, imidazolidine derivatives, pyridine derivatives (for example, pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, dimethylaminopyridine and the like), pyridazine derivatives, pyrimidine derivatives, pyrazine derivatives, pyrazoline derivatives, pyrazolidine derivatives, piperidine derivatives, piperadine derivatives, morpholine derivatives, indole derivatives, isoindole derivatives, 1H-indazole derivatives, indoline derivatives, quinoline derivatives (for example, quinoline, 3-quinolinecarbonitrile and the like), isoquinoline derivatives, cinnoline derivatives, quinazoline derivatives, quinoxaline derivatives, phthalazine derivatives, purine derivatives, puteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of the nitrogen-containing compound having a carboxyl group include aminobenzoic acid, indolecarboxylic acid, and amino acid derivatives (for example, nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, methoxyalanine and the like).

Examples of the nitrogen-containing compound having a sulfonyl group include 3-pyridinesulfonic acid and pyridinium p-toluenesulfonate.

Examples of the nitrogen-containing compound having a hydroxyl group, the nitrogen-containing compound having a hydroxyphenyl group and the alcoholic nitrogen-containing compound include, for example, 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperadine, 1-[2-(2-hydroxyethoxy)ethyl]piperadine, piperidineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidineethanol, 1-aziridineethanol, N-(2-hydroxyethyl)phthalimide, and N-(2-hydroxyethyl)isonicotinamide.

Examples of the amide derivative include formamide, N-methylformamide, N,N-dimethylformamide, acetamide, N-methylacetamide, N,N-dimethylacetamide, propionamide, and benzamide.

Examples of the Imide Derivative Include Phthalimide, Succinimide, and Maleimide.

Examples of the compound represented by the above-described general formula (57) may include, but are not limited to tris[2-(methoxymethoxy)ethyl]amine, tris[2-(2-methoxyethoxy) ethyl]amine, tris[2-(2-methoxyethoxymethoxy)ethyl]amine, tris[2-(1-methoxyethoxy)ethyl]amine, tris[2-(1-ethoxyethoxy)ethyl]amine, tris[2-(1-ethoxyoxopropoxy)ethyl]amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)2-(acetoxyacetoxy)ethylamine, tris(2-methoxycarbonyloxyethyl) amine, tris(2-tert-butoxycarbonyloxyethyl)amine, tris[2-(2-oxopropoxy) ethyl]amine, tris[2-(methoxycarbonylmethyl)oxyethyl] amine, tris[2-(tert-butoxycarbonylmethyloxy) ethyl]amine, tris[2-(cyclohexyloxycarbonylmethyloxy)ethyl]amine, tris (2-methoxycarbonylethyl)amine, tris(2-ethoxycarbonylethyl)amine, N,N-bis(2-hydroxyethyl)2-(methoxycarbonyl) ethylamine, N,N-bis(2-acetoxyethyl)2-(methoxycarbonyl) ethylamine, N,N-bis(2-hydroxyethyl)2-(ethoxycarbonyl) ethylamine, N,N-bis(2-acetoxyethyl)2-(ethoxycarbonyl) ethylamine, N,N-bis(2-hydroxyethyl)2-(2-methoxyethoxycarbonyl)ethylamine, N,N-bis(2-acetoxyethyl)2-(2-methoxyethoxycarbonyl)ethylamine, N,N-bis(2-hydroxyethyl)2-(2-hydroxyethoxycarbonyl)ethylamine, N,N-bis(2-acetoxyethyl)2-(2-acetoxyethoxycarbonyl)ethylamine, N,N-bis(2-hydroxyethyl)2-[(methoxycarbonyl)methoxycarbonyl]ethylamine, N,N-bis(2-acetoxyethyl)2-[(methoxycarbonyl)methoxycarbonyl] ethylamine, N,N-bis(2-hydroxyethyl)2-(2-oxopropoxycarbonyl)ethylamine, N,N-bis(2-acetoxyethyl) 2-(2-oxopropoxycarbonyl)ethylamine, N,N-bis(2-hydroxyethyl)2-(tetrahydrofurfuryloxycarbonyl) ethylamine, N,N-bis(2-acetoxyethyl)2-(tetrahydrofurfuryloxycarbonyl)ethylamine, N,N-bis(2-hydroxyethyl)2-[(2-oxotetrahydrofuran-3-yl)oxycarbonyl] ethylamine, N,N-bis(2-acetoxyethyl)2-[(2-oxotetrahydrofuran-3-yl)oxycarbonyl]ethylamine, N,N-bis (2-hydroxyethyl)2-(4-hydroxybutoxycarbonyl)ethylamine, N,N-bis(2-formyloxyethyl)2-(4-formyloxybutoxycarbonyl) ethylamine, N,N-bis(2-formyloxyethyl)2-(2-formyloxyethoxycarbonyl)ethylamine, N,N-bis(2-methoxyethyl)2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis [2-(methoxycarbonyl)ethyl]amine, N-(3-acetoxy-1-propyl) bis[2-(methoxycarbonyl)ethyl]amine, N-(2-methoxyethyl) bis[2-(methoxycarbonyl)ethyl]amine, N-butylbis[2-(methoxycarbonyl)ethyl]amine, N-butylbis[2-(2-methoxyethoxycarbonyl) ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy) ethyl]amine, tris(methoxycarbonylmethyl)amine, tris(ethoxycarbonylmethyl)amine, N-butylbis (methoxycarbonylmethyl)amine, N-hexylbis (methoxycarbonylmethyl)amine, and β-(diethylamino)-δ-valerolactone. One of the above-described basic compounds, or two or more of them can be used.

The amount of the above-described basic compound to be contained is preferably 0 to 3 parts by mass and particularly preferably 0.01 to 1 part by mass relative to 100 parts by mass of component (A') in the negative photosensitive resin composition according to the present invention from the viewpoint of sensitivity.

Patterning Method

Next, a patterning method using the positive photosensitive resin composition and negative photosensitive resin composition according to the present invention will be described.

In the case of either positive photosensitive resin composition or negative photosensitive resin composition according to the present invention, formation of a pattern may be carried out by employing a known lithography technology, and for example, by coating the photosensitive resin composition onto a silicon wafer or a $SiO_2$ substrate, a SiN substrate, or a substrate onto which a pattern of copper wiring or the like, has been formed with a spin coating technique (spin coating method) and pre-baking under conditions of 80 to 130° C. for 50 to 600 seconds to form a photosensitive material film with a thickness of 1 to 50 µm, preferably 1 to 30 µm, more preferably 5 to 20 µm.

In the spin coating method, the photosensitive resin composition can be coated onto the silicon substrate by dispensing the photosensitive resin composition onto the substrate in an amount of approximately 5 mL, and then rotating the substrate. Upon this, the film thickness of the photosensitive material film on the substrate can be readily controlled by adjusting the rotation speed.

Then, the remaining solvent can be removed by pre-baking.

Then, a mask for forming the target pattern is put on the photosensitive material film, and a high energy beam such as i-line and g-line having a wavelength of 190 to 500 nm or an electron beam is irradiated thereto with an exposure value of approximately 1 to 5,000 $mJ/cm^2$ and preferably approximately 100 to 2,000 $mJ/cm^2$.

Next, as necessary, between the exposure step and the development step, heating treatment after the exposure (post-exposure bake (PEB)) may be carried out on a hot plate at 60 to 150° C. for 1 to 10 minutes, preferably at 80 to 120° C. for 1 to 5 minutes.

Thereafter, development is performed. For the above-described positive photosensitive resin composition and negative photosensitive resin composition according to the present invention, alkaline development with an aqueous alkaline solution is possible.

On the other hand, a suitable aqueous alkaline solution that can be used for the alkaline development is a 2.38% aqueous solution of tetramethylammonium hydroxide (TMAH). The development can be carried out by normal methods such as spray method and paddle method, or by dipping the film in a developing solution. Thereafter, by carrying out washing, rinsing, drying and the like, as necessary, a resist film having a desired pattern can be obtained.

Method of Forming Cured Film

In addition, by heating and post-curing the patterned film obtained by the above-described patterning method at a temperature of 100 to 300° C., preferably 150 to 300° C., and further preferably 180 to 250° C., using an oven or a hot plate, a cured film can be formed. When the post-curing temperature is 100 to 300° C., the crosslinking density of the film of the photosensitive resin composition can be increased and the remaining volatile components can be removed, which is preferable from the viewpoint of adhesiveness to the substrate, heat resistance and strength, as well as electrical properties. Also, the post-curing time can be 10 minutes to 10 hours.

The formed pattern described above is used as a protective film that covers a wiring, circuit, substrate and the like, and such a formed pattern and protective film exhibits excellent adhesiveness to wirings to be covered, to a metal layer of a circuit such as Cu, on a metal electrode existing on the substrate, or on an insulating substrate such as SiN existing in wirings or circuits to be coated while having an excellent insulating property, and can also significantly improve the resolution performance for realizing further finer patterning while maintaining the appropriate mechanical strength as a protective film.

Cured Film

The cured film thus obtained is excellent in adhesiveness to a substrate, heat resistance, electrical properties, mechanical strength and chemical resistance to an alkaline stripping solution or the like, and a semiconductor element using the cured film as a protective film is also excellent in reliability. In particular, the cured film can prevent cracking upon a temperature cycle test, and therefore, it is suitably used as a protective film (interlayer insulating film or surface protective film) for electrical and electronic components, semiconductor elements and the like.

That is, the present invention provides an interlayer insulating film or surface protective film comprising a cured film formed by curing the positive photosensitive resin composition mentioned above or the negative photosensitive resin composition mentioned above.

The above-described protective film is effective for an insulating film for semiconductor elements including a rewiring application, an insulating film for multilayer printed circuit boards, a solder mask, a coverlay film application and the like due to its heat resistance, chemical resistance and insulating property.

Furthermore, the present invention provides an electronic component having the interlayer insulating film described above or the surface protective film described above.

Such an electronic component has a protective film (interlayer insulating film or surface protective film) having heat resistance, chemical resistance and an insulating property, and is thus excellent in reliability.

EXAMPLES

Hereinafter, the present invention will be described specifically with reference to synthesis examples, comparative synthesis examples, examples and comparative examples, but the present invention is not limited by the following examples.

I. Synthesis of Resin

Chemical structural formulas and names of the compounds used in the following synthesis examples are shown below.

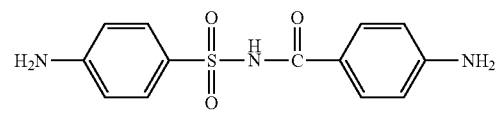

DA-1

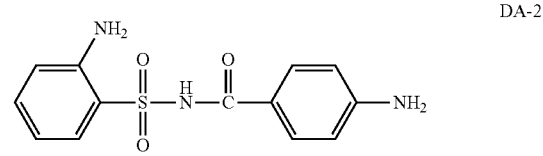

DA-2

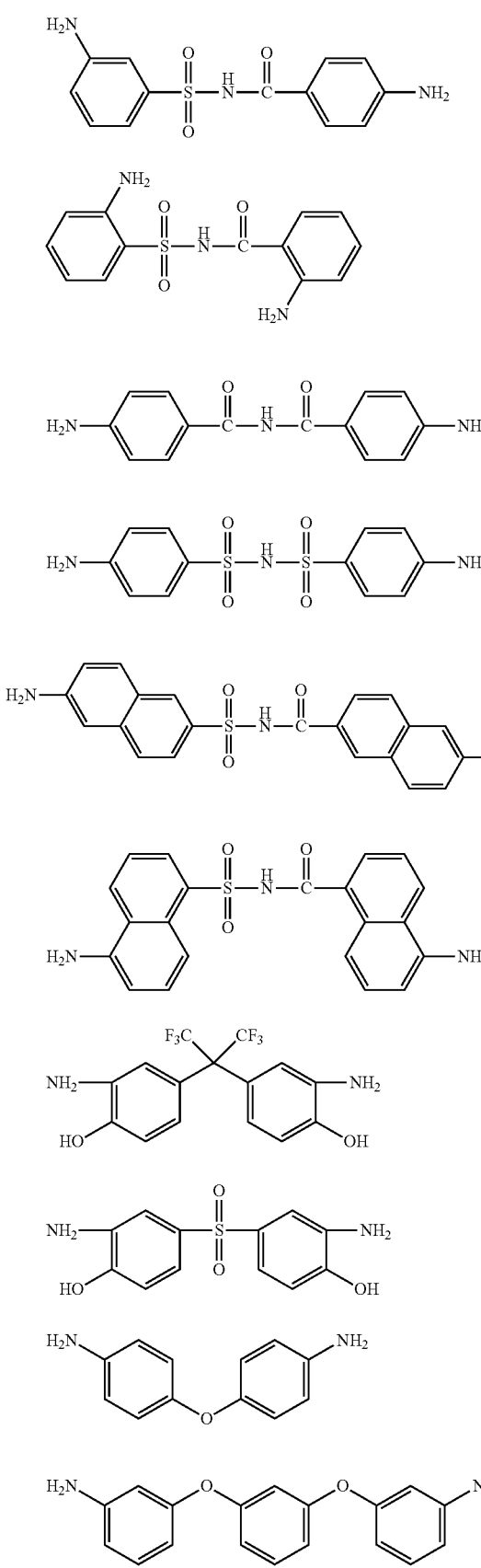
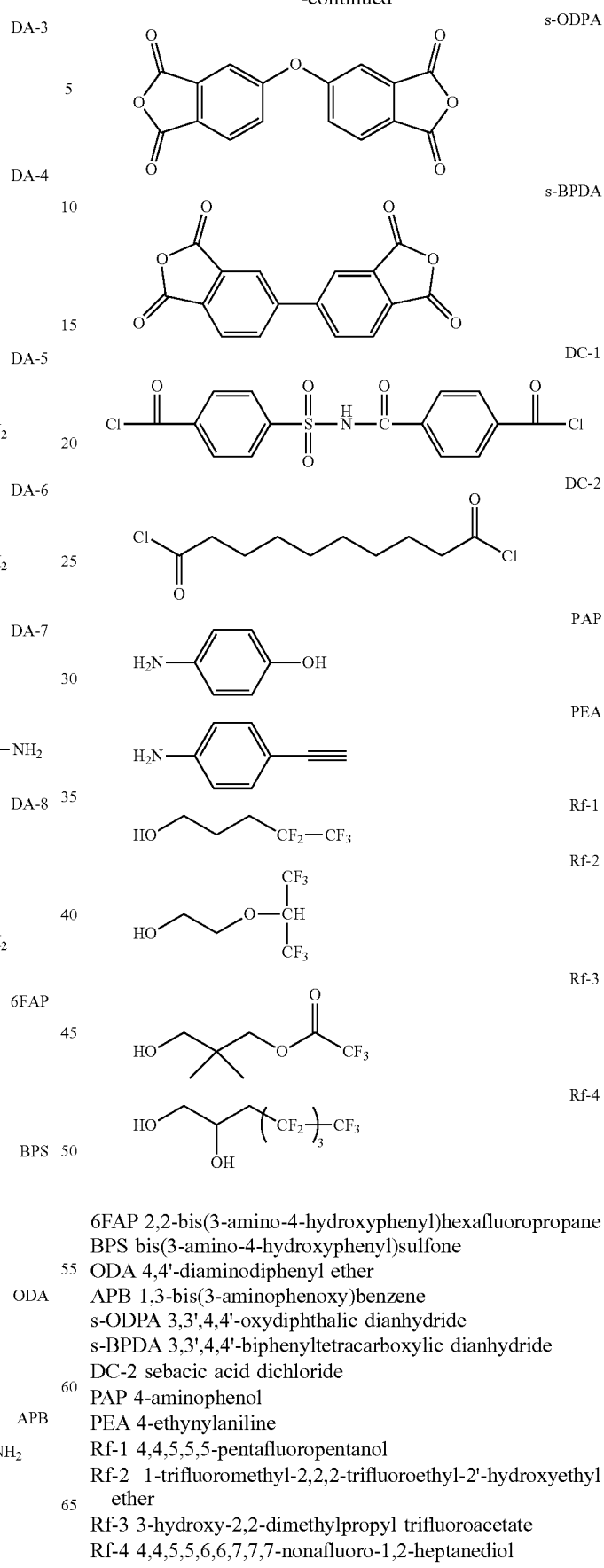

6FAP 2,2-bis(3-amino-4-hydroxyphenyl)hexafluoropropane
BPS bis(3-amino-4-hydroxyphenyl)sulfone
ODA 4,4'-diaminodiphenyl ether
APB 1,3-bis(3-aminophenoxy)benzene
s-ODPA 3,3',4,4'-oxydiphthalic dianhydride
s-BPDA 3,3',4,4'-biphenyltetracarboxylic dianhydride
DC-2 sebacic acid dichloride
PAP 4-aminophenol
PEA 4-ethynylaniline
Rf-1 4,4,5,5,5-pentafluoropentanol
Rf-2 1-trifluoromethyl-2,2,2-trifluoroethyl-2'-hydroxyethyl ether
Rf-3 3-hydroxy-2,2-dimethylpropyl trifluoroacetate
Rf-4 4,4,5,5,6,6,7,7,7-nonafluoro-1,2-heptanediol D-400 and RT-1000 (these are trade names, manufactured by Huntsman Corporation) are diamines represented by the above-described general formula (41).

Synthesis Example 1

Synthesis of Diamine (DA-1)

To a 1 L flask equipped with a stirrer and a thermometer and purged with nitrogen, 20.0 g (98.9 mmol) of 4-nitrobenzenesulfonamide, 25.0 g (247 mmol) of triethylamine, 0.6 g (5 mmol) of N,N-dimethyl-4-aminopyridine and 200 g of toluene were added, and the temperature was raised to 60° C. to make the above compounds dissolved. Then, while stirring the resultant solution, 18.7 g (101 mmol) of 4-nitrobenzoyl chloride dissolved in 100 g of toluene was added dropwise thereto over 1 hour, and the solution was stirred at 60° C. for 1 hour. Thereafter, the solution was cooled to room temperature, and the precipitate was separated by filtration. The precipitate separated by filtration was washed with a 10% aqueous hydrochloric acid solution, and then washed with water several times. By drying the obtained crystal under reduced pressure at 60° C. for 15 hours, 31.3 g of 4-nitro-N-[(4-nitrophenyl) sulfonyl]benzamide was obtained.

To a 500 ml flask equipped with a stirrer and a thermometer, 28.1 g (80.0 mmol) of 4-nitro-N-[(4-nitrophenyl)sulfonyl]benzamide, 2.8 g of 10 wt % palladium-carbon and 300 g of ethanol were added, the flask was purged with hydrogen, and the resultant mixture was stirred at room temperature for 3 hours. This reaction solution was filtrated using celite, and ethanol was then distilled off. By drying the obtained crystal under reduced pressure at 60° C. for 15 hours, diamine (DA-1) was obtained.

Synthesis Example 2

Synthesis of Diamine (DA-2)

In the same formulation as Synthesis Example 1 except that 4-nitrobenzenesulfonamide was replaced with 20.0 g (98.9 mmol) of 2-nitrobenzenesulfonamide, diamine (DA-2) was obtained.

Synthesis Example 3

Synthesis of Diamine (DA-3)

In the same formulation as Synthesis Example 1 except that 4-nitrobenzenesulfonamide was replaced with 20.0 g (98.9 mmol) of 3-nitrobenzenesulfonamide, diamine (DA-3) was obtained.

Synthesis Example 4

Synthesis of Diamine (DA-4)

In the same formulation as Synthesis Example 1 except that 4-nitrobenzenesulfonamide was replaced with 20.0 g (98.9 mmol) of 2-nitrobenzenesulfonamide and 4-nitrobenzoyl chloride was replaced with 18.7 g (101 mmol) of 2-nitrobenzoyl chloride, diamine (DA-4) was obtained.

Synthesis Example 5

Synthesis of Diamine (DA-5)

In the same formulation as Synthesis Example 1 except that 4-nitrobenzenesulfonamide was replaced with 16.4 g (98.9 mmol) of 4-nitrobenzamide, diamine (DA-5) was obtained.

Synthesis Example 6

Synthesis of Diamine (DA-6)

In the same formulation as Synthesis Example 1 except that 4-nitrobenzoyl chloride was replaced with 22.4 g (101 mmol) of 4-nitrobenzenesulfonyl chloride, diamine (DA-6) was obtained.

Synthesis Example 7

Synthesis of Diamine (DA-7)

In the same formulation as Synthesis Example 1 except that 4-nitrobenzenesulfonamide was replaced with 24.9 g (98.9 mmol) of 6-nitro-2-naphthalenesulfonamide and 4-nitrobenzoyl chloride was replaced with 23.8 g (101 mmol) of 6-nitro-2-naphthalenecarbonyl chloride, diamine (DA-7) was obtained.

Synthesis Example 8

Synthesis of Diamine (DA-8)

In the same formulation as Synthesis Example 1 except that 4-nitrobenzenesulfonamide was replaced with 24.9 g (98.9 mmol) of 5-nitro-1-naphthalenesulfonamide and 4-nitrobenzoyl chloride was replaced with 23.8 g (101 mmol) of 5-nitro-1-naphthalenecarbonyl chloride, diamine (DA-8) was obtained.

Synthesis Example 9

Synthesis of Dicarboxylic Acid Dichloride (DC-1)

To a 1 L flask equipped with a stirrer and a thermometer and purged with nitrogen, 20.0 g (110 mmol) of 4-cyanobenzenesulfonamide, 27.8 g (275 mmol) of triethylamine, 0.7 g (5.5 mmol) of N,N-dimethyl-4-aminopyridine and 200 g of toluene were added, and the temperature was raised to 60° C. to dissolve the above compounds. Then, while stirring the resultant solution, 18.5 g (112 mmol) of 4-cyanobenzoyl chloride dissolved in 100 g of toluene was added dropwise thereto over 1 hour, and the solution was stirred at 60° C. for 1 hour. Thereafter, the solution was cooled to room temperature, and the precipitate was separated by filtration. The precipitate separated by filtration was washed with a 10% aqueous hydrochloric acid solution, and then washed with water several times. By drying the obtained crystal under reduced pressure at 60° C. for 15 hours, 30.8 g of 4-cyano-N-[(4-cyanophenyl) sulfonyl]benzamide was obtained.

To a 1 L flask equipped with a stirrer and a thermometer, 24.9 g (80.0 mmol) of 4-cyano-N-[(4-cyanophenyl)sulfonyl] benzamide, 250 g of ethanol and 200 g of a 20% aqueous solution of potassium hydroxide were added, and the resultant mixture was stirred for 24 hours under reflux. Thereafter, 285 g of a 10% aqueous hydrochloric acid solution was added under ice cooling, and the precipitate was separated by filtration. The precipitate separated by filtration was washed with water several times. By drying the obtained crystal under reduced pressure at 60° C. for 15 hours, 22.4 g of dicarboxylic acid, which is a precursor of carboxylic acid dichloride (DC-1), was obtained. To the obtained dicarboxylic acid, 90 g of N-methyl-2-pyrrolidone was added, and was dissolved by stirring the mixture at room temperature. Next, under ice cooling, 16.0 g (134 mmol) of thionyl chloride was added dropwise to the mixture so that the temperature of the reaction solution was kept at 10° C. or lower. After that, the mixture was stirred for 2 hours under ice cooling, and a solution of carboxylic acid dichloride (DC-1) in N-methyl-2-pyrrolidone was obtained.

Synthesis Example 10

Synthesis of Tetracarboxylic Acid Diester Dichloride (X-1)

To a 3 L flask equipped with a stirrer and a thermometer, 100 g (322 mmol) of 3,3',4,4'-oxydiphthalic dianhydride (s-ODPA), 65.2 g (644 mmol) of triethylamine, 39.3 g (322 mmol) of N,N-dimethyl-4-aminopyridine and 400 g of γ-butyrolactone were added. While stirring the resultant mixture at room temperature, 114.7 g (644 mmol) of 4,4,5,5,5-pentafluoropentanol (Rf-1) was added dropwise thereto, and the mixture was then stirred at room temperature for 24 hours. Thereafter, under ice cooling, 370 g of a 10% aqueous hydrochloric acid solution was added dropwise to stop the reaction. To the reaction solution, 800 g of 4-methyl-2-pentanone was added, and the organic layer was fractionated and then washed six times with 600 g of ultrapure water. The solvent of the obtained organic layer was distilled off to obtain 193 g of tetracarboxylic acid diester compound (X-1). To the obtained tetracarboxylic acid diester compound, 772 g of N-methyl-2-pyrrolidone was added, and was dissolved by stirring the mixture at room temperature. Next, under ice cooling, 75.8 g (637 mmol) of thionyl chloride was added dropwise to the mixture so that the temperature of the reaction solution was maintained at 10° C. or lower. After that, the mixture was stirred for 2 hours under ice cooling, and a solution of tetracarboxylic acid diester dichloride (X-1) in N-methyl-2-pyrrolidone was obtained.

Synthesis Example 11

Synthesis of Tetracarboxylic Acid Diester Dichloride (X-2)

In the same formulation as Synthesis Example 10 except that 4,4,5,5,5-pentafluoropentanol (Rf-1) was replaced with 136.6 g (644 mmol) of 1-trifluoromethyl-2,2,2-trifluoroethyl-2'-hydroxyethyl ether (Rf-2), a solution of tetracarboxylic acid diester dichloride (X-2) in N-methyl-2-pyrrolidone was obtained.

Synthesis Example 12

Synthesis of Tetracarboxylic Acid Diester Dichloride (X-3)

In the same formulation as Synthesis Example 10 except that 4,4,5,5,5-pentafluoropentanol (Rf-1) was replaced with 101.8 g (644 mmol) of 3-hydroxy-2,2-dimethylpropyl trifluoroacetate (Rf-3), a solution of tetracarboxylic acid diester dichloride (X-3) in N-methyl-2-pyrrolidone was obtained.

Synthesis Example 13

Synthesis of Tetracarboxylic Acid Diester Dichloride (X-4)

In the same formulation as Synthesis Example 10 except that 4,4,5,5,5-pentafluoropentanol (Rf-1) was replaced with 189.4 g (644 mmol) of 4,4,5,5,6,6,7,7,7-nonafluoro-1,2-heptanediol (Rf-4), a solution of tetracarboxylic acid diester dichloride (X-4) in N-methyl-2-pyrrolidone was obtained.

Synthesis Example 14

Synthesis of Polyimide Resin (A-1)

To a 500 ml flask equipped with a stirrer and a thermometer, 23.3 g (80.0 mmol) of diamine (DA-1) synthesized in Synthesis Example 1, 0.9 g (8.4 mmol) of 4-aminophenol (PAP) and 97 g of N-methyl-2-pyrrolidone were added, and the resultant mixture was stirred at room temperature to dissolve the above compounds. Next, at room temperature, a solution formed by dissolving 26.1 g (84.2 mmol) of 3,3',4,4'-oxydiphthalic dianhydride (s-ODPA) in 264 g of N-methyl-2-pyrrolidone was added dropwise to the mixture, and after the dropwise addition, the mixture was stirred at room temperature for 3 hours. Thereafter, 20 g of xylene was added to this reaction solution, and the solution was heated to reflux at 170° C. for 3 hours for removing the generated water out of the system. After cooling this reaction solution to room temperature, it was added dropwise to 2 L of ultrapure water under stirring, and the precipitate was separated by filtration. After appropriately washing the precipitate with water, by drying it under reduced pressure at 40° C. for 48 hours, polyimide resin (A-1) was obtained. When the molecular weight of this polymer was measured by GPC, it had a weight average molecular weight of 34,000 in terms of polystyrene.

Synthesis Example 15

Synthesis of Polyamide-Imide Resin (A-2)

To a 500 ml flask equipped with a stirrer and a thermometer, 23.4 g (64.0 mmol) of 2,2-bis(3-amino-4-hydroxyphenyl)hexafluoropropane (6FAP), 4.7 g (16.0 mmol) of diamine (DA-1) synthesized in Synthesis Example 1, 0.9 g (8.4 mmol) of 4-aminophenol (PAP) and 116 g of N-methyl-2-pyrrolidone were added, and the resultant mixture was stirred at room temperature to make the above compounds dissolved. Next, at room temperature, a solution formed by dissolving 22.3 g (72.0 mmol) of 3,3',4,4'-oxydiphthalic dianhydride (s-ODPA) and 2.4 g (8.0 mmol) of 3,3',4,4'-biphenyltetracarboxylic dianhydride (s-BPDA) in 250 g of N-methyl-2-pyrrolidone was added dropwise to the mixture, and after that, the mixture was stirred at room temperature for 3 hours. Thereafter, 20 g of xylene was added to this reaction solution, and the solution was heated to reflux at 170° C. for 3 hours for removing the generated water out of the system. After cooling the reaction solution to room temperature, 1.4 g (17.6 mmol) of pyridine was added thereto, and 15.1 g of a solution of tetracarboxylic acid diester dichloride (X-1) in N-methyl-2-pyrrolidone [3.0 g (4.2 mmol) in terms of tetracarboxylic acid diester dichloride], which was separately prepared in Synthesis Example 10, was added dropwise to the mixture so that the temperature was kept at 5° C. or lower. After the dropwise addition, this reaction solution was returned to room temperature, and was added dropwise to 2 L of ultrapure water under stirring. The precipitate was separated by filtration and appropriately washed with water, and then, by drying it under reduced pressure at 40° C. for 48 hours, polyamide-imide resin (A-2) was obtained. When the molecular weight of this polymer was measured by GPC, it had a weight average molecular weight of 32,000 in terms of polystyrene.

Synthesis Example 16 to Synthesis Example 32 and Comparative Synthesis Examples 1 and 2

Synthesis of Polyimide Resin or Polyamide-Imide Resin (A-3) to (A-19), (B-1) and (B-2)

Resins (A-3) to (A-19), (B-1) and (B-2) were obtained in the same formulation as Synthesis Example 14 in the case of polyimide resins and in the same formulation as Synthesis Example 15 in the case of polyamide-imide resins, using compounds in the weights shown in the following Table 1 as the diamine compound, monoamine compound, tetracarboxylic dianhydride, dicarboxylic acid dichloride and tetracarboxylic acid diester dichloride. The molecular weight of each polymer was measured by GPC, and the weight average molecular weight in terms of polystyrene is shown in the following Table 1.

TABLE 1

| | | Diamine compound | Monoamine compound | Tetracarboxylic dianhydride | | Dicarboxylic acid dichloride | Tetracarboxylic acid diester dichloride | Molecular weight |
|---|---|---|---|---|---|---|---|---|
| Synthesis Example 14 | A-1 | DA-1 23.3 g (80.0 mmol) | | PAP 0.9 g (8.4 mmol) | s-ODPA 26.1 g (84.2 mmol) | | | 34,000 |
| Synthesis Example 15 | A-2 | DA-1 4.7 g (16.0 mmol) | 6FAP 23.4 g (64.0 mmol) | PAP 0.9 g (8.4 mmol) | s-ODPA 22.3 g (72.0 mmol) | s-BPDA 2.4 g (8.0 mmol) | | X-1 3.0 g (4.2 mmol) | 32,000 |
| Synthesis Example 16 | A-3 | DA-2 4.7 g (16.0 mmol) | 6FAP 23.4 g (64.0 mmol) | PAP 0.9 g (8.4 mmol) | s-ODPA 22.3 g (72.0 mmol) | s-BPDA 2.4 g (8.0 mmol) | | X-1 3.0 g (4.2 mmol) | 31,000 |
| Synthesis Example 17 | A-4 | DA-3 4.7 g (16.0 mmol) | 6FAP 23.4 g (64.0 mmol) | PAP 0.9 g (8.4 mmol) | s-ODPA 22.3 g (72.0 mmol) | s-BPDA 2.4 g (8.0 mmol) | | X-1 3.0 g (4.2 mmol) | 31,000 |
| Synthesis Example 18 | A-5 | DA-4 4.7 g (16.0 mmol) | 6FAP 23.4 g (64.0 mmol) | PAP 0.9 g (8.4 mmol) | s-ODPA 22.3 g (72.0 mmol) | s-BPDA 2.4 g (8.0 mmol) | | X-1 3.0 g (4.2 mmol) | 30,000 |
| Synthesis Example 19 | A-6 | DA-5 4.1 g (16.0 mmol) | 6FAP 23.4 g (64.0 mmol) | PAP 0.9 g (8.4 mmol) | s-ODPA 22.3 g (72.0 mmol) | s-BPDA 2.4 g (8.0 mmol) | | X-1 3.0 g (4.2 mmol) | 32,000 |
| Synthesis Example 20 | A-7 | DA-6 5.2 g (16.0 mmol) | 6FAP 23.4 g (64.0 mmol) | PAP 0.9 g (8.4 mmol) | s-ODPA 22.3 g (72.0 mmol) | s-BPDA 2.4 g (8.0 mmol) | | X-1 3.0 g (4.2 mmol) | 32,000 |
| Synthesis Example 21 | A-8 | DA-7 6.3 g (16.0 mmol) | 6FAP 23.4 g (64.0 mmol) | PAP 0.9 g (8.4 mmol) | s-ODPA 22.3 g (72.0 mmol) | s-BPDA 2.4 g (8.0 mmol) | | X-1 3.0 g (4.2 mmol) | 33,000 |
| Synthesis Example 22 | A-9 | DA-8 6.3 g (16.0 mmol) | 6FAP 23.4 g (64.0 mmol) | PAP 0.9 g (8.4 mmol) | s-ODPA 22.3 g (72.0 mmol) | s-BPDA 2.4 g (8.0 mmol) | | X-1 3.0 g (4.2 mmol) | 31,000 |
| Synthesis Example 23 | A-10 | DA-1 6.3 g (16.0 mmol) | 6FAP 23.4 g (64.0 mmol) | PAP 0.9 g (8.4 mmol) | s-ODPA 24.8 g (80.0 mmol) | | | X-2 3.2 g (4.2 mmol) | 32,000 |
| Synthesis Example 24 | A-11 | DA-1 6.3 g (16.0 mmol) | 6FAP 23.4 g (64.0 mmol) | PAP 0.9 g (8.4 mmol) | s-ODPA 24.8 g (80.0 mmol) | | | X-3 3.1 g (4.2 mmol) | 33,000 |
| Synthesis Example 25 | A-12 | DA-1 6.3 g (16.0 mmol) | 6FAP 23.4 g (64.0 mmol) | PAP 0.9 g (8.4 mmol) | s-ODPA 24.8 g (80.0 mmol) | | | X-4 3.9 g (4.2 mmol) | 32,000 |
| Synthesis Example 26 | A-13 | DA-1 6.3 g (16.0 mmol) | 6FAP 23.4 g (64.0 mmol) | PAP 0.9 g (8.4 mmol) | s-ODPA 19.9 g (64.0 mmol) | | DC-1 6.2 g (16.0 mmol) | X-1 3.0 g (4.2 mmol) | 33,000 |
| Synthesis Example 27 | A-14 | DA-1 4.7 g (16.0 mmol) | BPS 17.9 g (64.0 mmol) | PAP 0.9 g (8.4 mmol) | s-ODPA 22.3 g (72.0 mmol) | s-BPDA 2.4 g (8.0 mmol) | | X-1 3.0 g (4.2 mmol) | 30,000 |
| Synthesis Example 28 | A-15 | DA-1 6.3 g (16.0 mmol) | 6FAP 23.4 g (64.0 mmol) | PEA 1.0 g (8.4 mmol) | s-ODPA 21.2 g (68.2 mmol) | | DC-2 3.8 g (16.0 mmol) | | 35,000 |

TABLE 1-continued

| | | Diamine compound | | Monoamine compound | Tetracarboxylic dianhydride | Dicarboxylic acid dichloride | Tetracarboxylic acid diester dichloride | Molecular weight |
|---|---|---|---|---|---|---|---|---|
| Synthesis Example 29 | A-16 | DA-1 6.3 g (16.0 mmol) | 6FAP 20.5 g (56.0 mmol) | D-400 3.2 g (8.0 mmol) | PEA 1.0 g (8.4 mmol) | s-ODPA 26.1 g (84.2 mmol) | | | 33,000 |
| Synthesis Example 30 | A-17 | DA-1 6.3 g (16.0 mmol) | 6FAP 20.5 g (56.0 mmol) | RT-1000 8.0 g (8.0 mmol) | PEA 1.0 g (8.4 mmol) | s-ODPA 26.1 g (84.2 mmol) | | | 34,000 |
| Synthesis Example 31 | A-18 | DA-1 4.7 g (16.0 mmol) | 6FAP 20.5 g (56.0 mmol) | ODA 1.6 g (8.0 mmol) | PEA 1.0 g (8.4 mmol) | s-ODPA 19.9 g (64.0 mmol) | DC-2 3.8 g (16.0 mmol) | X-1 3.0 g (4.2 mmol) | 34,000 |
| Synthesis Example 32 | A-19 | DA-1 4.7 g (16.0 mmol) | 6FAP 20.5 g (56.0 mmol) | APB 2.3 g (8.0 mmol) | PAP 0.9 g (8.4 mmol) | s-ODPA 19.9 g (64.0 mmol) | DC-2 3.8 g (16.0 mmol) | X-1 3.0 g (4.2 mmol) | 35,000 |
| Comparative Synthesis Example 1 | B-1 | APB 4.7 g (16.0 mmol) | 6FAP 23.4 g (64.0 mmol) | | PAP 0.9 g (8.4 mmol) | s-ODPA 23.6 g (76.2 mmol) | s-BPDA 2.4 g (8.0 mmol) | | 34,000 |
| Comparative Synthesis Example 2 | B-2 | APB 4.7 g (16.0 mmol) | 6FAP 23.4 g (64.0 mmol) | | PAP 0.9 g (8.4 mmol) | s-ODPA 22.3 g (72.0 mmol) | s-BPDA 2.4 g (8.0 mmol) | | X-1 3.0 g (4.2 mmol) | 33,000 |

II. Preparation of Photosensitive Resin Composition

By using the polymers synthesized in the above-described Synthesis Example 14 to Synthesis Example 32 and Comparative Synthesis Examples 1 and 2 as a base resin, resin compositions with 30% by mass of resin were prepared according to the compositions and containing amounts described in Table 2 and Table 3. Thereafter, the respective resin compositions were stirred, mixed and dissolved, and then, subjected to microfiltration using a 0.5 μm filter made of Teflon (Registered Trademark) to obtain the respective photosensitive resin compositions. For the solvents in the Tables, PGMEA represents propylene glycol monomethyl ether acetate, and GBL represents γ-butyrolactone.

TABLE 2

| | Resin Component (A) | Photosensitizer Component (B) | Crosslinking agent Component (C) | | Thermal acid generator Component (E) | Solvent Component (D) | |
|---|---|---|---|---|---|---|---|
| Photosensitive resin composition 1 | A-1 100 parts by weight | Photosensitizer 1 15 parts by weight | | | | PGMEA 207 parts by weight | GBL 23 parts by weight |
| Photosensitive resin composition 2 | A-2 100 parts by weight | Photosensitizer 1 15 parts by weight | | | | PGMEA 207 parts by weight | GBL 23 parts by weight |
| Photosensitive resin composition 3 | A-1 100 parts by weight | Photosensitizer 1 15 parts by weight | CL-1 10 parts by weight | CL-2 15 parts by weight | | PGMEA 207 parts by weight | GBL 23 parts by weight |
| Photosensitive resin composition 4 | A-2 100 parts by weight | Photosensitizer 1 15 parts by weight | CL-1 10 parts by weight | CL-2 15 parts by weight | | PGMEA 207 parts by weight | GBL 23 parts by weight |
| Photosensitive resin composition 5 | A-3 100 parts by weight | Photosensitizer 1 15 parts by weight | CL-1 10 parts by weight | CL-2 15 parts by weight | | PGMEA 207 parts by weight | GBL 23 parts by weight |
| Photosensitive resin composition 6 | A-4 100 parts by weight | Photosensitizer 1 15 parts by weight | CL-1 10 parts by weight | CL-2 15 parts by weight | | PGMEA 207 parts by weight | GBL 23 parts by weight |
| Photosensitive resin composition 7 | A-5 100 parts by weight | Photosensitizer 1 15 parts by weight | CL-1 10 parts by weight | CL-2 15 parts by weight | | PGMEA 207 parts by weight | GBL 23 parts by weight |
| Photosensitive resin composition 8 | A-6 100 parts by weight | Photosensitizer 1 15 parts by weight | CL-1 10 parts by weight | CL-2 15 parts by weight | | PGMEA 207 parts by weight | GBL 23 parts by weight |
| Photosensitive resin composition 9 | A-7 100 parts by weight | Photosensitizer 1 15 parts by weight | CL-1 10 parts by weight | CL-2 15 parts by weight | | PGMEA 207 parts by weight | GBL 23 parts by weight |
| Photosensitive resin composition 10 | A-8 100 parts by weight | Photosensitizer 1 15 parts by weight | CL-1 10 parts by weight | CL-2 15 parts by weight | | PGMEA 207 parts by weight | GBL 23 parts by weight |
| Photosensitive resin composition 11 | A-9 100 parts by weight | Photosensitizer 1 15 parts by weight | CL-1 10 parts by weight | CL-2 15 parts by weight | | PGMEA 207 parts by weight | GBL 23 parts by weight |

TABLE 2-continued

| | Resin Component (A) | Photosensitizer Component (B) | Crosslinking agent Component (C) | | Thermal acid generator Component (E) | Solvent Component (D) | |
|---|---|---|---|---|---|---|---|
| Photosensitive resin composition 12 | A-10 100 parts by weight | Photosensitizer 1 15 parts by weight | CL-1 10 parts by weight | CL-2 15 parts by weight | | PGMEA 207 parts by weight | GBL 23 parts by weight |
| Photosensitive resin composition 13 | A-11 100 parts by weight | Photosensitizer 1 15 parts by weight | CL-1 10 parts by weight | CL-2 15 parts by weight | | PGMEA 207 parts by weight | GBL 23 parts by weight |
| Photosensitive resin composition 14 | A-12 100 parts by weight | Photosensitizer 1 15 parts by weight | CL-1 10 parts by weight | CL-2 15 parts by weight | | PGMEA 207 parts by weight | GBL 23 parts by weight |
| Photosensitive resin composition 15 | A-13 100 parts by weight | Photosensitizer 1 15 parts by weight | CL-1 10 parts by weight | CL-2 15 parts by weight | | PGMEA 207 parts by weight | GBL 23 parts by weight |
| Photosensitive resin composition 16 | A-14 100 parts by weight | Photosensitizer 1 15 parts by weight | CL-1 10 parts by weight | CL-2 15 parts by weight | | PGMEA 207 parts by weight | GBL 23 parts by weight |
| Photosensitive resin composition 17 | A-15 100 parts by weight | Photosensitizer 1 15 parts by weight | CL-1 10 parts by weight | CL-2 15 parts by weight | | PGMEA 207 parts by weight | GBL 23 parts by weight |
| Photosensitive resin composition 18 | A-16 100 parts by weight | Photosensitizer 1 15 parts by weight | CL-1 10 parts by weight | CL-2 15 parts by weight | | PGMEA 207 parts by weight | GBL 23 parts by weight |
| Photosensitive resin composition 19 | A-17 100 parts by weight | Photosensitizer 1 15 parts by weight | CL-1 10 parts by weight | CL-2 15 parts by weight | | PGMEA 207 parts by weight | GBL 23 parts by weight |
| Photosensitive resin composition 20 | A-18 100 parts by weight | Photosensitizer 1 15 parts by weight | CL-1 10 parts by weight | CL-2 15 parts by weight | | PGMEA 207 parts by weight | GBL 23 parts by weight |
| Photosensitive resin composition 21 | A-19 100 parts by weight | Photosensitizer 1 15 parts by weight | CL-1 10 parts by weight | CL-2 15 parts by weight | | PGMEA 207 parts by weight | GBL 23 parts by weight |
| Photosensitive resin composition 22 | A-2 100 parts by weight | Photosensitizer 1 15 parts by weight | CL-1 10 parts by weight | CL-2 15 parts by weight | E-1 2 parts by weight | PGMEA 207 parts by weight | GBL 23 parts by weight |
| Photosensitive resin composition 23 | A-19 100 parts by weight | Photosensitizer 1 15 parts by weight | CL-1 10 parts by weight | CL-2 15 parts by weight | E-1 2 parts by weight | PGMEA 207 parts by weight | GBL 23 parts by weight |
| Comparative photosensitive resin composition 1 | B-1 100 parts by weight | Photosensitizer 1 15 parts by weight | CL-1 10 parts by weight | CL-2 15 parts by weight | | PGMEA 207 parts by weight | GBL 23 parts by weight |
| Comparative photosensitive resin composition 2 | B-2 100 parts by weight | Photosensitizer 1 15 parts by weight | CL-1 10 parts by weight | CL-2 15 parts by weight | | PGMEA 207 parts by weight | GBL 23 parts by weight |

Photosensitive resin compositions 1 to 23 shown in Table 2 relate to the above-mentioned positive photosensitive resin composition according to the present invention. Comparative photosensitive resin compositions 1 and 2 are formed by using the polymers synthesized in Comparative Synthesis Examples 1 and 2 as a base resin instead of the polymer according to the present invention in the above-mentioned positive photosensitive resin composition according to the present invention.

TABLE 3

| | Resin Component (A') | Photoacid generator Component (B') | Crosslinking agent Component (C) | | Solvent Component (D) | |
|---|---|---|---|---|---|---|
| Photosensitive resin composition 24 | A-1 100 parts by weight | Photoacid generator 1 2 parts by weight | CL-3 15 parts by weight | CL-2 15 parts by weight | PGMEA 207 parts by weight | GBL 23 parts by weight |
| Photosensitive resin composition 25 | A-2 100 parts by weight | Photoacid generator 1 2 parts by weight | CL-3 15 parts by weight | CL-2 15 parts by weight | PGMEA 207 parts by weight | GBL 23 parts by weight |
| Photosensitive resin composition 26 | A-3 100 parts by weight | Photoacid generator 1 2 parts by weight | CL-3 15 parts by weight | CL-2 15 parts by weight | PGMEA 207 parts by weight | GBL 23 parts by weight |
| Photosensitive resin composition 27 | A-4 100 parts by weight | Photoacid generator 1 2 parts by weight | CL-3 15 parts by weight | CL-2 15 parts by weight | PGMEA 207 parts by weight | GBL 23 parts by weight |

TABLE 3-continued

| | Resin Component (A') | Photoacid generator Component (B') | Crosslinking agent Component (C) | | Solvent Component (D) | |
|---|---|---|---|---|---|---|
| Photosensitive resin composition 28 | A-5 100 parts by weight | Photoacid generator 1 2 parts by weight | CL-3 15 parts by weight | CL-2 15 parts by weight | PGMEA 207 parts by weight | GBL 23 parts by weight |
| Photosensitive resin composition 29 | A-6 100 parts by weight | Photoacid generator 1 2 parts by weight | CL-3 15 parts by weight | CL-2 15 parts by weight | PGMEA 207 parts by weight | GBL 23 parts by weight |
| Photosensitive resin composition 30 | A-7 100 parts by weight | Photoacid generator 1 2 parts by weight | CL-3 15 parts by weight | CL-2 15 parts by weight | PGMEA 207 parts by weight | GBL 23 parts by weight |
| Photosensitive resin composition 31 | A-8 100 parts by weight | Photoacid generator 1 2 parts by weight | CL-3 15 parts by weight | CL-2 15 parts by weight | PGMEA 207 parts by weight | GBL 23 parts by weight |
| Photosensitive resin composition 32 | A-9 100 parts by weight | Photoacid generator 1 2 parts by weight | CL-3 15 parts by weight | CL-2 15 parts by weight | PGMEA 207 parts by weight | GBL 23 parts by weight |
| Photosensitive resin composition 33 | A-10 100 parts by weight | Photoacid generator 1 2 parts by weight | CL-3 15 parts by weight | CL-2 15 parts by weight | PGMEA 207 parts by weight | GBL 23 parts by weight |
| Photosensitive resin composition 34 | A-11 100 parts by weight | Photoacid generator 1 2 parts by weight | CL-3 15 parts by weight | CL-2 15 parts by weight | PGMEA 207 parts by weight | GBL 23 parts by weight |
| Photosensitive resin composition 35 | A-12 100 parts by weight | Photoacid generator 1 2 parts by weight | CL-3 15 parts by weight | CL-2 15 parts by weight | PGMEA 207 parts by weight | GBL 23 parts by weight |
| Photosensitive resin composition 36 | A-13 100 parts by weight | Photoacid generator 1 2 parts by weight | CL-3 15 parts by weight | CL-2 15 parts by weight | PGMEA 207 parts by weight | GBL 23 parts by weight |
| Photosensitive resin composition 37 | A-14 100 parts by weight | Photoacid generator 1 2 parts by weight | CL-3 15 parts by weight | CL-2 15 parts by weight | PGMEA 207 parts by weight | GBL 23 parts by weight |
| Photosensitive resin composition 38 | A-15 100 parts by weight | Photoacid generator 1 2 parts by weight | CL-3 15 parts by weight | CL-2 15 parts by weight | PGMEA 207 parts by weight | GBL 23 parts by weight |
| Photosensitive resin composition 39 | A-16 100 parts by weight | Photoacid generator 1 2 parts by weight | CL-3 15 parts by weight | CL-2 15 parts by weight | PGMEA 207 parts by weight | GBL 23 parts by weight |
| Photosensitive resin composition 40 | A-17 100 parts by weight | Photoacid generator 1 2 parts by weight | CL-3 15 parts by weight | CL-2 15 parts by weight | PGMEA 207 parts by weight | GBL 23 parts by weight |
| Photosensitive resin composition 41 | A-18 100 parts by weight | Photoacid generator 1 2 parts by weight | CL-3 15 parts by weight | CL-2 15 parts by weight | PGMEA 207 parts by weight | GBL 23 parts by weight |
| Photosensitive resin composition 42 | A-19 100 parts by weight | Photoacid generator 1 2 parts by weight | CL-3 15 parts by weight | CL-2 15 parts by weight | PGMEA 207 parts by weight | GBL 23 parts by weight |
| Comparative photosensitive resin composition 3 | B-1 100 parts by weight | Photosensitizer 1 15 parts by weight | CL-3 15 parts by weight | CL-2 15 parts by weight | PGMEA 207 parts by weight | GBL 23 parts by weight |
| Comparative photosensitive resin composition 4 | B-2 100 parts by weight | Photosensitizer 1 15 parts by weight | CL-3 15 parts by weight | CL-2 15 parts by weight | PGMEA 207 parts by weight | GBL 23 parts by weight |

Photosensitive resin compositions 24 to 42 shown in Table 3 relate to the above-mentioned negative photosensitive resin composition according to the present invention. Comparative photosensitive resin compositions 3 and 4 are formed by using the polymers synthesized in Comparative Synthesis Examples 1 and 2 as a base resin instead of the polymer according to the present invention in the above-mentioned negative photosensitive resin composition according to the present invention.

Note that, in Table 2 and Table 3, details of the photosensitizer (photosensitizer 1), which is a quinonediazide compound, the photoacid generator (photoacid generator 1), the crosslinking agents (CL-1) to (CL-3), and the thermal acid generator (E-1) are as follows.

Photosensitizer (Photosensitizer 1)

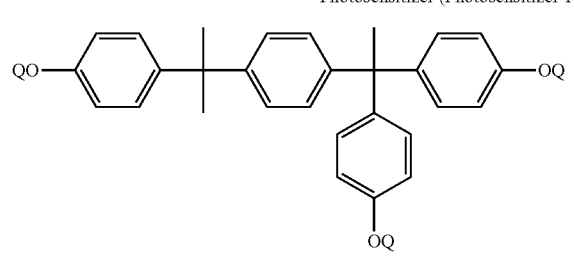

wherein Q represents a 1,2-naphthoquinonediazidosulfonyl group represented by the following formula (61) or a hydrogen atom, and 90% of Q is replaced with the 1,2-naphthoquinonediazidosulfonyl group represented by the following formula (61).

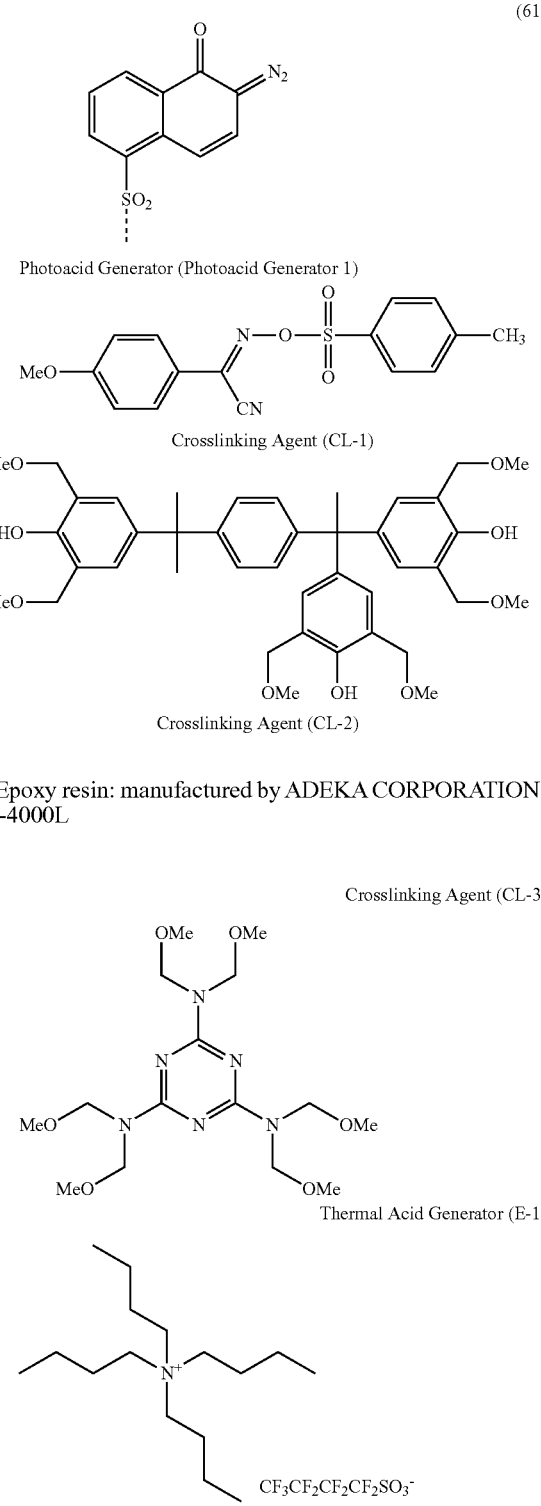

Photoacid Generator (Photoacid Generator 1)

Crosslinking Agent (CL-1)

Crosslinking Agent (CL-2)

Epoxy resin: manufactured by ADEKA CORPORATION, EP-4000L

Crosslinking Agent (CL-3)

Thermal Acid Generator (E-1)

III. Patterning

By dispensing 5 mL of the above-described photosensitive resin compositions 1 to 42 and comparative photosensitive resin compositions 1 to 4 onto a silicon substrate and then rotating the substrate, that is, by the spin coating method, each of these compositions was coated so as to have a film thickness of 10 μm after the heating for post-curing performed after the patterning. That is, it was examined in advance that the film thickness would be reduced after the post-curing step, and the rotation number upon coating was adjusted so that the finished film thickness after the post-curing becomes 10 μm.

Next, the compositions coated on the substrates were pre-baked on a hot plate at 100° C. for 2 minutes. Then, by using an i-line stepper NSR-2205i11 manufactured by Nikon Corporation, it was exposed with i-line for patterning. In the patterning, a mask for positive pattern or negative pattern was used appropriately in accordance with the photosensitive resin composition used. That mask has a pattern capable of forming 20 μm holes arranged by a fineness ratio of 1:1, and can form a hole pattern of 50 μm to 20 μm holes with 10 μm pitch, 20 μm to 10 μm holes with 5 μm pitch, or 10 μm to 1 μm holes with 1 μm pitch.

Next, for those to which the heating step (post-exposure heating step) was performed, it was performed under conditions as shown in the following Table 5.

In the development step, an aqueous alkaline solution was used as the developing solution, and a 2.38% aqueous solution of tetramethylammonium hydroxide was used as the developing solution. After performing paddle development for 1 minute with the 2.38% aqueous solution of tetramethylammonium hydroxide (TMAH) three times, rinsing with ultrapure water was carried out.

Then, the obtained pattern on the substrate was post-cured using an oven at 200° C. for 2 hours while purging the oven with nitrogen.

Next, each substrate was cut out so that the shape of the obtained hole pattern can be observed, and the shape of the hole pattern was observed by using a scanning electron microscope (SEM). The aperture of the smallest opening hole at a film thickness of 10 μm after the post-curing was determined, and the shape of the pattern was evaluated. Together with these results, the sensitivities at which the minimum pattern could be formed are shown in Table 4 and Table 5.

The shape of the hole pattern was evaluated by the criteria as described below, and the evaluation results were shown in Table 4 and Table 5.

Good: holes were observed in a rectangular shape or forward taper shape (the shape in which the dimension of the upper part of the hole is larger than the dimension of the bottom part)

Poor: holes were observed in a reverse taper shape (the shape in which the dimension of the upper part of the hole is smaller than the dimension of the bottom part) or overhang shape (the shape in which the upper part of the hole protrudes), remarkable film thinning was observed, or residue at the bottom part of the hole IV. Elongation at Break and Breaking Strength The above-described photosensitive resin compositions 1 to 42 and comparative photosensitive resin compositions 1 to 4 were spin coated onto aluminum substrates so that the finished film thickness after the curing becomes 10 μm. Next, the compositions coated on the substrates were pre-baked on a hot plate at 100° C. for 3 minutes to obtain photosensitive resin films.

Then, the obtained films were cured using an oven at 200° C. for 2 hours while purging the oven with nitrogen to obtain photosensitive resin cured films. Next, the wafers with the cured films were cut into a strip form with a width of 10 mm and a length of 60 mm, and by immersing them in hydrochloric acid with a concentration of 20% by mass, the cured films were peeled off the substrate. For the obtained cured films, the elongation at break and the breaking strength were measured by using an autograph AGX-1KN manufactured by Shimadzu Corporation. The measurement was carried out 10 times for one sample, and the average value thereof is shown in Table 4 and Table 5. The elongation at break is preferably large, and it is more preferably 20% or more. The breaking strength is preferably large, and it is more preferably 90 MPa or more.

Firstly, by using positive photosensitive resin compositions (photosensitive resin compositions 1 to 23 and comparative photosensitive resin compositions 1 and 2), results obtained by carrying out the patterning, and the elongation at break and breaking strength of the cured films are shown in Table 4.

TABLE 4

|  | Composition | Pattern | Hole shape | Minimum hole diameter (μm) | Sensitivity (mJ/cm$^2$) | Elongation at break (%) | Breaking strength (MPa) |
| --- | --- | --- | --- | --- | --- | --- | --- |
| Example 1 | Photosensitive resin composition 1 | Positive type | Good | 6 | 460 | 15 | 80 |
| Example 2 | Photosensitive resin composition 2 | Positive type | Good | 6 | 440 | 18 | 85 |
| Example 3 | Photosensitive resin composition 3 | Positive type | Good | 5 | 340 | 30 | 102 |
| Example 4 | Photosensitive resin composition 4 | Positive type | Good | 5 | 340 | 32 | 115 |
| Example 5 | Photosensitive resin composition 5 | Positive type | Good | 5 | 360 | 30 | 105 |
| Example 6 | Photosensitive resin composition 6 | Positive type | Good | 5 | 360 | 31 | 103 |
| Example 1 | Photosensitive resin composition 1 | Positive type | Good | 5 | 380 | 25 | 101 |
| Example 8 | Photosensitive resin composition 8 | Positive type | Good | 5 | 320 | 35 | 110 |
| Example 9 | Photosensitive resin composition 9 | Positive type | Good | 5 | 300 | 38 | 112 |
| Example 10 | Photosensitive resin composition 10 | Positive type | Good | 5 | 440 | 28 | 108 |
| Example 11 | Photosensitive resin composition 11 | Positive type | Good | 5 | 460 | 26 | 106 |
| Example 12 | Photosensitive resin composition 12 | Positive type | Good | 5 | 340 | 34 | 116 |
| Example 13 | Photosensitive resin composition 13 | Positive type | Good | 5 | 360 | 32 | 110 |
| Example 14 | Photosensitive resin composition 14 | Positive type | Good | 5 | 360 | 30 | 107 |
| Example 15 | Photosensitive resin composition 15 | Positive type | Good | 5 | 300 | 42 | 118 |
| Example 16 | Photosensitive resin composition 16 | Positive type | Good | 6 | 380 | 30 | 106 |
| Example 11 | Photosensitive resin composition 17 | Positive type | Good | 6 | 380 | 54 | 112 |
| Example 18 | Photosensitive resin composition 18 | Positive type | Good | 6 | 440 | 48 | 95 |
| Example 19 | Photosensitive resin composition 19 | Positive type | Good | 6 | 420 | 52 | 94 |
| Example 20 | Photosensitive resin composition 20 | Positive type | Good | 6 | 420 | 56 | 122 |
| Example 21 | Photosensitive resin composition 21 | Positive type | Good | 6 | 440 | 60 | 125 |
| Example 22 | Photosensitive resin composition 22 | Positive type | Good | 5 | 340 | 30 | 118 |
| Example 23 | Photosensitive resin composition 23 | Positive type | Good | 6 | 440 | 58 | 123 |
| Comparative Example 1 | Comparative photosensitive resin composition 1 | Positive type | Good | 10 | 480 | 32 | 106 |
| Comparative Example 2 | Comparative photosensitive resin composition 2 | Positive type | Good | 10 | 380 | 34 | 112 |

As shown in Table 4, the positive photosensitive resin compositions according to the present invention exhibit a good pattern shape in the development with the aqueous alkaline solution, and the minimum hole dimensions thereof exhibit smaller values than a finished film thickness of 10 μm, and therefore, it can be understood that the aspect ratio of 1 or more can be accomplished.

In addition, even when the positive photosensitive compositions according to the present invention were cured at low temperature, cured films having good mechanical properties were obtained.

On the other hand, although cured films using comparative photosensitive resin composition 1 and comparative photosensitive resin composition 2 have mechanical properties equivalent to those of the cured films obtained from compositions according to the present invention, the solubility of the resins thereof in an alkaline developing solution is low, and thus, the obtained minimum hole dimensions were as large as 10 μm or more, and their resolutions deteriorated as compared to the positive photosensitive compositions according to the present invention.

Next, by using negative photosensitive resin compositions (photosensitive resin compositions 24 to 42 and comparative photosensitive resin compositions 3 and 4), results obtained by carrying out the patterning, and the elongation at break and breaking strength of the cured films are shown in Table 5.

compositions according to the present invention, the solubility of the resins thereof in an alkaline developing solution is low, and thus, residue was observed at the bottom part of holes and the hole shape was rated as poor. In addition, the

TABLE 5

| | Composition | Pattern | Post-exposure bake | Hole shape | Minimum hole diameter (μm) | Sensitivity (mJ/cm$^2$) | Elongation at break (%) | Breaking strength (MPa) |
|---|---|---|---|---|---|---|---|---|
| Example 24 | Photosensitive resin composition 24 | Negative type | 100° C. × 120 sec | Good | 7 | 660 | 25 | 107 |
| Example 25 | Photosensitive resin composition 25 | Negative type | 100° C. × 120 sec | Good | 7 | 660 | 28 | 118 |
| Example 26 | Photosensitive resin composition 26 | Negative type | 100° C. × 120 sec | Good | 7 | 680 | 25 | 110 |
| Example 27 | Photosensitive resin composition 27 | Negative type | 100° C. × 120 sec | Good | 7 | 680 | 26 | 108 |
| Example 28 | Photosensitive resin composition 28 | Negative type | 100° C. × 120 sec | Good | 7 | 680 | 20 | 106 |
| Example 29 | Photosensitive resin composition 29 | Negative type | 100° C. × 120 sec | Good | 7 | 640 | 30 | 114 |
| Example 30 | Photosensitive resin composition 30 | Negative type | 100° C. × 120 sec | Good | 7 | 620 | 32 | 115 |
| Example 31 | Photosensitive resin composition 31 | Negative type | 100° C. × 120 sec | Good | 7 | 680 | 23 | 112 |
| Example 32 | Photosensitive resin composition 32 | Negative type | 100° C. × 120 sec | Good | 7 | 680 | 20 | 117 |
| Example 33 | Photosensitive resin composition 33 | Negative type | 100° C. × 120 sec | Good | 7 | 660 | 30 | 120 |
| Example 34 | Photosensitive resin composition 34 | Negative type | 100° C. × 120 sec | Good | 7 | 660 | 32 | 114 |
| Example 35 | Photosensitive resin composition 35 | Negative type | 100° C. × 120 sec | Good | 7 | 660 | 28 | 113 |
| Example 36 | Photosensitive resin composition 36 | Negative type | 100° C. × 120 sec | Good | 7 | 620 | 35 | 123 |
| Example 37 | Photosensitive resin composition 37 | Negative type | 100° C. × 120 sec | Good | 8 | 640 | 25 | 113 |
| Example 38 | Photosensitive resin composition 38 | Negative type | 100° C. × 120 sec | Good | 8 | 660 | 50 | 115 |
| Example 39 | Photosensitive resin composition 39 | Negative type | 100° C. × 120 sec | Good | 8 | 700 | 45 | 102 |
| Example 40 | Photosensitive resin composition 40 | Negative type | 100° C. × 120 sec | Good | 8 | 680 | 45 | 100 |
| Example 41 | Photosensitive resin composition 41 | Negative type | 100° C. × 120 sec | Good | 8 | 680 | 50 | 120 |
| Example 42 | Photosensitive resin composition 42 | Negative type | 100° C. × 120 sec | Good | 8 | 700 | 55 | 123 |
| Comparative Example 3 | Comparative photosensitive resin composition 3 | Negative type | 100° C. × 120 sec | Poor | 12 | 700 | 25 | 111 |
| Comparative Example 4 | Comparative photosensitive resin composition 4 | Negative type | 100° C. × 120 sec | Poor | 12 | 660 | 28 | 115 |

As shown in Table 5, the negative photosensitive resin compositions according to the present invention exhibit a good pattern shape in the development with the aqueous alkaline solution, and the minimum hole dimensions thereof exhibit smaller values than a finished film thickness of 10 μm, and therefore, it can be understood that the aspect ratio of 1 or more can be accomplished.

In addition, even when the negative photosensitive compositions according to the present invention were cured at low temperature, cured films having good mechanical properties were obtained.

On the other hand, although cured films using comparative photosensitive resin composition 3 and comparative photosensitive resin composition 4 have mechanical properties equivalent to those of the cured films obtained from obtained minimum hole dimensions were as large as 10 μm or more, and their resolutions deteriorated as compared to the negative photosensitive compositions according to the present invention.

Note that the present invention is not limited to the embodiments described above. The embodiments described above are merely illustrations, and any embodiments having substantially the same configuration as and providing similar effects to the technical concept described in the claims of the present invention are encompassed in the technical scope of the present invention.

What is claimed is:

1. A polymer comprising a structural unit(s) represented by the following general formulas (1) and/or (2):

(1)

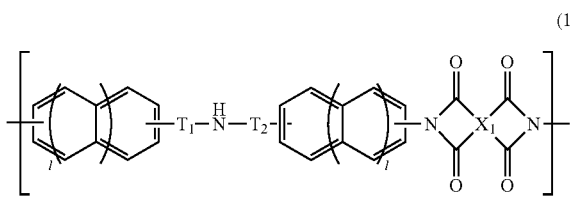

wherein $T_1$ and $T_2$ may be the same as, or different from, each other and represent any of —CO— and —SO$_2$—; $X_1$ is a tetravalent organic group; and 1 is 0 or 1; and (2)

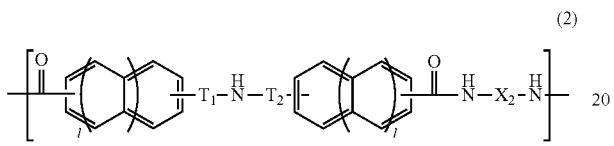

wherein $T_1$, $T_2$ and 1 are defined as above; and $X_2$ is a divalent organic group.

2. The polymer according to claim 1, further comprising, in addition to the structural unit(s) represented by the general formulas (1) and/or (2), any one or more structural units represented by the following general formulas (3) to (5) and (7):

(3)

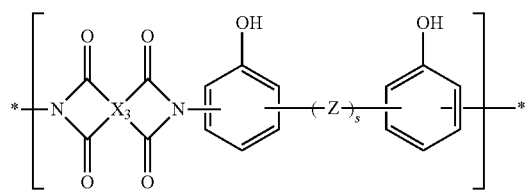

wherein $X_3$ is a tetravalent organic group that is the same as or different from $X_1$; s is 0 or 1; Z is a divalent linking group; and when s=0, two aromatic rings in the formula are directly bonded without interposition of a linking group;

(4)

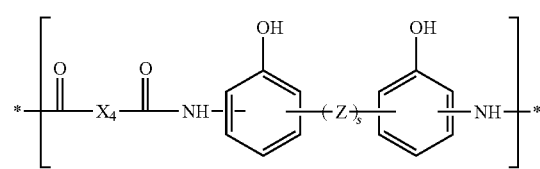

wherein $X_4$ is a divalent organic group; and s and Z are defined as above;

(5)

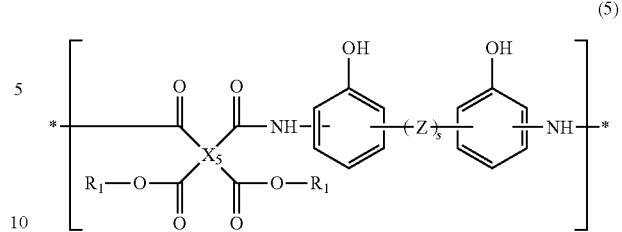

wherein $X_5$ is a tetravalent organic group that is the same as or different from $X_1$; $R_1$ is a group represented by the following general formula (6); and s and Z are defined as above, (6)

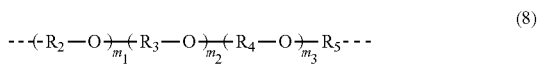

wherein a dotted line represents a bond; $Y_1$ is an organic group with a valence of (k+1); Rf is a linear, branched or cyclic alkyl group having 1 to 20 carbon atoms or aromatic group, in which part or all of hydrogen atoms are replaced with fluorine atoms; k is 1, 2 or 3; and n is 0 or 1; and (7)

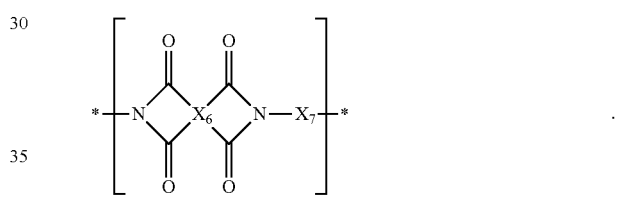

wherein $X_6$ is a tetravalent organic group that is the same as, or different from, the $X_1$; and $X_7$ is a group represented by the following general formula (8), (8)

$$---(-R_2-O)_{m_1}(-R_3-O)_{m_2}(-R_4-O)_{m_3}-R_5---$$

wherein $R_2$ to $R_5$ are each independently a linear or branched alkylene group having 2 to 10 carbon atoms; and $m_1$ is an integer of 1 to 40, and $m_2$ and $m_3$ are each independently an integer of 0 to 40.

3. The polymer according to claim 2, wherein $R_1$ in the general formula (5) is an organic group selected from any groups represented by the following general formulas (9), (10), (11) and (12):

(9)

(10)

-continued

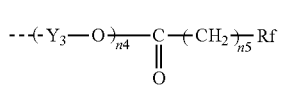
(11)

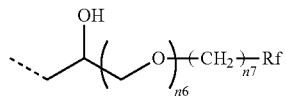
(12)

wherein a dotted line represents a bond; Rf is defined as above; Ra and Rb are a hydrogen atom or an alkyl group having 1 to 3 carbon atoms; $Y_2$ and $Y_3$ are a linear or branched alkylene group having 1 to 6 carbon atoms; and n1 is an integer of 0 to 6, n2 is an integer of 1 to 6, n3 is an integer of 0 to 6, n4 is an integer of 1 to 6, n5 is an integer of 0 to 6, n6 is and integer of 0 or 1, and n7 is an integer of 0 to 6.

4. The polymer according to claim 2, wherein Z in the general formulas (3), (4) and (5) is a divalent group represented by the following general formula (13) or (14):

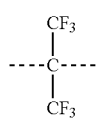
(13)

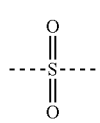
(14)

wherein a dotted line represents a bond.

5. A positive photosensitive resin composition comprising:
(A) the polymer according to claim 1;
(B) a photosensitizer that (i) generates an acid by light to increase a dissolution rate in an aqueous alkaline solution and (ii) is a compound having a quinonediazide structure; and
(D) a solvent.

6. The positive photosensitive resin composition according to claim 5, further comprising the following component (C):
(C) one or more crosslinking agents selected from the group consisting of an amino condensate modified with formaldehyde or formaldehyde-alcohol, a phenol compound having two or more methylol groups or alkoxymethylol groups on average in one molecule, a compound in which a hydrogen atom of a hydroxy group of a polyvalent phenol is replaced with a glycidyl group, a compound in which a hydrogen atom of a hydroxy group of a polyvalent phenol is replaced with a substituent represented by the following formula (C-1), and a compound containing two or more nitrogen atoms each having a glycidyl group represented by the following formula (C-2):

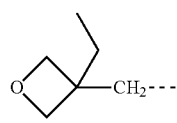
(C-1)

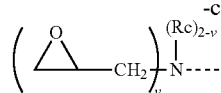

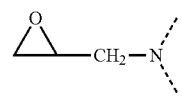
(C-2)

wherein a dotted line represents a bond; Rc represents a linear, branched or cyclic alkyl group having 1 to 6 carbon atoms; and v is 1 or 2.

7. A negative photosensitive resin composition comprising:
(A') the polymer according to claim 1;
(B') a photoacid generator;
(C) one or more crosslinking agents selected from an amino condensate modified with formaldehyde or formaldehyde-alcohol, a phenol compound having two or more methylol groups or alkoxymethylol groups on average in one molecule, a compound in which a hydrogen atom of a hydroxy group of a polyvalent phenol is replaced with a glycidyl group, a compound in which a hydrogen atom of a hydroxy group of a polyvalent phenol is replaced with a substituent represented by the following formula (C-1), and a compound containing two or more nitrogen atoms each having a glycidyl group represented by the following formula (C-2):

(C-1)

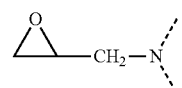
(C-2)

wherein a dotted line represents a bond; Rc represents a linear, branched or cyclic alkyl group having 1 to 6 carbon atoms; and v is 1 or 2; and
(D) a solvent.

8. A patterning method comprising:
(1) applying the positive photosensitive resin composition according to claim 5 onto a substrate to form a photosensitive material film;
(2) heating the photosensitive material film;
(3) exposing the photosensitive material film with a high energy beam having a wavelength of 190 to 500 nm or an electron beam through a photomask; and
(4) developing the film with a developing solution of an aqueous alkaline solution.

9. A patterning method comprising:
(I) applying the negative photosensitive resin composition according to claim 7 onto a substrate to form a photosensitive material film;
(II) heating the photosensitive material film;
(III) exposing the photosensitive material film with a high energy beam having a wavelength of 190 to 500 nm or an electron beam through a photomask; and (IV) developing the film with a developing solution of an aqueous alkaline solution.

10. The patterning method according to claim 9, further comprising post-exposure heating of the photosensitive material film between the exposure (III) and the development (IV).

11. A method of forming a cured film, comprising heating and post-curing a patterned film obtained by the patterning method according to claim 8 at a temperature of 100 to 300° C.

12. A method of forming a cured film, comprising heating and post-curing a patterned film obtained by the patterning method according to claim 9 at a temperature of 100 to 300° C.

13. An interlayer insulating film comprising a cured film formed by curing the positive photosensitive resin composition according to claim 5.

14. An interlayer insulating film comprising a cured film formed by curing the negative photosensitive resin composition according to claim 7.

15. A surface protective film comprising a cured film formed by curing the positive photosensitive resin composition according to claim 5.

16. A surface protective film comprising a cured film formed by curing the negative photosensitive resin composition according to claim 7.

17. An electronic component having the interlayer insulating film according to claim 13.

18. An electronic component having the interlayer insulating film according to claim 14.

19. An electronic component having the surface protective film according to claim 15.

20. An electronic component having the surface protective film according to claim 16.

* * * * *